United States Patent
Erickson et al.

(10) Patent No.: US 10,756,306 B2
(45) Date of Patent: Aug. 25, 2020

(54) NANOSTRUCTURED ARTICLE

(71) Applicant: 3M INNOVATIVE PROPERTIES COMPANY, St. Paul, MN (US)

(72) Inventors: Nicholas C. Erickson, St. Paul, MN (US); Moses M. David, Woodbury, MN (US); Xiaoguang Sun, Woodbury, MN (US); Manoj Nirmal, St. Paul, MN (US); Haeen Sykora, Hudson, WI (US); Hui Luo, Woodbury, MN (US); Samuel J. Carpenter, Shoreview, MN (US); Jilliann M. Nelson, Shoreview, MN (US); Justin P. Meyer, Oakdale, MN (US); Bert T. Chien, St. Paul, MN (US); David J. Rowe, Roseville, MN (US); Robert L. Brott, Woodbury, MN (US); David G. Freier, St. Paul, MN (US); Hyacinth L. Lechuga, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 16/340,472

(22) PCT Filed: Oct. 17, 2017

(86) PCT No.: PCT/US2017/056846
§ 371 (c)(1),
(2) Date: Apr. 9, 2019

(87) PCT Pub. No.: WO2018/080830
PCT Pub. Date: May 3, 2018

(65) Prior Publication Data
US 2019/0386251 A1 Dec. 19, 2019

Related U.S. Application Data

(60) Provisional application No. 62/414,127, filed on Oct. 28, 2016.

(51) Int. Cl.
*H01L 51/52* (2006.01)
*H01L 27/32* (2006.01)
(Continued)

(52) U.S. Cl.
CPC ...... *H01L 51/5275* (2013.01); *H01L 27/3244* (2013.01); *H01L 51/56* (2013.01); *B81C 1/00031* (2013.01); *B81C 2201/0149* (2013.01)

(58) Field of Classification Search
None
See application file for complete search history.

(56) References Cited

U.S. PATENT DOCUMENTS 4,374,077 A 2/1983 Kerfeld
4,576,850 A 3/1986 Martens
(Continued)

FOREIGN PATENT DOCUMENTS

WO WO 2000-26973 5/2000
WO WO 2001-64805 9/2001
(Continued)

OTHER PUBLICATIONS

Affinito, "Polymer-Oxide Transparent Barrier Layers", Society of Vacuum Coaters 39th Annual Technical Conference Proceedings, 1996, pp. 392-397.
(Continued)

*Primary Examiner* — Steven B Gauthier
(74) *Attorney, Agent, or Firm* — Clifton F. Richardson

(57) ABSTRACT

A nanostructured article having a first layer with a nanostructured surface is described. The nanostructured surface includes a plurality of pillars extending from a base surface of the first layer. The pillars have an average height greater than an average lateral dimension of the pillars. An average center-to-center spacing between pillars is no more than 2000 nm. The average lateral dimension is no less than 50
(Continued)

nm. Each pillar in the plurality of pillars has at least a lower portion and an upper portion where the lower portion is between the upper portion and the base surface, and the upper and lower portions have differing compositions. The nanostructured article includes a second layer disposed over the plurality of pillars and extending continuously to the base surface.

17 Claims, 18 Drawing Sheets

(51) Int. Cl.
*H01L 51/56* (2006.01)
*B81C 1/00* (2006.01)

(56) References Cited

U.S. PATENT DOCUMENTS

| | | | |
|---|---|---|---|
| 4,696,719 | A | 9/1987 | Bischoff |
| 4,722,515 | A | 2/1988 | Ham |
| 4,842,893 | A | 6/1989 | Yializis |
| 4,954,371 | A | 9/1990 | Yializis |
| 5,018,048 | A | 5/1991 | Shaw |
| 5,032,461 | A | 7/1991 | Shaw |
| 5,097,800 | A | 3/1992 | Shaw |
| 5,125,138 | A | 6/1992 | Shaw |
| 5,175,030 | A | 12/1992 | Lu |
| 5,271,968 | A | 12/1993 | Coyle |
| 5,440,446 | A | 8/1995 | Shaw |
| 5,547,908 | A | 8/1996 | Furuzawa |
| 5,558,740 | A | 9/1996 | Bernard |
| 5,888,594 | A | 3/1999 | David |
| 5,995,690 | A | 11/1999 | Kotz |
| 6,005,137 | A | 12/1999 | Moore |
| 6,045,864 | A | 4/2000 | Lyons |
| 6,214,422 | B1 | 4/2001 | Yializis |
| 6,231,939 | B1 | 5/2001 | Shaw |
| 6,329,058 | B1 | 12/2001 | Arney |
| 6,660,354 | B2 | 12/2003 | Suwa |
| 6,680,357 | B1 | 1/2004 | Hedhli |
| 7,018,713 | B2 | 3/2006 | Padiyath |
| 7,816,477 | B2 | 10/2010 | Suwa |
| 7,940,004 | B2 | 5/2011 | Padiyath |
| 7,957,621 | B2 | 6/2011 | Zhang |
| 8,249,409 | B2 | 8/2012 | Zhang |
| 8,324,000 | B2 | 12/2012 | Zhang |
| 8,460,568 | B2 | 6/2013 | David |
| 2007/0077349 | A1 | 4/2007 | Newman |
| 2009/0000727 | A1 | 1/2009 | Kumar |
| 2009/0015757 | A1 | 1/2009 | Potts |
| 2009/0030084 | A1 | 1/2009 | Kurosu |
| 2009/0087629 | A1 | 4/2009 | Everaerts |
| 2010/0028564 | A1 | 2/2010 | Cheng |
| 2010/0040842 | A1 | 2/2010 | Everaerts |
| 2010/0093878 | A1 | 4/2010 | Yang |
| 2011/0126968 | A1 | 6/2011 | Determan |
| 2011/0253301 | A1 | 10/2011 | Yamanaka |
| 2011/0266577 | A1 | 11/2011 | Kim |
| 2011/0297993 | A1 | 12/2011 | Cho |
| 2012/0038990 | A1 | 2/2012 | Hao |
| 2013/0202867 | A1 | 8/2013 | Coggio |
| 2013/0292253 | A1 | 11/2013 | Mardilovich |
| 2014/0193612 | A1 | 7/2014 | Yu |
| 2015/0010767 | A1 | 1/2015 | Sang |
| 2015/0076468 | A1* | 3/2015 | Yamaguchi ............ G02B 1/118 257/40 |
| 2015/0140316 | A1 | 5/2015 | Steiner |
| 2015/0202834 | A1 | 7/2015 | Free |

FOREIGN PATENT DOCUMENTS

| | | |
|---|---|---|
| WO | WO 2008-128073 | 10/2008 |
| WO | WO 2013-116103 | 8/2013 |
| WO | WO 2013-116302 | 8/2013 |
| WO | WO 2015-047572 | 4/2015 |
| WO | WO 2017-003870 | 1/2017 |
| WO | WO 2017-136382 | 8/2017 |
| WO | WO 2017-205174 | 11/2017 |

OTHER PUBLICATIONS

Affinito, "Vacuum Deposited Polymer/Metal Multilayer Films For Optical Application", Thin Solid Films, 1995, vol. 270, pp. 43-48.
Burzynski, Large Optical Birefringence In Poly(p-phenylene vinylene) Films Measured By Optical Waveguide Techniques, Polymer, 1990, vol. 31, pp. 627-630.
Choy, "Improving The Viewing Angle Properties Of Microcavity OLEDs By Using Dispersive Gratings", Optics Express, 2007, vol. 15, No. 20, pp. 13288-13294.
Kim, "Fabrication of Imprint Stamp By Using Nanosphere Lithography And Its Utilization To Photoluminescence Enhancement", Journal of Nanoscience And Nanotechnology, 2008, vol. 8, No. 10, pp. 5275-5278.
Park, "Enhancement of Light Extraction Efficiency of OLEDs using Si3N4-Based Optical Scattering Layer", Optics Express, 2014, vol. 22, No. 10, pp. 12392-12397.
Shaw, "A New High Speed Process for Vapor Depositing Acrylate Thin Films: An Update", The Society of Vacuum Coaters 36th Annual Technical Conference Proceedings, 1993, pp. 348-351.
Shaw, "A New Vapor Deposition Process for Coating Paper and Polymer Webs", The Sixth International Vacuum Web Coating Conference, 1992, pp. 18-24.
Shaw, "Use of Evaporated Acrylate Coatings to Smooth the Surface of Polyester and Polypropylene Film And Aluminum Foil Substrates", RadTech North America UV/EB Conference Proceedings vol. II, 1996, pp. 701-707.
Shaw, "Use of Vapor Deposited Acrylate Coatings to Improve the Barrier Properties of Metallized Film", The Society of Vacuum Coaters 37th Annual Technical Conference Proceedings, 1994, pp. 240-247.
Yang, "Group Contribution to Molar Refraction and Refractive Index of Conjugated Polymers", Chemistry of Materials, 1995, vol. 7, No. 7, pp. 1276-1285.
Yang, "Microcavity Top-Emitting Organic Light-Emitting Devices Integrated With Microlens Arrays: Simultaneous Enhancement Of Quantum Efficiency, cd/A Efficiency, Color Performances, And Image Resolution", Applied Physics Letters, 2007, vol. 91, pp. 253508-1-253508-3.
International Search Report for PCT International Application No. PCT/US2017/056846, dated Jan. 31, 2018, 4 pages.

* cited by examiner

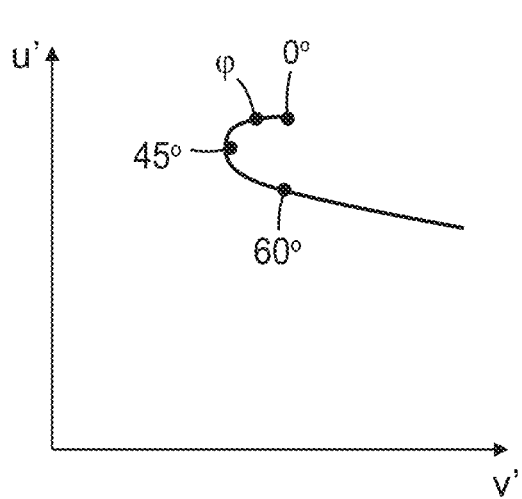 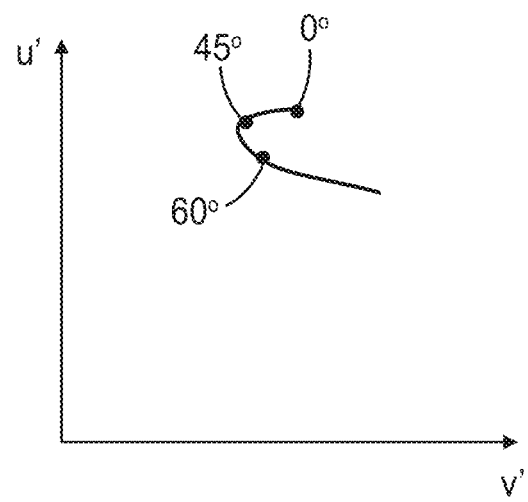
FIG. 8A  FIG. 8B
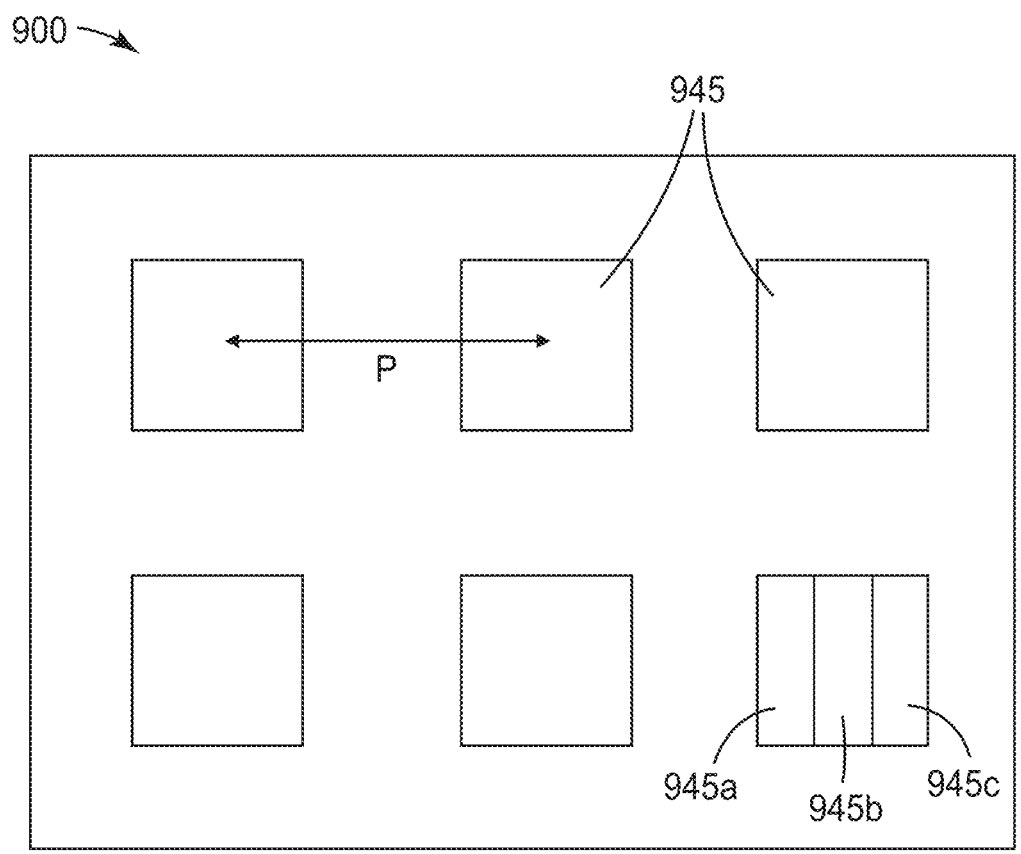
FIG. 9

NANOSTRUCTURED ARTICLE

BACKGROUND

A nanostructured surface can be formed by anisotropically etching a matrix comprising a nanoscale dispersed phase. Articles having a nanostructured surface are useful in a variety of optical applications.

SUMMARY

In some aspects of the present description, a nanostructured article including a first layer having a nanostructured surface is provided. The nanostructured surface includes a plurality of pillars extending from a base surface of the first layer, the pillars having an average height greater than an average lateral dimension of the pillars, an average center-to-center spacing between pillars being no more than 2000 nm, and the average lateral dimension being no less than 50 nm. Each pillar in the plurality of pillars has at least a lower portion and an upper portion where the lower portion is between the upper portion and the base surface. The upper and lower portions have differing compositions. The nanostructured article includes a second layer, not being a gas layer or a liquid layer, disposed over the plurality of pillars and extending continuously to the base surface. The lower portion of the pillars has a first refractive index and the second layer has a second refractive index. An absolute value of a difference between the first and second refractive indices is in a range of 0.1 to 1.5.

In some aspects of the present description, a nanostructured article including a first layer having a nanostructured surface is provided. The nanostructured surface includes a plurality of pillars extending from a base surface of the first layer, the pillars having an average height greater than an average lateral dimension of the pillars, an average center-to-center spacing between pillars being no more than 2000 nm, and the average lateral dimension being no less than 50 m. Each pillar in the plurality of pillars has at least a lower portion and an upper portion where the lower portion is between the upper portion and the base surface. The upper and lower portions have differing compositions. The nanostructured article includes a second layer disposed over the plurality of pillars and extending continuously to the base surface, and a seal layer disposed on the second layer opposite the first layer. The lower portion of the pillars has a first refractive index and the second layer has a second refractive index. An absolute value of a difference between the first and second refractive indices is in a range of 0.1 to 1.5.

In some aspects of the present description, a nanostructured article including a nanostructure layer having a nanostructured surface and not being a gas layer or a liquid layer, an etching mask disposed on the nanostructured surface, and a backfill material disposed over the etching mask is provided. The nanostructured surface includes a plurality of protrusions and a plurality of depressions and the backfill material extends through the etching mask into the plurality of depressions. The backfill material forms a backfill layer not being a gas layer or a liquid layer. In some cases, a binder is disposed between the etching mask and the protrusions and the etching mask is covalently bonded to the binder.

In some aspects of the present description, a nanostructured article including a first layer having a nanostructured surface and a second layer is provided. The nanostructured surface includes a plurality of pillars extending from a base surface of the first layer, the pillars having an average height between 280 nm and 510 nm, an average center-to-center spacing between pillars being no more than 310 nm, and an average lateral dimension of the plurality of pillars being in a range of 160 nm to 220 nm. Each pillar in the plurality of pillars has a polymeric lower portion, an inorganic particle and a binder disposed between the polymeric lower portion and the inorganic particle. The binder is covalently bonded to the inorganic particle. The polymeric lower portion is between the binder and the base surface. The second layer, which is not a gas layer or a liquid layer, is disposed over the plurality of pillars and extends continuously to the base surface. The lower portion has a first refractive index and the second layer has a second refractive index. An absolute value of a difference between the first and second refractive indices is in a range of 0.3 to 0.8.

Any of the nanostructured articles of the present description can be incorporated into an organic light emitting diode display and used as a wide view color correcting film, for example. The nanostructured article may be disposed proximate to and outside of an evanescent zone of an emissive layer of the organic light emitting diode display. In some cases, the nanostructured surface has a substantially azimuthally symmetric power spectral density (PSD) and a wavenumber-PSD product having a maximum for a wavenumber larger than 6 radians/micrometer times a larger of the first and second refractive indices where for all wavenumbers less than 6 radians/micrometer times the larger of the first and second refractive indices, the wavenumber-PSD product is no more than 0.3 times the maximum.

In some aspects of the present description, an organic light emitting diode display including an emissive layer and a nanostructured layer disposed proximate to and outside of an evanescent zone of the emissive layer is provided. The nanostructured layer has a nanostructured surface including a plurality of pillars extending from a base surface of the nanostructured layer. The pillars have an average height greater than an average lateral dimension of the pillars, the average lateral dimension being no less than 50 nm. An average center-to-center spacing between pillars is no more than 2000 nm. Each pillar in the plurality of pillars has at least a lower portion and an upper portion with the lower portion between the upper portion and the base surface and the upper and lower portions having differing compositions. In some embodiments, a backfill material is disposed over the pillars and extends to the base surface of the nanostructured layer. In some embodiments, the pillars include an intermediate portion between the upper and lower portions. In some embodiments, the upper portion is inorganic and the lower portion is polymeric. In some cases, the intermediate portion is covalently bonded to the upper portion.

Methods of making the nanostructured articles are also provided, as are methods of using the nanostructured articles as replication tools.

BRIEF DESCRIPTION OF THE DRAWINGS

FIG. 8A-8B are plots showing the variation of color output of OLED displays with view angle;

FIG. 9 is a schematic illustration of a pixelated display;

DETAILED DESCRIPTION

Figure 1:
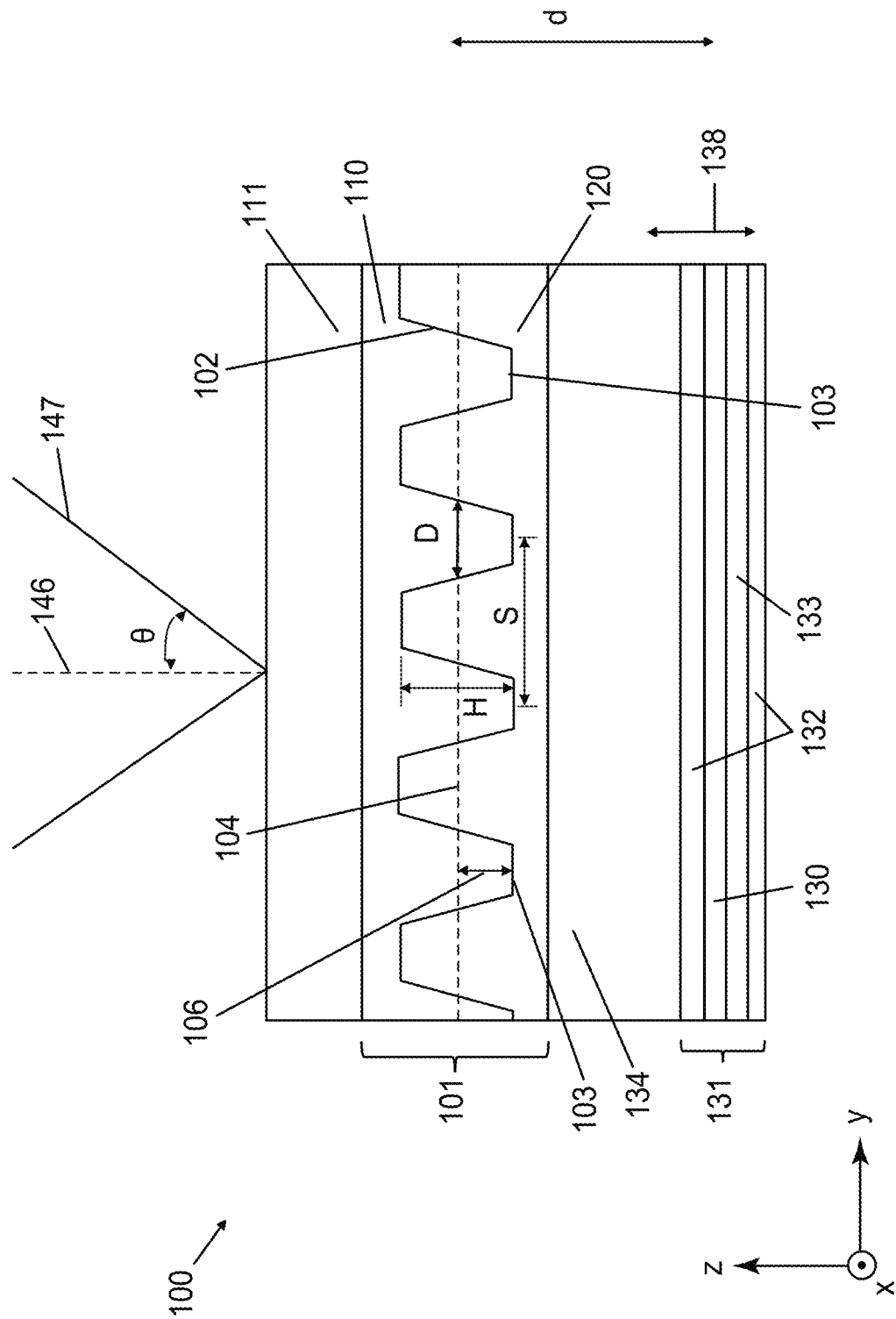
FIG. 1 is a cross-sectional view of an organic light emitting diode (OLED) display.

In the following description, reference is made to the accompanying drawings that forms a part hereof and in which various embodiments are shown by way of illustration. The drawings are not necessarily to scale. It is to be understood that other embodiments are contemplated and may be made without departing from the scope or spirit of the present disclosure. The following detailed description, therefore, is not to be taken in a limiting sense.

It has been found, according to the present description, that an etching mask used for etching nanostructures into a first layer can be retained in the article and utilized in optical applications, for example. In some embodiments, the etching mask is or includes a layer of nanoparticles. In some embodiments, etching through the mask results in pillars or post-like or column-like nanostructures. The etching step can include one or more of oxygen plasma etching, remote plasma etching, and reactive ion etching. In some embodiments, a reactive ion etching utilizing reactive ion chemistry including oxygen gas is used. In some cases, the reactive ion chemistry further includes a gas containing one or both of argon and a fluorine-containing molecule. In some embodiments, a second layer is disposed over the etching mask after the etching step and extends continuously through openings in the etching mask to the first layer. In some cases, each of the first and the second layers are solid layers (i.e., not a liquid layer and not a gas layer). In other embodiments, the second layer is a liquid or gas (e.g., air or inert gas) layer and a seal layer is disposed on the second layer to keep the liquid or gas in place. It has been found that such nanostructured articles are useful in providing a color correction to organic light emitting diode (OLED) displays such that the color output is about the same at normal (zero degree) view angle as at a wide view angle (e.g., 45 degree view angle).

In some embodiments, the etching mask is not retained in the nanostructured article, but is instead removed by another etching step. For example, the mask can be removed from the etched first layer via plasma etching with fluorine-containing gas prior to applying the second layer. In some embodiments, the plasma etching with fluorine-containing gas step includes one or more of plasma etching, remote plasma etching and reactive ion etching.

In some embodiments, the nanostructures are pillars or columns extending from a base surface or land surface of the nanostructured surface. When the first layer extends generally in the x- and y-directions, the pillars extend generally in the z-direction from the nanostructured surface. The pillars may have a cross-section which is constant or which varies in the z-direction. For example, in some embodiments, the pillars have tapered sidewalls. In other embodiments, the pillars have substantially vertical sidewalls. The cross-sectional shape of the pillars can be circular, square or rectangular, or other regular shape, or can be irregular. It is generally preferred that the pillars have an average height greater than an average lateral dimension of the pillars. The average lateral dimension can be determined at the center level (half the height) of the pillars in the case of tapered sidewalls. In some embodiments, an average center-to-center spacing between pillars is no more than 2000 nm, or no more than 1000 nm, or no more than 500 nm, or no more than 310 nm. In some embodiments, the average lateral dimension is no less than 50 nm, or no less than 100 nm. In some embodiments, the average lateral dimension is in a range of 100 nm to 1000 nm, or in a range of 100 nm to 500 nm, or in a range of 100 nm to 250 nm, or in a range of 125 nm to 250 nm, or in a range of 160 nm to 220 nm. In some embodiments, the average center-to-center spacing between pillars is in a range of 100 nm to 2000 nm, or in a range of 125 nm to 1000 nm, or in a range of 150 nm to 500 nm, or in a range of 200 to 300 nm. In some embodiments, the average height is in a range of 200 nm to 1000 nm, or in a range of 200 to 1200 nm, or in a range of 300 to 800 nm, or in a range of 280 nm to 510 nm, or in a range of 350 nm to 500 nm. In some embodiments, the average lateral dimension is in a range of 100 nm to 500 nm and the average height is in a range of 200 nm to 1000 nm. In some embodiments, the average lateral dimension is in a range of 100 nm to 250 nm and a ratio of the average height to the average lateral dimension is in a range of 1.1, or 1.5, to 5.0, or 4.0, or 3.0. In some embodiments, the average height is between 280 nm and 510 nm, the average center-to-center spacing between pillars is no more than 310 nm, and the average lateral dimension of the plurality of pillars is in a range of 160 nm to 220 nm. Such geometries have been found to be particularly useful in providing a wide view angle color correction film for organic light emitting diode displays, for example.

For display applications, it is typically desirable that the nanostructured article be visible light-transmissive. In some embodiments, the nanostructured article includes a first layer, which may be referred to as a nanostructured layer and which includes the nanostructured surface having the plurality of pillars, and further includes a second layer, which may be referred to as a backfill layer, disposed over the plurality of pillars. In some embodiments, each of the first and second layers has an average transmittance in a wavelength range from 400 nm to 700 nm at normal incidence of at least 70 percent, or at least 80 percent, or at least 85 percent. In some embodiments, the nanostructured article includes a nanostructured layer having a nanostructured surface having a plurality of protrusions and a plurality of depressions (e.g., the protrusions may be pillars and the depressions by be regions between the pillars), an etching mask (e.g., a discontinuous inorganic layer which may be a layer of nanoparticles) disposed on the nanostructured surface, and a backfill material disposed over the etching mask and extending through the etching mask into the plurality of depressions. In some embodiments, each of the nanostructured layer, the mask and the backfill material has an average transmittance in a wavelength range from 400 nm to 700 nm at normal incidence of at least 70 percent, or at least 80 percent, or at least 85 percent. In some embodiments, the nanostructured article after removing any release liners included in the nanostructured article has an average transmittance in a wavelength range from 400 nm to 700 nm at normal incidence of at least 70 percent, or at least 80 percent, or at least 85 percent.

Figure 12A:
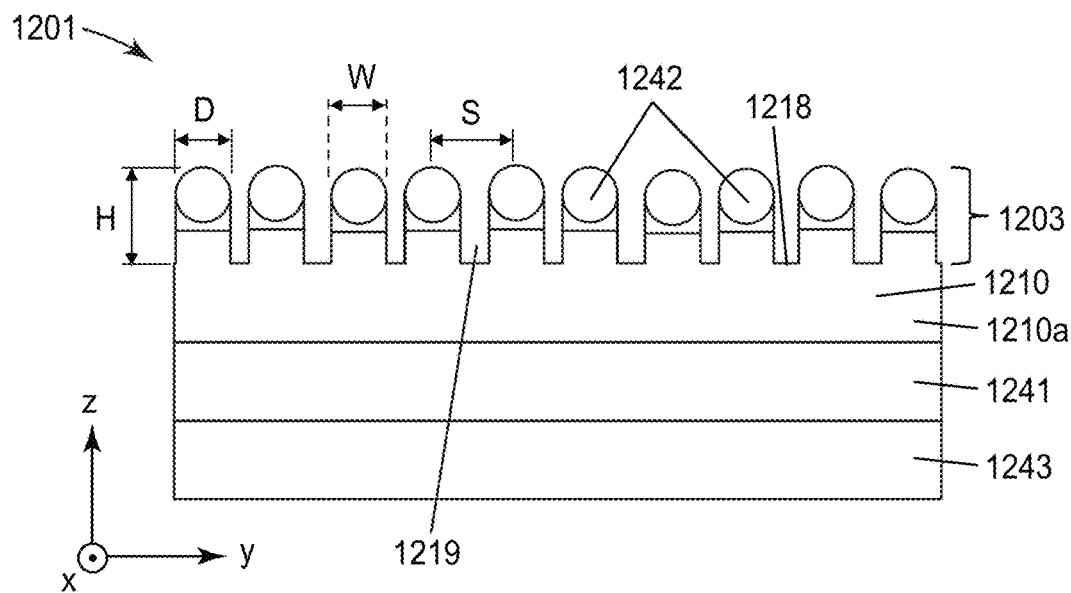
FIG. 12A is a cross-sectional view of a nanostructured article including a nanostructured surface having a plurality of pillars.

FIG. 12A is a schematic cross-sectional view of nanostructured article 1201 including first layer 1210 which has a nanostructured surface 1202 including a plurality of pillars 1203 extending from a base surface 1218, which is the portion of the nanostructured surface 1202 between the pillars 1203. Pillars 1203 have an average lateral dimension W, an average height H, and an average center-to-center spacing S. Each of the pillars 1203 includes a nanoparticle 1242. The nanoparticles 1242 have an average diameter D. The etch layer 1210a is the portion of layer 1210 which is etched in forming the pillars 1203. The term nanostructured article may refer any article having a nanostructured surface or a nanostructured interface between two layers. A nanostructure is a structure having at least one dimension in a range of 1 nm to 1000 nm. In some cases, a nanostructure has each lateral dimension or all three dimensions in a range of 1 nm to 1000 nm, or in a range of 10 nm to 1000 nm. The first layer is disposed generally in the x and y-directions and the pillars 1203 extend generally in the z-direction. Nanostructured article 1201 includes a first release liner 1243 and a transfer layer 1241 disposed between the first layer 1210 and the first release liner 1243. The first layer 1210 and/or the transfer layer 1241 may be or include polymeric layers. In some embodiments, the first layer 1210 is formed by first applying a layer of a monomer or oligomer to the transfer layer 1241 and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device to form etch layer 1210a. Etch layer 1210a is then etched (e.g., by plasma etching as described generally in U.S. Pat. Appl. Pub. No. 2014/0193612 (Yu et al.) and U.S. Pat. No. 8,460,568 (David et al.), both of which are hereby incorporated herein by reference to the extent they do not contradict the present description) as described further elsewhere herein to form the pillars 1203 in first layer 1210. In some embodiments, the transfer layer 1241 is made as described in WO 2013/116103 (Kolb et al.) and WO 2013/116302 (Kolb et al.), which are hereby incorporated herein by reference to the extent that they do not contradict the present description. The release liner 1243 can be any conventional release treated film, such as a silicone-coated polyethylene terephthalate (PET) film, for example. Other useful materials for the first layer 1210, the transfer layer 1241 and the first release liner 1243 are described further elsewhere herein.

Using different materials for the etch layer 1210a and the transfer layer 1241 allows the etch layer 1210a to be selected for improved etching properties or for desired optical properties of the nanostructured surface 1202 and allows the transfer layer 1241 to be selected for improved coatability on release liner 1243 or improved release properties from the release liner 1243. In addition, the thickness and physical properties of the transfer layer 1241 may be chosen to improve the mechanical properties of the construction. This may help mitigate negative effects such as cracking of the construction during the transfer process and in use. The transfer layer may be chosen to alleviate stress in the backfill (BF) layer that can lead to cracking. In some embodiments, the BF layer includes heavily loaded inorganic nanoparticles in a binder. In some cases, this causes the BF layer to be very brittle and prone to cracking. In other embodiments, the transfer layer 1241 is omitted and the etch layer 1210a is disposed on the first release liner 1243. In this case, the etch layer 1210a may be regarded as a transfer layer and can be prepared from materials described elsewhere herein for either an etch layer or a transfer layer. The transfer layer 1241 can also add additional functionality to the nanostructured article. For example, the transfer layer 1241 can have desired moisture or oxygen barrier properties or can be used to provide ultraviolet (UV) light blocking properties, for example. In some embodiments, the transfer layer 1241 has a thickness at least equal to the average pillar height.

The spaces 1219 between the lower portions 1203a (see FIG. 12B) of the pillars 1203 may be referred to as depressions and the pillars 1203 may be referred to as protrusions of the nanostructured surface 1202. Nanostructures other than pillars are also in the scope of the present description where portions of the nanostructured surface extending above an average height of the nanostructures are protrusions and portions of the nanostructured surface below an average height of the nanostructures are depressions.

Figure 12B:
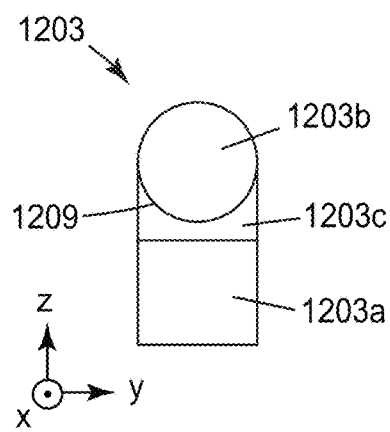
FIG. 12B is a cross-sectional view of a pillar of the nanostructured article of FIG. 12A.
Figure 12C:
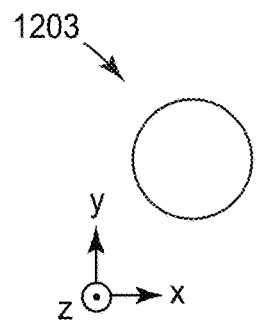
FIG. 12C is a top view of the pillar of FIG. 12B.

FIG. 12B is a schematic side-view of a pillar 1203 of the nanostructured article of FIG. 12A. Pillar 1203 includes a lower portion 1203a, an upper portion 1203b, and an intermediate portion 1203c. In some embodiments, as described further elsewhere herein, the intermediate portion 1203c includes a matrix material or a binder which was not removed in an etching process used to make the pillars 1203. FIG. 12C is a schematic top view of pillar 1203. In the illustrated embodiments, the pillars have a circular cross-section. In other embodiments, the pillars may have other cross-sections as described further elsewhere herein. In some embodiments, the lower portion 1203a is cylindrical and the nanoparticle of upper portion 1203b is spherical. In some embodiments, the nanoparticle has a diameter substantially equal to a diameter of the lower portion. The nanoparticles can be any nanoparticles which can function as an etch mask in forming the pillars 1203. In some embodiments, the nanoparticles are inorganic nanoparticles such as $SiO_2$ nanoparticles. In other embodiments, the nanoparticle may be a silicone nanoparticle which can act as an etch mask. Other suitable nanoparticles are described further elsewhere herein. In some embodiments, the upper portion 1203b is surface treated and covalently bonded to intermediate portion 1203c along the interface 1209 as described further elsewhere herein. In any of the embodiments described herein, the upper portion (mask portion) of the nanostructures may be covalently bonded to a binder which is attached to the lower portion of the nanostructures.

The upper portion 1203b and the lower portion 1203a have differing compositions. In some embodiments, the lower portion 1203a includes a polymeric material and the upper portion 1203b includes an inorganic material. In some embodiments, the lower portion 1203a includes a polymeric material at at least 60 weight percent and the upper portion 1203b includes an inorganic material at at least 80 weight percent. In some embodiments, the upper portion 1203b includes or consists essentially of a nanoparticle (i.e., the upper portion 1203b may include a nanoparticle and possibly include residue of a binder that was not fully removed by the etching process used to make the pillars, and possibly other impurities on the nanoparticle that do not substantially affect the optical performance of the nanostructured article). In some embodiments, the lower portion 1203a is a polymer or has a continuous polymeric phase. Nanoparticles can also be included in lower portion 1203a. Preferably such nanoparticles are smaller than the nanoparticle of the upper portion 1203b. For example, a plurality of nanoparticles having a diameter less than about 100 nm, or less than about 50 nm, or less than about 40 nm, may be included in the lower portion 1203a in order to modify the refractive index of the lower portion 1203a. In some embodiments, the lower portion 1203a is free of nanoparticles having diameters larger than half of the diameter of the nanoparticle of the upper portion 1203b.

In some embodiments, the nanoparticle of the upper portion 1203b and a material of the lower portion 1203a are selected such that the refractive indices of the lower and upper portions 1203a and 1203b are approximately equal. As used herein, refractive index refers to the refractive index measured at 632 nm, unless specified differently or unless the context clearly indicates differently. In some embodiments, the absolute value of the refractive index difference between the lower portion 1203a and the upper portion 1203b is no more than 0.1, or no more than 0.05. Such refractive index ranges apply to any pillars described herein having different upper and lower portions. In some embodiments, the absolute value of the refractive index difference between the lower portion 1203a and the intermediate portion 1203c is no more than 0.1, or no more than 0.05. In some embodiments, the absolute value of the refractive index difference between the upper portion 1203b and the intermediate portion 1203c is no more than 0.1, or no more than 0.05. Such refractive index ranges apply to any pillars described herein having different upper, lower and intermediate portions.

Figure 12D:
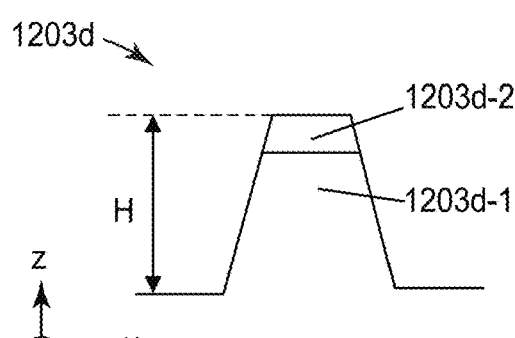
FIG. 12D is a side cross-sectional view of an alternate pillar.
Figure 12E:
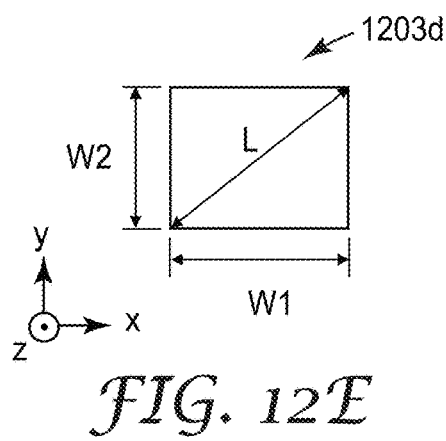
FIG. 12E is a top cross-sectional view of the pillar of FIG. 12D.

FIG. 12D is a schematic side and view of pillar 1203d which has a tapered rectangular cross-section. In some embodiments, the pillars 1203 of the nanostructured article 1201 are replaced with a pillars 1203d. The height of the pillar 1203d is H. The pillar 1203d includes a lower portion 1203d-1 and an upper portion 1203d-2. In some embodiments, the lower and upper portions 1203d-1 and 1203d-2 have differing compositions. For example, the lower portion 1203d-1 may include a continuous polymeric phase while the upper portion 1203d-2 may be inorganic. A cross-section through the pillar 1203d through a position along half of the height H is shown in FIG. 12E. The cross-section has a length W1, a width W2, and a largest lateral dimension L. The average lateral dimension of a pillar refers to $(4 A/\pi)^{1/2}$ where A is the area of a lateral (parallel to x-y plane) cross-section at half the height H of the pillar. In the embodiment illustrated in FIG. 12E, the area A is W1 times W2. In embodiments where the pillar is cylindrical, the average lateral dimension is the diameter of the cylinder. In embodiments, where the pillars have a distribution of sizes, the unweighted arithmetic average of the area, $A_a$, of the pillars is determined and the average lateral dimension of the pillars is given by $(4 A_a/\pi)^{1/2}$. As used herein, averages refer to unweighted arithmetic means unless specified differently. The lower and upper portions 1203d-1 and 1203d-2 of pillars 1203d may have the same properties except for the shape as described for lower and upper portions 1203a and 1203b of pillars 1203, respectively. A binder (not illustrated) may be disposed between the lower and upper portions 1203d-1 and 1203d-2 and the upper portion 1203d-2 may be covalently bonded to the binder as described further elsewhere herein.

In some embodiments, a second layer is disposed over the plurality of pillars 1203 and extends continuously to the base surface 1218. The second layer can be formed by backfilling the nanostructured surface 1202 of the first layer 1210 with a crosslinkable composition, for example. The backfill material can be applied to form the second layer using, for example, one of the following methods: liquid coating; vapor coating; powder coating; lamination; dip-coating; or roll-to-roll coating. In some embodiments, the backfill material forms a planar surface opposite the nanostructured surface. In some embodiments, the second layer is a high index backfill material. Examples of suitable high index backfill materials include the following: high index inorganic materials; high index organic materials; a nanoparticle filled polymer material; silicon nitride, indium tin oxide, zinc sulfide or a combination thereof; polymers filled with high index inorganic materials; and high index conjugated polymers. Examples of high index polymers and monomers are described in C. Yang, et al., Chem. Mater. 7, 1276 (1995), and R. Burzynski, et al., Polymer 31, 627 (1990) and U.S. Pat. No. 6,005,137, all of which are hereby incorporated herein by reference to the extent that they do not contradict the present description. Examples of polymers filled with high index inorganic materials are described in U.S. Pat. No. 6,329,058, which is hereby incorporated herein by reference to the extent that it does not contradict the present description. The high index inorganic materials may be nanoparticles having a size less than 100 nm, or less than 50 nm, or less than 40 nm, for example. Examples of nanoparticles for a nanoparticle filled polymer material include the following high index materials: $TiO_2$, $ZrO_2$, $H_fO_2$, or other inorganic materials.

The nanostructured surface 1202 or the corresponding nanostructured interface between the nanostructured surface 1202 and an adjacent second layer may have a power spectral density (PSD) as described further elsewhere herein.

Figure 13:
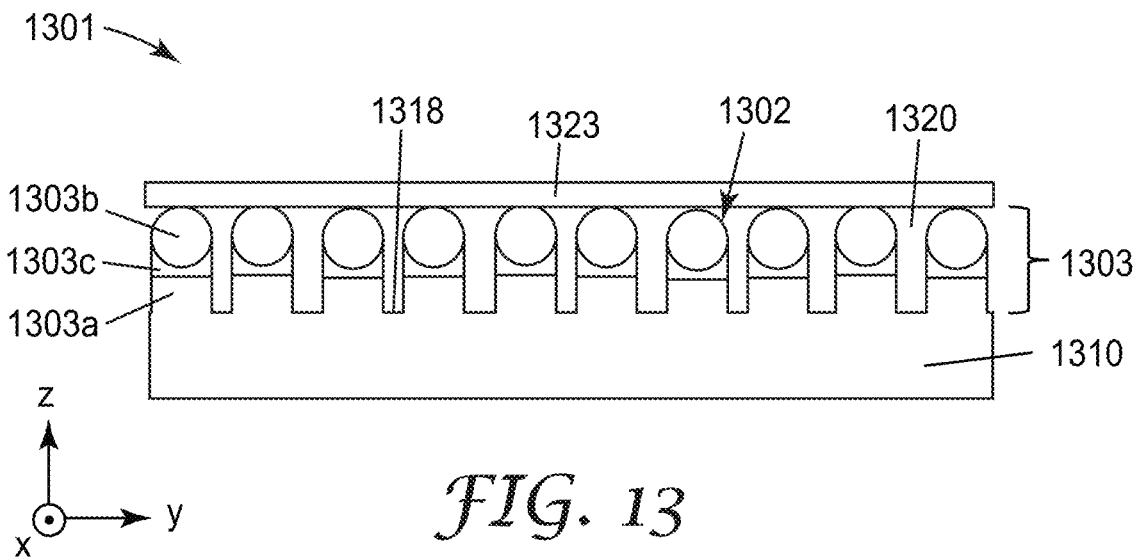
FIGS. 13-15 are cross-sectional views of nanostructured articles.

FIG. 13 is a schematic cross-sectional view of nanostructured article 1301 including first layer 1310 which has a nanostructured surface 1302 including a plurality of pillars 1303 extending from a base surface 1318 of the first layer 1310. First layer 1310 may correspond to first layer 1210 and may be made from the same materials and processes. Nanostructured article 1301 further includes a second layer 1320 disposed over the plurality of pillars 1303 and extending continuously to the base surface 1318 of the first layer 1310. A seal layer 1323 is disposed on the second layer 1320 opposite the first layer 1310. In some embodiments, the second layer 1320 is a liquid layer or a gas layer and the seal layer 1323 is used to seal the gas or liquid in place. In other embodiments, the second layer 1320 is a solid layer. In some embodiments, the second layer 1320 is an ultralow refractive index material, such as those described in U.S. Pat. App. Pub. No. 2012/0038990 (Hao et al.) which is hereby incorporated herein by reference to the extent that it does not contradict the present description, and has a refractive index in a range of 1.05 or 1.2 to 1.35 or 1.45, for example. Such ultralow refractive index materials typically include a plurality of nanovoids within a continuous polymeric phase.

The seal layer 1323 can be a plasma deposited thin film and may include one or more elements selected from the group consisting of carbon, hydrogen, silicon, oxygen, nitrogen and fluorine. For example, in embodiments where the pillars have a high aspect ratio with small gaps between pillars, plasma deposition closes the tops of the pillars more effectively than the bottoms of the pillars when the deposition is carried out at a pressure where the deposition rate at the base of the pillars is smaller than at the top of the pillars. This results is a plasma deposited thin film at the tops of the pillars with a gas layer, for example, between the thin film and the base of the pillars. Other suitable seal layers include the seal layers used to seal and protect pores in ultralow index materials. Such seal layers are described, for example, in U.S. Pat. Appl. Pub. Nos. 2013/0202867 (Coggio et al.) and 2015/0140316 (Steiner et al.), each of which is hereby incorporated herein by reference to the extent that it does not contradict the present description. In some cases, such a seal layer is a polymeric protective layer which may be formed from organomodified silicones or thermoplastic silicone acrylate copolymers, for example, or which may be formed from an aqueous emulsion, for example. Suitable seal layers also include adhesive layers that can act as a sealer or combinations of adhesive layers and barrier layers, for example. Other seal layers known in the art can also be utilized for seal layer 1323.

The upper portions of the pillars 1303 can be nanoparticles which are used as an etching mask in forming the pillars, as described further elsewhere herein. Second layer 1320 can be a backfill material (e.g., the crosslinkable or high index backfill material described elsewhere herein) extending over openings through the mask (through the space between the upper portions of the pillars 1303) onto the base surface 1318 of the first layer 1310.

In some embodiments, the lower portions 1303a of the pillars 1303 have a first refractive index, the second layer 1320 has a second refractive index, the upper portion 1303b has a third refractive index, and the intermediate portion 1303c has a fourth refractive index. In some embodiments, an absolute value of a difference between the first and third refractive indices is no more than 0.1, or no more than 0.05. In some embodiments, an absolute value of a difference between the first and fourth refractive indices is no more than 0.1. It is generally desired for a relatively large difference between the first and second refractive indices (e.g. at least 0.1, or at least 0.2, or at least 0.3). In some embodiments, an absolute value of a difference between the first and second refractive indices is in a range of 0.1 to 1.5, or in a range of 0.2 to 1.0, or in a range of 0.3 to 0.8. The index difference can be achieved by using a relatively low or a relatively high refractive index of the second layer 1320 so that the second refractive index is higher than or lower than the first refractive index. In some embodiments, the second refractive index is no more than 1.45, or no more than 1.25. In some embodiments, the second refractive index is in a range of 1.05 to 1.45 or to 1.25. In some embodiments, the second refractive index is at least 1.6, or at least 1.7. In some embodiments, the second refractive index is in a range of 1.6 to 2.3, or to 2.2, or to 2.1.

The nanostructured surface 1302 or the corresponding nanostructured interface between the nanostructured surface 1302 and the second layer 1320 may have a power spectral density (PSD) as described further elsewhere herein.

Figure 14:
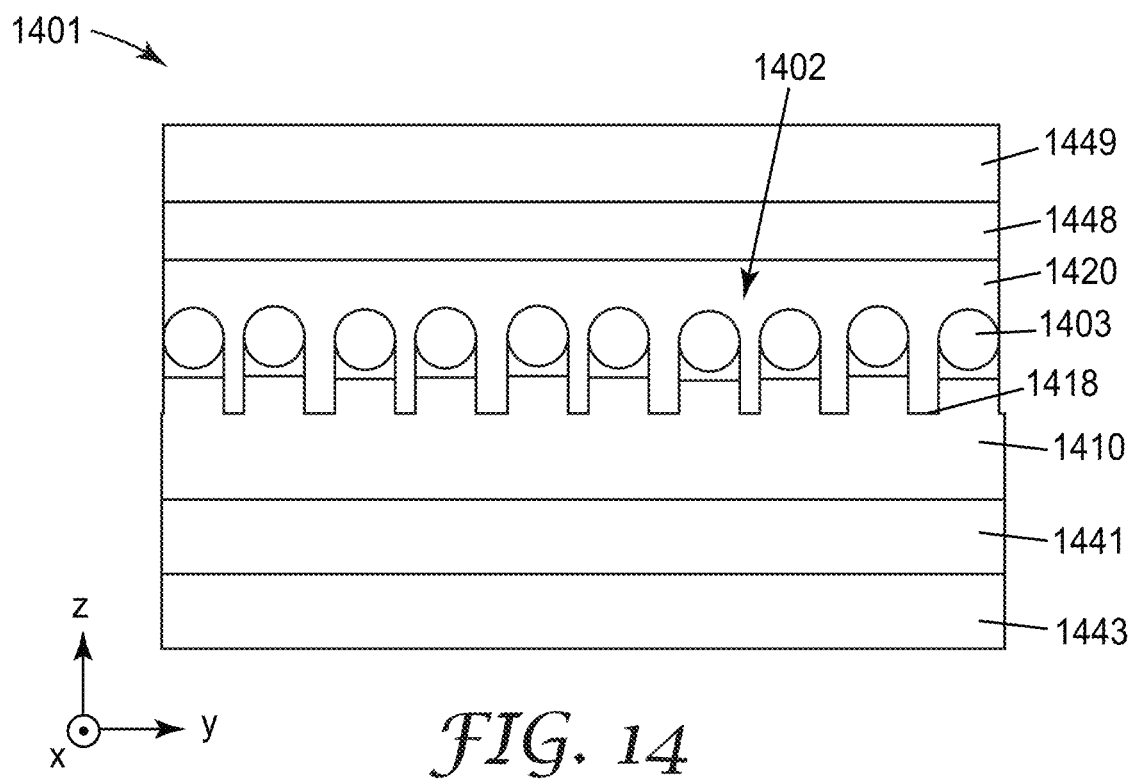

FIG. 14 is a schematic cross-sectional view of nanostructured article 1401 including first layer 1410 which has a nanostructured surface 1402 including a plurality of pillars 1403 extending from a base surface 1418 of the first layer 1410. Nanostructured article 1401 further includes a transfer layer 1441 disposed on a first release liner 1443, a second layer 1420 disposed over the plurality of pillars 1403 and extending continuously to the base surface 1418, an adhesive 1448 disposed on the second layer 1420 opposite the first layer 1410, and second release liner 1449 disposed on the adhesive 1448 opposite the second layer 1420. The first layer 1410 can be deposited as described for first layer 1210, for example, or as described for other substrate layers described elsewhere herein. The first and second release liners 1443 and 1449 can be any release liner described elsewhere herein. The adhesive 1448 can be an optically clear adhesive (OCA), for example. Illustrative OCAs include those described in publication WO 2008/128073 relating to antistatic optically clear pressure sensitive adhesive, U.S. Patent Application Publications US 2009/030084 relating to stretch releasing OCA; US 2009/0087629 relating to indium tin oxide compatible OCA; US 2010/0028564 relating to antistatic optical constructions having optically transmissive adhesive; US 2010/0040842 relating to adhesives compatible with corrosion sensitive layers; US 2011/0126968 relating to optically clear stretch release adhesive tape; and US 2011/0253301 relating stretch release adhesive tape. Suitable OCAs include acrylic optically clear pressure sensitive adhesives such as, for example, 3M OCA 8146 available from 3M Company. St. Paul, Minn. In some embodiments, the OCA has a thickness in a range of 1 micrometer to 50 micrometers, or in a range of 10 micrometers to 40 micrometers.

Pillars 1403 include lower portions 1403a, upper portions 1403b, and intermediate portions 1403c. In some embodiments, the upper portions 1403b may be collectively referred to as a mask or a mask layer since these portions can be used in forming the pillars 1403 as described further elsewhere herein. In some embodiments, the lower portions of the pillars 1403 have a first refractive index, the second layer 1420 has a second refractive index, the upper portion of the pillars 1403 has a third refractive index, and the intermediate portion of the pillars 1403 has a fourth refractive index. In some embodiments, an absolute value of a difference between the first and third refractive indices is no more than 0.1, or no more than 0.05. In some embodiments, an absolute value of a difference between the first and fourth refractive indices is no more than 0.1. In some embodiments, an absolute value of a difference between the first and second refractive indices is in a range of 0.1 to 1.5.

An interface between the nanostructured surface of the first layer 1410 and the second layer 1420 can have any of the geometries described elsewhere herein. For example, this nanostructured interface may have a PSD as described further elsewhere herein. The refractive index contrasts across the nanostructured interface may be in any of the ranges described elsewhere herein.

In some embodiments, the nanostructured surface has a pillar height distribution with a standard deviation about the average height of the pillars of no more than 10 percent (or no more than 8 percent, or no more than 5 percent, or even no more than 3 percent) of the average pillar height, or less than 20 nm (or less than 15 nm, or even less than 10 nm). The standard deviation and average pillar height can be calculated over a 10 micrometer by 10 micrometer area, for example.

Figure 15:
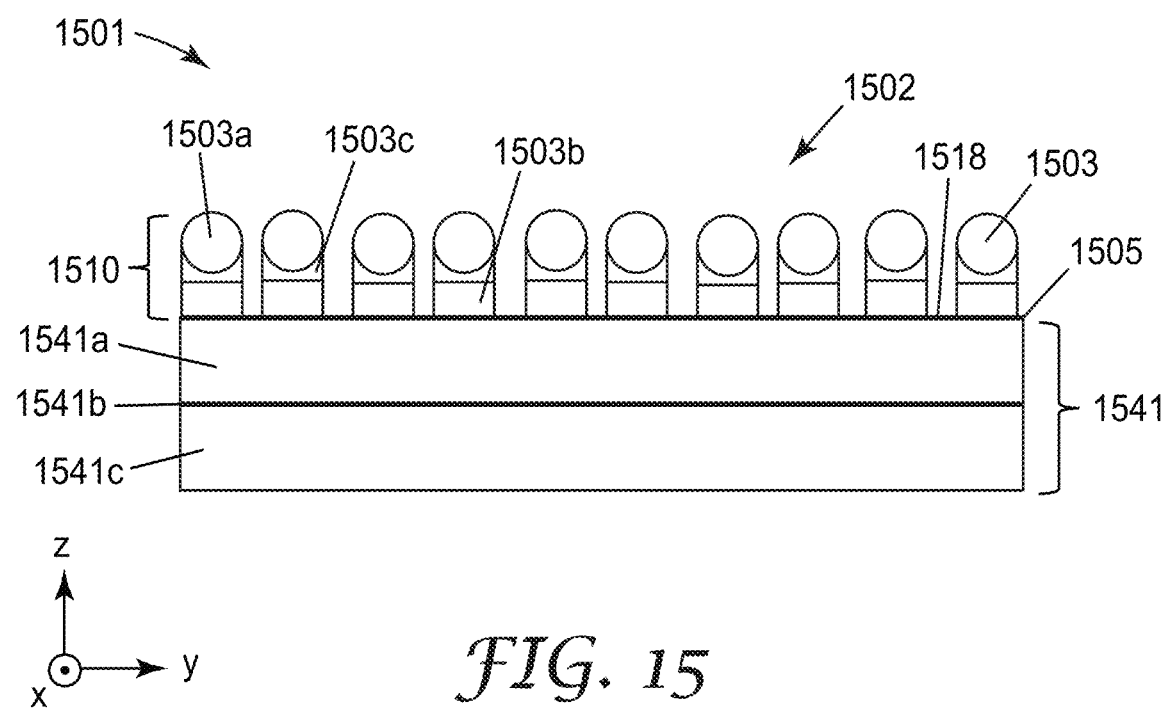

FIG. 15 is a schematic cross-sectional view of nanostructured article 1501 including first layer 1510 which has a nanostructured surface 1502 including a plurality of pillars 1503 extending from a base surface 1518 of the first layer 1510. First layer 1510 includes a plurality of sublayers. These sublayers include upper 1503a, lower 1503b and intermediate 1503c portions of the pillars 1503 and includes base 1505 having the base surface 1518. In some embodiments, base 1505 is an etch stop layer used to control the height of the pillars 1503. In some embodiments, base 1505 is an inorganic layer, which may be an inorganic barrier layer as described elsewhere herein and which may be used as an etch-stop layer in forming the pillars 1503. Using an inorganic etch stop layer can aid in achieving a low variation in the pillar height. For example, in some embodiments where an etch stop layer is used, the nanostructured surface has a pillar height distribution with a standard deviation about the average height of the pillars of no more than 5 percent (or no more than 3 percent, or even no more than 2 percent) of the average pillar height. This standard deviation can be determined over a 10 micrometer by 10 micrometer area or even over a 1 cm by 1 cm area, for example. First layer 1510 is disposed on a plurality of layers 1541. Plurality of layers 1541 includes polymeric layer 1541a, inorganic layer 1541b, and polymeric layer 1541c. In some embodiments, the plurality of layers 1541 include a plurality of inorganic barrier layers with polymeric layers disposed between the inorganic barrier layers. Such alternating polymeric and barrier layers used in the substrate in forming the nanostructured article 1501 may be referred to as a barrier film and are described further elsewhere herein. The nanostructured surface 1502 or the corresponding nanostructured interface between the nanostructured surface 1502 and an adjacent second layer may have a PSD as described further elsewhere herein.

Figure 16A:
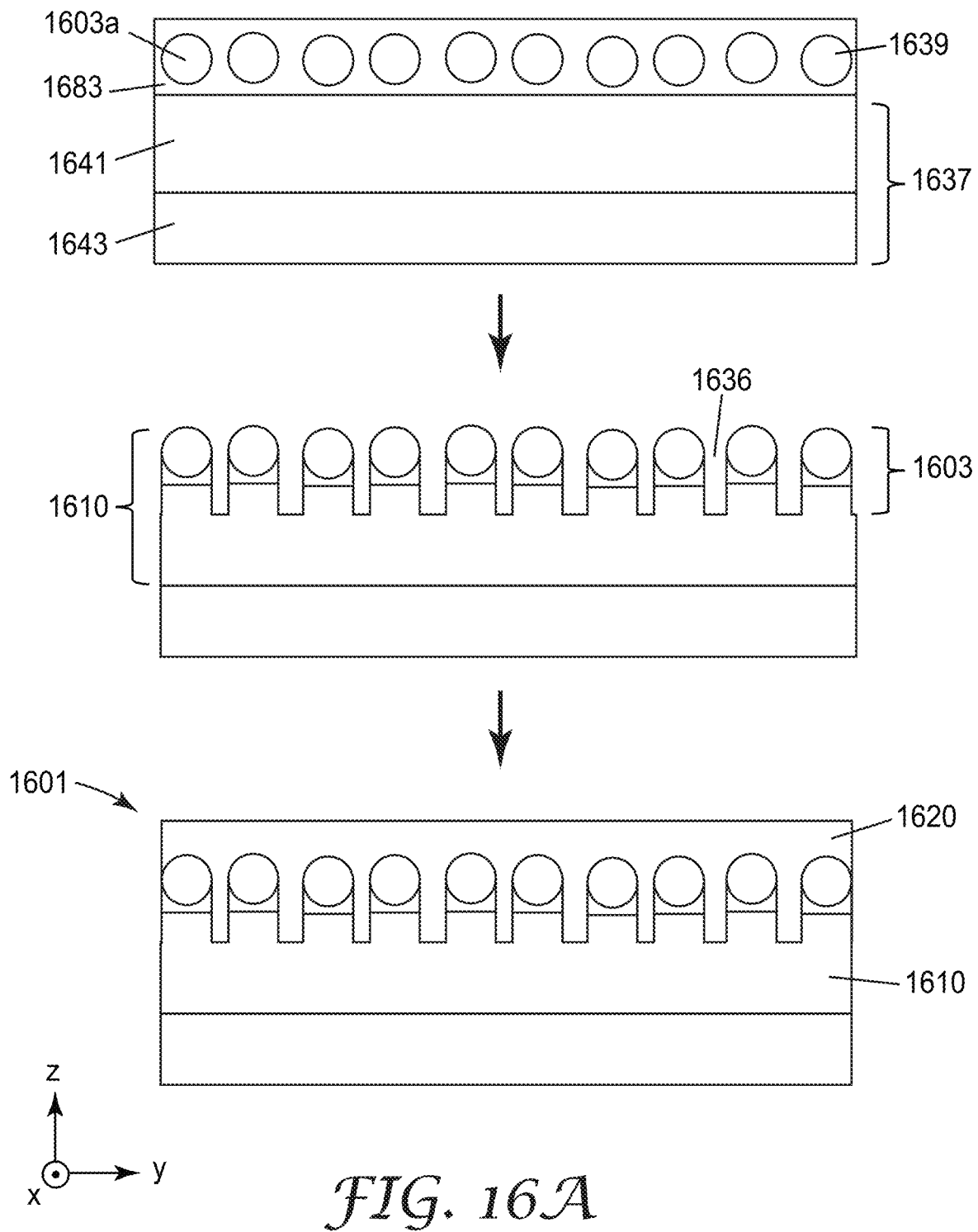
FIG. 16A illustrates a process for making a nanostructured article from a masked substrate.

FIG. 16A illustrates a method of making a nanostructured article 1601. A substrate 1637 including polymer layer 1641 and release liner 1643 is provided. Other layers may optionally be included. For example, a transfer layer may be disposed between polymer layer 1641 and release liner 1643. The material of the polymer layer 1641 may be any of the materials described elsewhere herein for an etch layer (e.g., etch layer 1210a) or a transfer layer (e.g., transfer layer 1241). Mask 1639 including a plurality of particles 1603a is disposed on the substrate 1637. The mask 1639 can be coated on the substrate 1637 and cured using methods known in the art such as, for example, casting by casting drum, die coating, flow coating, or dip coating. The mask 1639 may have any desired thickness. It is typically desired that the mask include a monolayer of nanoparticles and so the thickness of the mask is typically similar to or somewhat larger than the nanoparticle size. In some embodiments, the mask 1639 has a thickness less than 1 micrometer, or less than 500 nm, or less than 300 nm. In some embodiments, the mask 1639 has a thickness in a range of 100 to 300 nm. The plurality of particles is provided in a matrix or binder 1683. The binder 1683 can be formed from a polymeric precursor material which is subsequently cured or dried. Etching (e.g., reactive ion etching) is used to form openings 1636 through mask 1639 into substrate 1637 and thereby form nanostructured layer 1610. Openings 1636 extent into but not through polymer layer 1641. A backfill material 1620 is disposed over the pillars 1603. The backfill material 1620 can be any of the backfill materials described elsewhere herein. The nanostructured interface between the nanostructured layer 1610 and the backfill material 1620 may have any of the PSDs and refractive index contrasts described elsewhere herein.

Figure 16B:
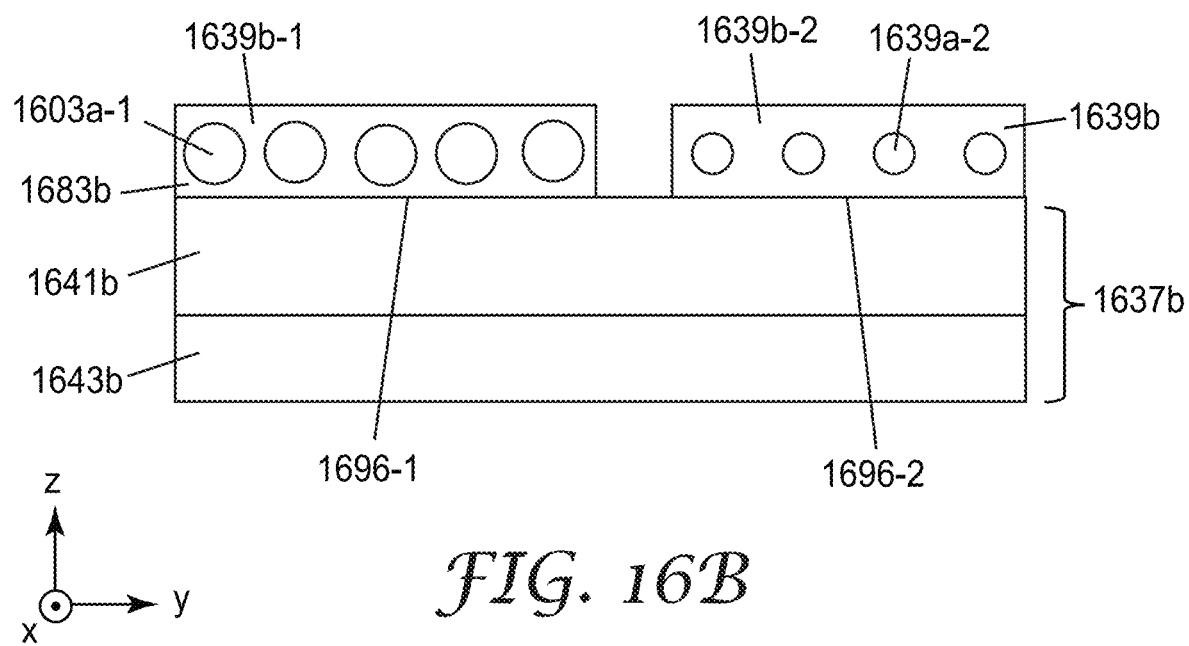
FIG. 16B illustrates an alternative masked substrate that can be used in the process of FIG. 16A.

FIG. 16B illustrates an alternative mask 1639b including a first portion 1639b-1 having a first plurality of particles 1603a-1 and a second portion 1639b-2 having a second plurality of particles 1603a-2. Mask 1639b is disposed on the substrate 1637b which includes polymer layer 1641b and release liner 1643b. First portion 1639b-1 can be formed from a first mixture that is printed in first region 1696-1 of substrate 1637b and second portion 1639b-2 can be formed from a second mixture that is printed in second region 1696-2 of substrate 1637b. Utilizing different first and second portions 1639b-1 and 1639b-2 results in a nanostructured surface including at least first and second regions where at least one geometric attribute (e.g., average lateral dimension or average center-to-center spacing or average height) has different values in the first and second regions. The second mixture has a distribution of nanoparticles different from that of the first mixture. In some embodiments, the first mixture has a first average size of nanoparticles and the second mixture has a different second average size of nanoparticles. In some embodiments, the first mixture has a first loading of nanoparticles and the second mixture has a different second loading of nanoparticles. Utilizing a mask 1639b with two (or more) different distributions of nanoparticles in two (or more) different regions can be used to provide nanostructures having a PSD which is customized to the color of the light emitting region over which the nanostructures are disposed. For example, a mask with three different regions for each subpixel of an OLED display can provide a custom PSD for each of three subpixels (e.g., subpixels 945a, 945b and 945c of FIG. 9).

Figure 17:
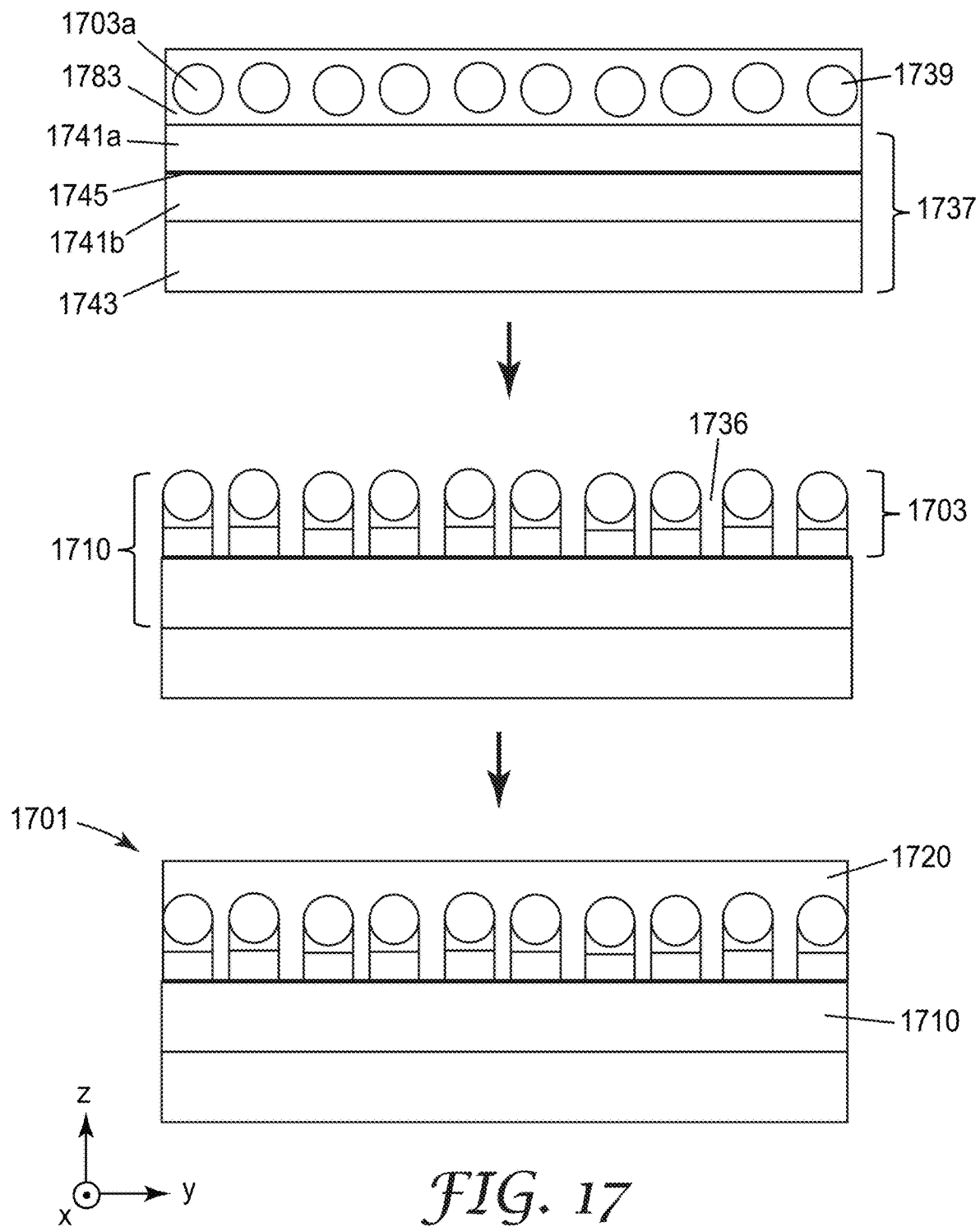
FIGS. 17-18 illustrate processes for making nanostructured articles.

In some embodiments, the substrate includes a plurality of layers and includes at least one inorganic layer and at least one polymeric layer. This is illustrated in FIG. 17 which illustrates a method of making a nanostructured article 1701. A substrate 1737 including first polymer layer 1741a (which may also be referred to as an etch layer and may correspond to etch layer 1210a), inorganic layer 1745, second polymer layer 1741b (which may also be referred to as a transfer layer) and release liner 1743 is provided. Other layers may optionally be included. Mask 1739 including a plurality of particles 1703a is disposed on the substrate 1737. Mask 1739 may be deposited as described for mask 1639. The plurality of particles is provided in a matrix or binder 1783. Etching (e.g., reactive ion etching as described further elsewhere herein) is used to form openings 1736 through mask 1739 into substrate 1737 to form nanostructured first layer 1710 including pillars 1703. Openings 1736 extent through first polymer layer 1741 to inorganic layer 1745 which is an etch-stop layer for the etching process used to form the openings 1736. A backfill material is deposited over the pillars 1703 to form second layer 1720.

Figure 18:
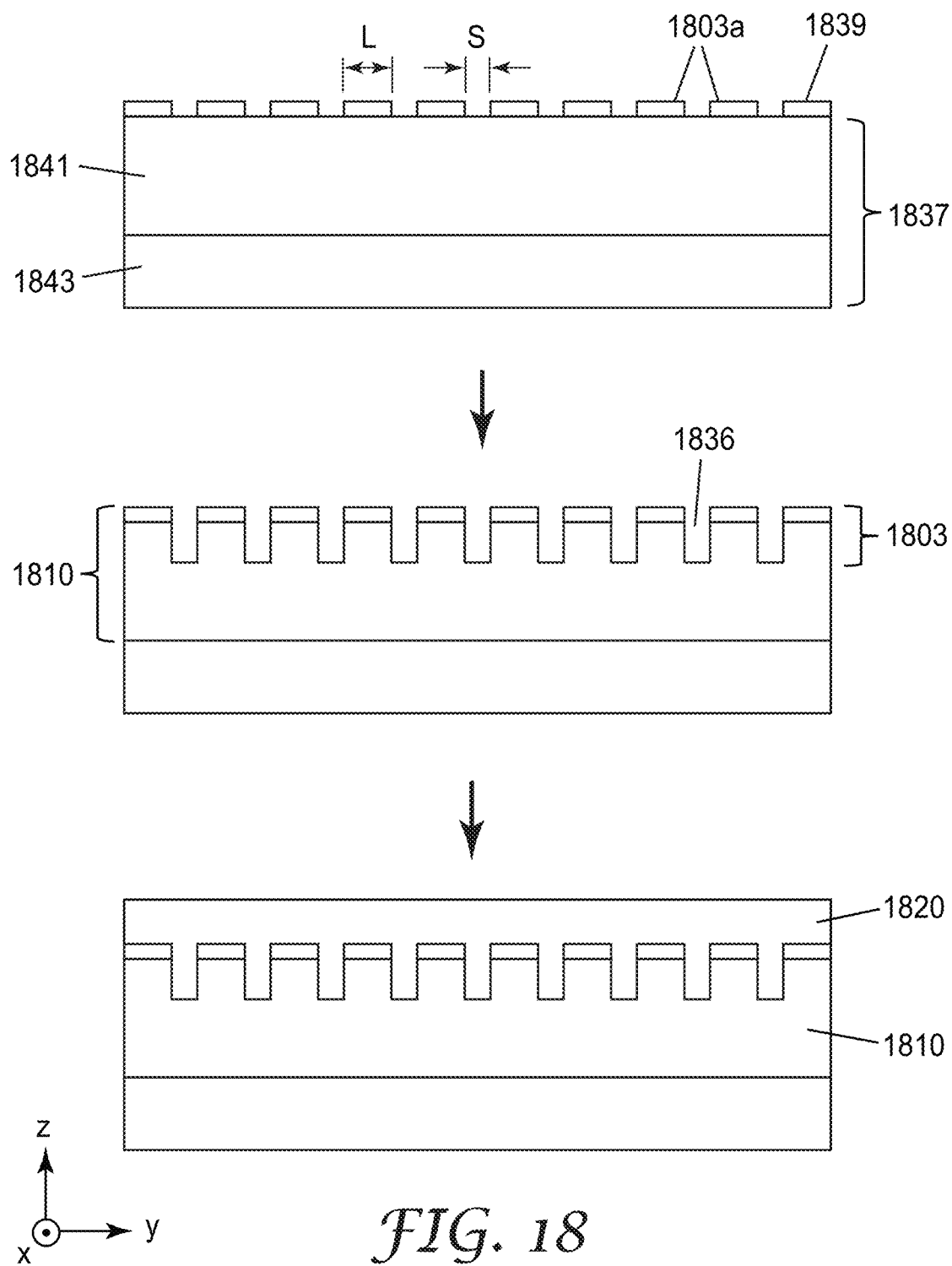

FIG. 18 illustrates a method of making a nanostructured article 1801. A substrate 1837 including polymer layer 1841 and release liner 1843 is provided. Other layers may optionally be included. Mask 1839 is a discontinuous layer including a plurality of islands 1803a is disposed on the substrate 1837. Mask 1839 can be an inorganic layer or a metal layer, for example. Mask 1839 can be disposed on substrate 1837 via photolithography, solution coating or vapor coating, microcontact printing, spray coating, inkjet printing, screen printing, other printing methods, deposition of nanoparticles in an organic resin, or copolymer phase separation, for example. In some embodiments, mask 1839 is disposed on substrate 1837 via photolithography. Etching (e.g., reactive ion etching as described further elsewhere herein) is used to form openings 1836 through mask 1839 into substrate 1837. Openings 1836 extent into but not through polymer layer 1841. A backfill material, which may correspond to any of the backfill materials described elsewhere herein, is disposed over the pillars 1803 through the openings 1836 to the polymer layer 1841 to form second layer 1820. In some embodiments, the islands 1803a have a largest lateral dimension L in a range of 100 to 1000 nm and have an average spacing s between nearest neighbor islands in a range of 100 to 500 nm.

In some embodiments, the lower portions of the pillars 1803 have a first refractive index, the second layer 1820 has a second refractive index, and the upper portion of the pillars 1803 has a third refractive index. In some embodiments, an absolute value of a difference between the first and third refractive indices is no more than 0.1, or no more than 0.05. In some embodiments, an absolute value of a difference between the first and second refractive indices is in a range of 0.1 to 1.5.

In an alternate embodiment, mask 1839 is an organic mask (e.g., a photolithographically patterned photo resist) and first layer 1810 is an inorganic layer which is etched using wet chemistry methods.

The nanostructured surfaces or nanostructured interfaces produced by the methods of FIGS. 16-18 may have a PSD as described further elsewhere herein.

Figure 19:
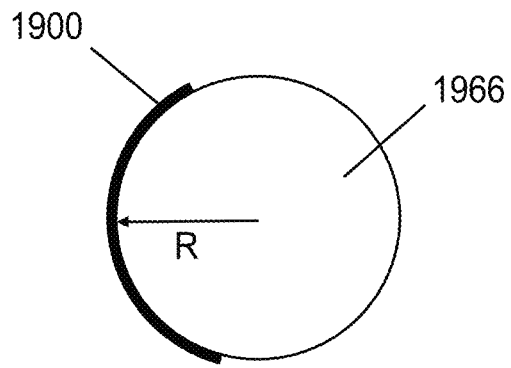
FIG. 19 is a schematic end view of a nanostructured article bent about a cylindrical mandrel having a radius of R.

In some embodiments, the nanostructured articles describe herein are flexible. For example, in some embodiments, the nanostructured article can be bent to a radius of curvature R of 1 cm or less without cracking or breaking. FIG. 19 is a schematic end view of nanostructured article 1900, which may correspond to any of the nanostructured articles described elsewhere herein, bent to a radius of curvature R about a cylindrical mandrel 1966 having a radius of R.

The materials used in the etch layer, or the transfer layer, or the binder (also referred to as a matrix) or the nanoparticles in a nanoparticle etch mask and be any suitable material for a desired application. Suitable binders and nanoparticles and suitable etching methods using the nanoparticles as an etch mask are described further under "Matrix and Nanoparticles". The substrate of a nanostructured article having an etch mask refers to the layers under the etch mask. The substrate includes the etch layer and the transfer layer and release liner when included. Suitable substrates which include the etch layer and additional layers are described further in the section "Substrate". Suitable transfer layers are described further in the section "Transfer Layer of the Substrate". Suitable release liners are described further under the section "Release Liner of the substrate". If a second release liner is included in a nanostructured article opposite the substrate, the second release liner may also be a release liner described in the section "Release Liner of the substrate".

Organic light emitting diode (OLED) displays often produce a light output having a color that varies with view direction. This effect is particularly objectionable in strong cavity OLEDs where a cavity between the cathode and anode of the emissive stack of the OLED has an output that depends on wavelength and view angle approximately as the cosine of the view angle divided by the wavelength of the light in the cavity. According to the present description, nanostructured articles including a nanostructured surface have been found that when placed proximate an emissive layer of an OLED display reduces the variation in color with view direction without significantly changing the on-axis light output of the display. The nanostructured surface of a first layer provides a nanostructured interface between two materials (one of which may be air or other gas and may be under partial vacuum) that includes nanostructures (e.g., pillars). Nanostructures are structures having a least one length scale (dimension) in a range of 1 nm to 1000 nm. In some embodiments, the nanostructures have a least one length scale in a range of 10 nm to 500 nm, or in a range of 100 nm to 350 nm.

FIG. 1 is a cross-sectional view of an organic light emitting diode (OLED) display 100 including a nanostructured article 101 disposed proximate to and outside of an evanescent zone 138 of an emissive OLED layer 130. The evanescent zone 138 typically extends only a few wavelengths of visible light from the emissive OLED layer 130 in the z-direction. OLED stack 131 contains emissive OLED layer 130, electrodes 132, and hole transport layer 133. OLED stack 131 may contain other layers known to be used in various OLED constructions that are not illustrated in FIG. 1. An inner layer 134 separates the nanostructured article 101 from the emissive OLED layer 130 and an optional circular polarizer 111 is disposed adjacent the nanostructured article 101 opposite the inner layer 134. Inner layer 134 may be an encapsulant for the emissive OLED layer 130. The nanostructured article 101 includes nanostructured interface 102 disposed between first and second layers 110 and 120, with the second layer 120 disposed between the first layer 110 and the emissive OLED layer 130. The nanostructured interface 102 has a displacement 106, which will be denoted h(x,y), from a mean plane 104. It will be understood that the descriptions of the geometry of a nanostructured interface applies equally well to the corresponding nanostructured surfaces of the layers forming the nanostructured interface. The nanostructured interface 102 is disposed at a distance d from the emissive OLED layer 130. The distance d is the distance from the mean plane 104 to the top of the emissive OLED layer 130. In some embodiments, d is at least 5 micrometers, or at least 10 micrometers and in some embodiments, d is no more than 200 micrometers, or no more than 100 micrometers, or no more than 50 micrometers. The nanostructured interface 102 has a plurality of peaks 103 and an average spacing S between nearest neighbor peaks. The variance of the displacement 106 from the mean plane 104 of the nanostructured interface 102 will be denoted Var. FIG. 1 also illustrates a cone of view 147 for a pixel in the display 100, the cone of view 147 has a half-angle θ relative to a normal 146 to the display 100. The half-angle θ may be 60 degrees, for example.

While the nanostructured interface 102 can be any suitable nanostructure, in many cases it is preferable that the peaks 103 arise from pillars formed on the first layer 110 as described further elsewhere herein. The pillars have an average height H larger than an average lateral dimension D. The average spacing S between nearest neighbor peaks is an average center-to-center spacing between pillars. In some embodiments, the average center-to-center spacing S is no more than 2000 nm. In some embodiments, the pillars have tapered sidewalls as illustrated in FIG. 1. In other embodiments, the sidewalls are vertical or substantially vertical as illustrated in FIG. 12A, for example. In some embodiments, the pillars have upper and lower portions having differing compositions as illustrated in FIGS. 12B and 12D, for example. In some embodiments, the pillars include an etch mask (e.g., nanoparticles) as an upper portion of the pillars. In other embodiments, an etch mask used in forming the pillars of first layer 110 is removed prior to applying second layer 120.

In some embodiments, the first and second layers 110 and 120 are polymeric layers having a continuous polymeric phase. Either of the first and second layers 110 and 120 may include inorganic nanoparticles in order to modify the refractive index. Such nanoparticles typically have an average size less than 100 nm, or less than 50 nm, or less than 40 nm (the average size can be determined from the average volume $V_a$ of the nanoparticles (unweighted arithmetic average) as $(6 V_a/\pi)^{1/3}$). In some embodiments, a tool having a desired nanostructured surface is used to form the first layer 110 in a continuous cast and cure process as described further elsewhere herein. The second layer 120 can be formed by backfilling a nanostructured surface of the first layer 110 with a crosslinkable composition, for example. The backfill material can be applied to form the second layer 120 using, for example, one of the following methods: liquid coating; vapor coating; powder coating; lamination; dip-coating; or roll-to-roll coating. In some embodiments, the backfill material forms a planar surface opposite the nanostructured interface 102. Each of the first and second layers 110 and 120 may be continuous layers (e.g., a layer with a continuous polymeric phase). Each of the first and second layers 110 and 120 may be solid layers (e.g., hard or soft polymeric layers). In some embodiments, one of the first and second layers 110 and 120 may be a gas or a liquid layer and a seal layer, as described elsewhere herein, may be included to keep the gas or liquid layer in place.

The first layer 110 may be a crosslinked resin layer and may have a refractive index in the range of 1.2 to 1.6, or in the range of 1.4 to 1.55, for example. In some embodiments, the second layer 120 has a refractive index of at least 1.4, or at least 1.5, or at least 1.6, or at least 1.7, or at least 1.75. In some embodiments, the second layer 120 has a refractive index larger than that of the first layer 110. The first and second layers 110 and 120 provide a refractive index contrast (absolute value of the difference in the refractive index of the second layer 120 and the refractive index of the first layer 110) across the nanostructured interface 102. In some embodiments, the refractive index contrast is constant along the nanostructured interface 102. In some embodiments, the refractive index contrast is in a range of 0.1, or 0.2, or 0.3 to 1.5 or to 1.0. In some embodiments, the first layer 110 is an ultralow refractive index material, such as those described in U.S. Pat. App. Pub. No. 2012/0038990 (Hao et al.), and has a refractive index in a range of 1.05 or 1.2 to 1.35 and the second layer 120 is a high index layer having a refractive index greater than 1.7.

Typically, it is desired to have a large refractive index contrast, since diffracted power transmitted through the nanostructured interface is proportional to the square of the refractive index contrast, and this can be achieved by utilizing a high refractive index material for the second layer 120. Suitable materials for the second layer 120 include the high index backfill materials described elsewhere herein.

In some embodiments, the nanostructured interface 102, or equivalently, the corresponding nanostructured surface of first or second layers 110 or 120, has a substantially azimuthally symmetric power spectral density (PSD). The PSD is given by taking the magnitude squared of the two-dimensional Fourier transform of the displacement h(x,y), also denoted $h(\vec{x})$, where $\vec{x}=(x,y)$ is a vector in the x-y plane, over an area of the x-y plane and dividing by the area for an area sufficiently large compared to an average spacing between peaks in h(x,y) so that the ratio of the magnitude squared of the Fourier transform to the area is approximately independent of the area. The PSD at a wavevector, $\vec{k}$. (also denoted k), can be expressed as $$PSD(\vec{k}) = \frac{1}{A}\left|\int_A d^2x e^{-i\vec{k}\cdot\vec{x}} h(\vec{x})\right|^2$$

for sufficiently large area, A. Typically, the average spacing is less than 2 micrometers or less than 1 micrometer and a square area 10 micrometers by 10 micrometers is a sufficiently large area for determining the PSD. PSDs have units of length to the fourth power. It follows from the definition of the PSD that the two-dimensional Fourier space integral of the PSD is equal to $(2\pi)^2$ times the variance Var of the displacement from the mean displacement of the nanostructured interface or nanostructured surface. It has been found that utilizing the substantially azimuthally symmetric power spectral densities described herein are useful for providing a desired color correction without significantly altering on-axis output (e.g., brightness, color and contrast) of the OLED display when the PSD is suitably chosen.

Figure 2:
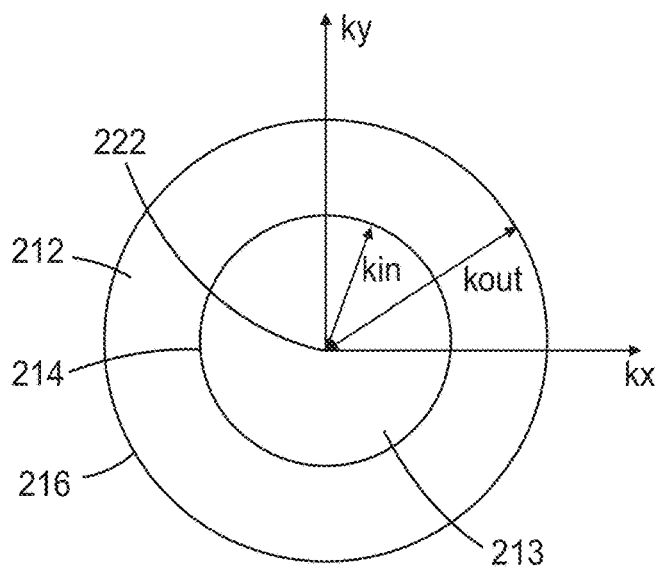
FIG. 2 is a schematic illustration of a region in Fourier space in which the power spectral density (PSD) of a nanostructured surface is concentrated.

FIG. 2 is a schematic illustration of a region in Fourier space in which the power spectral density (PSD) of a nanostructured surface is concentrated. Annulus 212 is a two-dimensional region in Fourier space bounded by inner circle 214 and outer circle 216, both of which are centered at zero wavenumber 222. Inner circle 214 has a radius of kin, which may be described as the inner wavenumber of the annulus 212, and outer circle 216 has a radius of kout, which may be described as the outer wavenumber of the annulus 212. The integral of the PSD over all of Fourier space is $(2\pi)^2$ times the variance Var, which is described elsewhere herein. In some embodiments, the integral in Fourier space of the PSD over the area 213 contained in and bound by the inner circle 214 is no more than 4 times Var, or no more than 2 times Var, or no more than Var. In some embodiments, the integral of the PSD over the two-dimensional annulus 212 in Fourier space is between 0.8 and 1.0 times $(2\pi)^2$ times Var, or between 0.9 and 1.0 times $(2\pi)^2$ times Var. In some embodiments, the integral of the PSD over the two-dimensional annulus 212 in Fourier space is about $(2\pi)^2$ times Var. In some embodiments, kin is 6 radians/micrometer times the second refractive index, or 8 radians/micrometer times the second refractive index, or 9 radians/micrometer times the second refractive index, or 10 radians/micrometer times the second refractive index, or 12 radians/micrometer times the second refractive index, or 13 radians/micrometer times the second refractive index, or 14 radians/micrometer times the second refractive index. In some embodiments, kout is 10 radians/micrometer times the sum of the second refractive index and 0.8, or 12 radians/micrometer times the sum of the second refractive index and 0.8, or 13 radians/micrometer times the sum of the second refractive index and 0.8, or 14 radians/micrometer times the sum of the second refractive index and 0.866, or 16 radians/micrometer times the sum of the second refractive index and 0.9. In some embodiments, kin is in a range of $2\pi$ radians/(700 nanometers) times the second refractive index to $2\pi$ radians/(400 nanometers) times the second refractive index. In some embodiments, kin is in a range of $2\pi$ radians/(600 nanometers) times the second refractive index to $2\pi$ radians/(500 nanometers) times the second refractive index. In some embodiments, kout is in a range of $2\pi$ radians/(700 nanometers) times the sum of the second refractive index and 0.8 to $2\pi$ radians/(400 nanometers) times the sum of the second refractive index and 0.9. In some embodiments, kout is in a range of $2\pi$ radians/(600 nanometers) times the sum of the second refractive index and 0.866 to $2\pi$ radians/(500 nanometers) times the sum of the second refractive index and 0.866. In some embodiments, the emissive OLED layer includes a plurality of colored subpixels having a shortest center wavelength $\lambda a$, a longest center wavelength, and an intermediate center wavelength as described further elsewhere herein. In some embodiments, kin is $1.6\pi$ n2/$\lambda a$ or $1.8\pi$ n2/$\lambda a$ or $2\pi$ n2/$\lambda a$ where n2 is the second refractive index. In some embodiments, kout is $2\pi$ (n2+0.866)/$\lambda a$ or $2\pi$ (n2+0.9)$\lambda$/a or $2.2\pi$ (n2+0.9)/$\lambda a$ or $2.2\pi$ (n2+1)/$\lambda a$. In some embodiments, kin is at least $1.6\pi$ n2/$\lambda a$ or at least $1.8\pi$ n2/$\lambda a$ or at least $2\pi$ n2/$\lambda a$, and kout is no more than $2.2\pi$ (n2+1)/$\lambda a$ or no more than $2.2\pi$ (n2+0.9)/$\lambda a$ or no more than $2.2\pi$ (n2+0.9)$\lambda a$ or no more than $2\pi$ (n2+0.9)/$\lambda a$. In some embodiments, kin is in a range of $1.8\pi$ n2/$\lambda a$ to $2\pi$ n2/$\lambda a$ and kout is in a range of $2\pi$ (n2+0.9)$\lambda a$ to $2.2\pi$ (n2+0.9)/$\lambda a$.

Any point in Fourier space away from the origin defines a wavevector from the origin to the point. The wavevector of light propagating in a medium is a unit vector in the propagation direction times the refractive index of the medium times $2\pi$ divided by the free-space wavelength of the light. The magnitude of a wavevector is referred to as a wavenumber. As used herein, wavevectors and wavenumbers are expressed in radians per unit length even if the radians are not explicitly stated. The PSD is a function of a two-dimensional wavevector and when the PSD is azimuthally symmetric, the PSD is a function of a wavenumber. The product of the PSD evaluated at a wavevector and the magnitude of the wavevector will be referred to herein as a wavenumber-PSD product which in general is a function of the wavevector and when the PSD is azimuthally symmetric, the wavenumber-PSD product is a function of the wavenumber.

When light with an incident wavevector is incident in a medium on a nanostructured interface having a displacement h(x,y) with a peak to peak amplitude that is small compared to the wavelength of the incident light in the medium and light with a transmitted wavevector is diffracted by the nanostructured interface, the diffracted power transmitted through the nanostructured interface is approximately proportional to the PSD evaluated at the difference between the horizontal components of the transmitted and incident wavevectors (e.g., the projection of the transmitted and incident wavevectors onto the x-y plane of FIG. 1). Light with an incident wavevector of magnitude $(2\pi/\lambda)(n2)$, where n2 is the refractive index of the second layer (e.g., layer 120) and $\lambda$ is a characteristic wavelength of light from the emissive OLED layer, can diffract into a direction normal to the display if the light is incident on the nanostructured interface at a high incidence angle (so that the horizontal projection of the incident wavevector has a magnitude of approximately $(2\pi/\lambda)(n2)$) with a transmitted diffracted power proportional to the PSD evaluated at $(2\pi/\lambda)(n2)$. Since it is often desired for the light output normal to the display to be substantially unaltered by the presence of the nanostructured interface, it may be desired for kin to be no less than $(2\pi/\lambda)(n2)$. As described further elsewhere herein, in some cases it may be desired that the nanostructured interface does not significantly alter the light output for view angles in air relative to the normal to the display less than a certain angle $\varphi$. In such cases, it may be desired for kin to be no less than $(2\pi/\lambda)(n2+\sin \varphi)$.

The PSD at wavenumbers between kin and kout provide a gradual increase in diffractive transmission for increasing view angles relative to the normal to the display since the area in Fourier space contributing to diffractive transmission gradually increases. It has been found that this gradual increase in diffractive transmission provides a gradual increase in color mixing which results in improved color uniformity. Light incident on the nanostructured interface with a wavevector having a horizontal component with a magnitude larger than $(2\pi/\lambda)(n2+\sin \theta)$ cannot diffract into a view angle less than $\theta$ degrees relative to the normal to the display. If $\theta$ is the maximum view angle (e.g., the half-angle of the view cone of the display which may be 60 degrees, for example), then the portion of the PSD with wavenumbers above $(2\pi/\lambda)(n2+\sin \theta)$ do not significantly contribute to diffractive transmission into the view cone of the display. Accordingly, in some embodiments, kout is no more than $(2\pi/\lambda)(n2+\sin \theta)$.

The characteristic wavelength $\lambda$ chosen to determine kin may be different from that chosen to determine kout. For example, the characteristic wavelength for determining kin may be based on the wavelengths of red emitters in the OLED display while the characteristic wavelength for determining kout may be based on the wavelengths of blue emitters in the OLED display. This may be done to ensure that the nanostructured interface provides the desired color mixing effect for all colors in the view cone of the display. In other embodiments, it may be advantageous for one color to be diffracted more than the other colors and the characteristic wavelength, may be taken to be the wavelength for that color in determining both kin and kout. In some embodiments, the characteristic wavelength, chosen to determine both kin and kout is the shortest center wavelength of the colored subpixels of an OLED display. In some embodiments, the nanostructured article may include different regions where each region is adapted or optimized for an emitter (subpixel) of an OLED display and the characteristic wavelength $\lambda$ for each region may be selected as the center wavelength of the corresponding emitter.

Figure 3A:
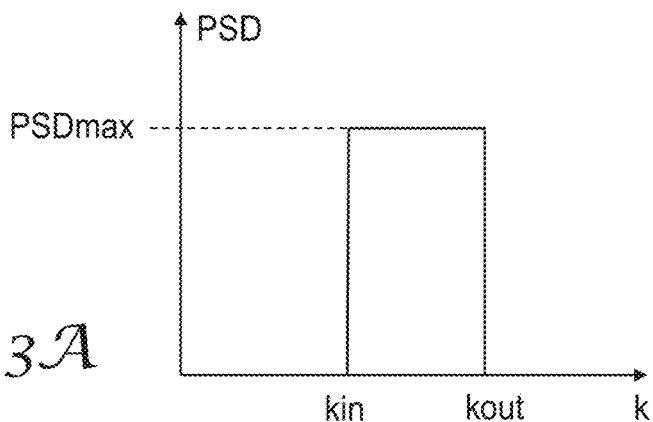
FIG. 3A is a schematic illustration of a PSD of a nanostructured surface as a function of wavenumber.
Figure 3B:
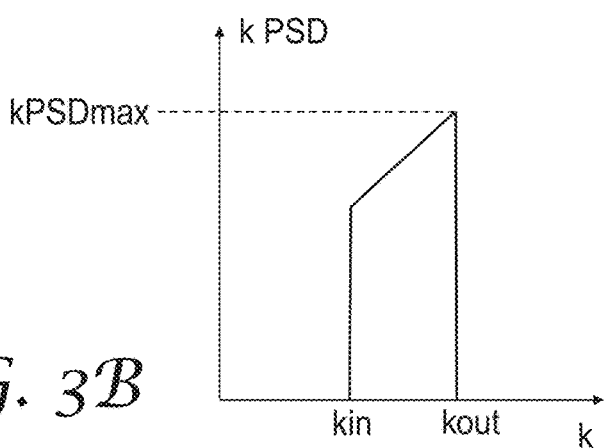
FIG. 3B is a schematic illustration of a wavenumber-PSD product of a nanostructured surface as a function of wavenumber.

FIG. 3A is an idealized schematic illustration of the PSD of a nanostructured interface or nanostructure surface as a function of wavenumber. In this idealized case, the PSD is non-zero only between kin and kout and it has a constant magnitude in this wavenumber range equal to the maximum value of PSDmax. In other cases, the PSD may not be zero for wavenumbers k less than kin, may not be constant for k between kin and kout, and may not be zero for k greater than kout. The diffracted power through the nanostructured interface is determined by a two-dimensional integral in Fourier space over an integrand proportional to the PSD. This two dimensional integral has a differential area element $d^2k$ which is given by k dk d$\varphi$ in polar coordinates with angular coordinate $\varphi$. Therefore, the diffracted power through the nanostructured interface is determined by an integral over wavenumber and angular coordinate of an integrand proportional the product of the wavenumber and the PSD evaluated at a wavevector having the magnitude of the wavenumber. This product is referred as the wavenumber-PSD product. FIG. 3B is an idealized schematic illustration of the wavenumber-PSD product (denoted kPSD) of a nanostructured interface as a function of the wavenumber. The wavenumber-PSD product kPSD has a maximum value of kPSDmax.

Figure 4A:
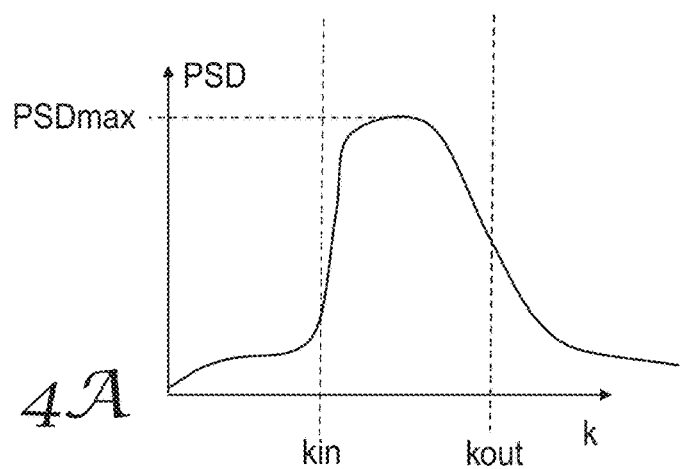
FIG. 4A is a schematic illustration of a PSD of a nanostructured surface as a function of wavenumber.
Figure 4B:
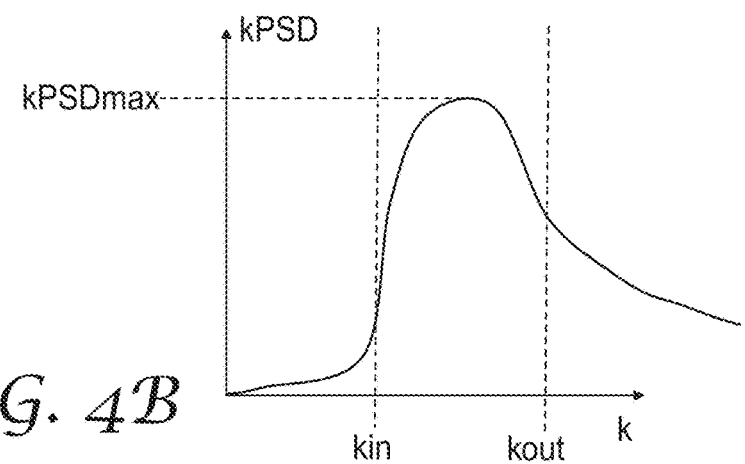
FIG. 4B is a schematic illustration of a wavenumber-PSD product of a nanostructured surface as a function of wavenumber.

FIG. 4A is a schematic illustration of the PSD of another nanostructured interface or nanostructured surface as a function of wavenumber. The PSD has a maximum, PSDmax, occurring for a wavenumber which is larger than kin and which is smaller than kout. In some embodiments, the wavenumbers kin and kout are taken to be points on either side of the maximum PSDmax where the PSD is 0.5, or 0.3, or 0.2, or 0.1 times its maximum value. In some embodiments, the wavenumbers kin and kout are taken to be points on either side of the maximum kPSDmax where the kPSD is 0.5, or 0.3, or 0.2, or 0.1 times its maximum value. FIG. 4B is a schematic illustration of the product of the wavenumber and the PSD of a nanostructured interface or nanostructured surface (the wavenumber-PSD product denoted kPSD) evaluated at the wavenumber as a function of the wavenumber. The wavenumber-PSD product kPSD has a maximum value of kPSDmax. In some embodiments, for all wavenumbers less than kin, the PSD is no more than 0.5 times PSDmax, or no more than 0.3 times PSDmax, or no more than 0.2 times PSDmax, or no more than 0.1 times PSDmax. In some embodiments, for all wavenumbers less than kin, the wavenumber-PSD product is no more than 0.3 times kPSDmax, or no more than 0.2 times kPSDmax, or no more than 0.1 times kPSDmax, or no more than 0.05 times kPSDmax. In some embodiments, the preceding ranges hold when the PSD and the wavenumber-PSD product are replaced with their respective annularly averaged values, which is described elsewhere herein, and when PSDmax is replaced with the maximum of the annularly averaged PSD and kPSDmax is replaced with the maximum of the annularly averaged wavenumber-PSD product.

In some embodiments, the two-dimensional integral in Fourier space over the annulus between kin and kout is between 0.8 and 1.0 times $(2\pi)^2$ times Var where Var is the variance of the displacement from the mean displacement of the nanostructured interface or nanostructured surface. In some embodiments, the two-dimensional integral in Fourier space over the area in the circle having a radius kin and over the region outside a circle having a radius of kout totals no more than 0.2 times $(2\pi)^2$ times Var.

In some embodiments, the PSD is concentrated between kin and kout, but there is substantial contribution (e.g., the PSD may be above 0.05 times PSDmax, or above 0.1 times PSDmax) from wavenumbers larger than kout. This can result from nanostructures having abrupt changes in height resulting in high wavenumber contributions to the PSD. It is believed that such long wavenumber contributions typically do not significantly affect the color output uniformity of an OLED display including the nanostructured surface.

An average of a quantity (e.g., PSD or wavevector-PSD product) over a region in Fourier space refers to the integral of the quantity over the region divided by the area of the region. An annular average of a PSD (or a wavenumber-PSD product) at a wavenumber is an average of the PSD (or the wavenumber-PSD) product over an annulus in Fourier space having an inner radius of 0.9 times the wavenumber and an outer radius of 1.1 times the wavenumber. In some embodiments, an annular average of the PSD has a maximum for a wavenumber larger than k1 times the second refractive index, and the PSD is no more than 0.1, or 0.2, or 0.3 times the maximum annular average for wavenumbers less than k1 times the second refractive index, for at least one k1 in a range of 6 to 9 radians/micrometer. In some embodiments, an annular average of the wavenumber-PSD product has a maximum for a wavenumber larger than k1 times the second refractive index, and the wavenumber-PSD product is no more than 0.1, or 0.2, or 0.3 times the maximum annular average for wavenumbers less than k1 times the second refractive index, for at least one k1 in a range of 6 to 9 radians/micrometer.

The wavenumbers kin and kout of FIGS. 3 and 4 may take any of the values described elsewhere herein in connection with FIG. 2.

Figure 5:
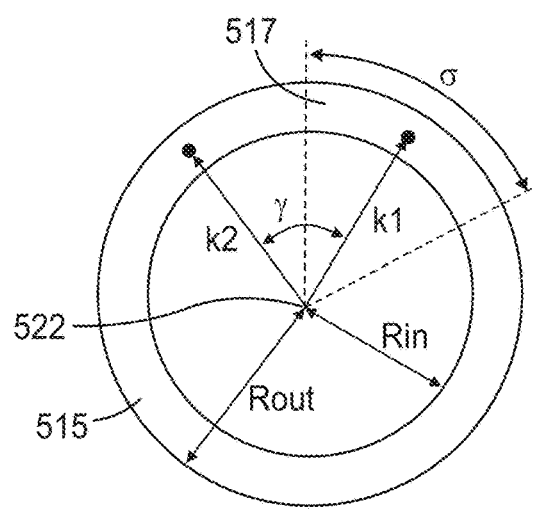
FIG. 5 illustrates an annular sector and an annulus in Fourier space.

FIG. 5 illustrates an annulus 515 including an annular sector 517 useful in describing substantial azimuthal symmetry. The annulus 515 and annular sector 517 are determined by a first wavevector k1 having a first magnitude k1. The annulus 515 is the region in Fourier space bounded by an inner radius Rin of 0.9 times the first magnitude k1 and an outer radius Rout of 1.1 times the first magnitude k1. The annulus 515 is centered on the zero wavenumber 522. The annular sector 517 is centered on the first wavevector k1 and has a subtended angle of σ. The annular sector is a portion of the annulus 515 extending an azimuthal angle of one half σ on either side of k1. As used herein, a power spectral density is substantially azimuthally symmetric if for any first wavevector k1 having a first magnitude k1 between 10 radians/micrometer times the second refractive index and 13 radians/micrometer times a sum of the second refractive index and 0.8, a maximum difference between a local average of the power spectral density at the first wavevector k1 is between 0.67 and 1.33 times the annular average of the power spectral density at the first wavevector k1, where the local average is an average of the power spectral density over an annular sector 517 in Fourier space centered on the first wavevector k1 and having an inner radius Rin of 0.9 times the first magnitude, an outer radius Rout of 1.1 times the first magnitude k1, and a subtended angle of σ, where the annular average is an average of the power spectral density over an annulus 515 in Fourier space having an inner radius Rin of 0.9 times the first magnitude k1 and an outer radius Rout of 1.1 times the first magnitude k1, and where a is equal to 60 degrees.

In some embodiments, for any first wavevector k1 having a first magnitude k1 between 10 radians/micrometer times the second refractive index and 13 radians/micrometer times a sum of the second refractive index and 0.8, the maximum difference between the local average of the power spectral density at the first wavevector k1 is between 0.7 and 1.3 times, or between 0.8 and 1.2 times, or between 0.9 and 1.1 times the annular average of the power spectral density at the first wavevector k1.

In some embodiments, the PSD is still substantially azimuthally symmetric when a smaller annular sector is used in determining whether the PSD is substantially azimuthally symmetric. For example, in some embodiments, the PSD is substantially azimuthally symmetric when the subtended angle σ is equal to 30 degrees.

The range between 10 radians/micrometer times the second refractive index and 13 radians/micrometer times a sum of the second refractive index and 0.8 is used in defining substantially azimuthal symmetry since it has been found that the resulting color uniformity provided by the nanostructure interface is typically more sensitive to this range than other ranges. The PSD may also be approximately azimuthally symmetric within a broader wavenumber range. In some embodiments, for any first wavevector k1 having a first magnitude k1 between 6 radians/micrometer times the second refractive index, or 8 radians/micrometer times the second refractive index, or 10 radians/micrometer times the second refractive index and 13 radians/micrometer times a sum of the second refractive index and 0.8, or 14 radians/micrometer times a sum of the second refractive index and 0.9, a maximum difference between a local average of the power spectral density at the first wavevector k1 is between 0.7 and 1.3, or between 0.8 and 1.2, times the annular average of the power spectral density at the first wavevector k1, where the local average is an average of the power spectral density over an annular sector 517 in Fourier space centered on the first wavevector k1 and having an inner radius Rin of 0.9 times the first magnitude, an outer radius Rout of 1.1 times the first magnitude k1, and a subtended angle of σ, where the annular average is an average of the power spectral density over an annulus 515 in Fourier space having an inner radius Rin of 0.9 times the first magnitude k1 and an outer radius Rout of 1.1 times the first magnitude k1, and where a is equal to 60 degrees or equal to 30 degrees.

The PSD may have some degree of azimuthal variability and still be considered substantially azimuthally symmetric. In some embodiments, a substantially azimuthally symmetric PSD has an n-fold symmetry axis. This means that the PSD has the same value for any two wavevectors having a common magnitude that separated by an angle of 360 degrees divided by n. For example, the wavevectors k1 and k2 of FIG. 5 have a same magnitude k1 and are separated by an angle γ. If a PSD has a common value at any two such pairs of wavevectors and if γ is 360 degrees divided by n, the PSD may be described as having an n-fold symmetry. In some embodiments, a substantially azimuthally symmetric power spectral density has at least a 6-fold rotation symmetry.

Figure 6:
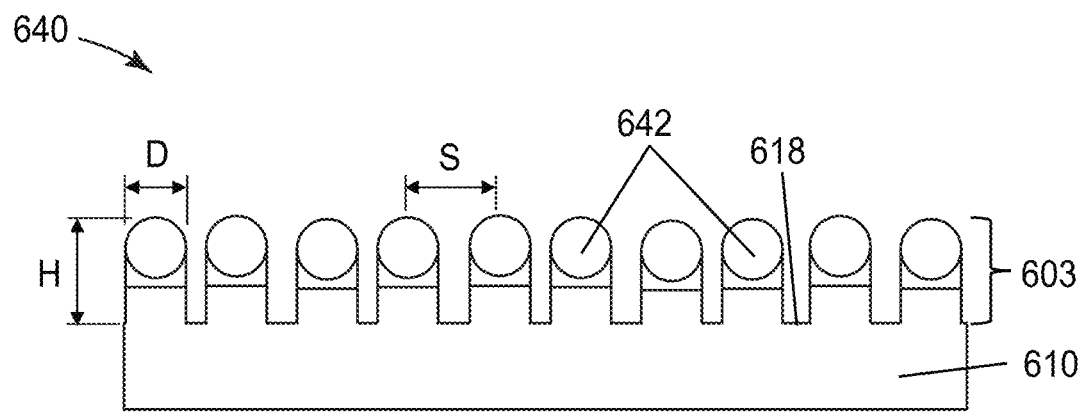
FIG. 6 is a cross-sectional view of a tool for making a nanostructured surface.

Nanostructured surfaces or nanostructured interfaces having the power spectral densities described elsewhere herein can be made using a tool having a nanostructured surface. FIG. 6 is a schematic illustration of a tool 640 for making a nanostructured interface. Tool 640 includes a layer 610 including a plurality of pillars 603 disposed on a base 618 of the layer 610. The pillars 603 have particles 642 in an upper portion of the pillars 604. The tool 640 can be made as described further elsewhere herein and may correspond to first layer 1210 of nanostructured article 1201, for example. The nanostructured surface of the tool can be characterized by atomic force microscopy (AFM) and this can be used to determine the PSD of the surface via fast Fourier transform, for example. In brief summary, tool 640 can be made by dispersing particles 642 in a polymeric precursor matrix to form a layer. The layer is then dried or cured. This can be done by applying heat to evaporate a solvent or applying actinic radiation to cure the layer. In some cases, the layer is heated to remove solvent and then actinic radiation is applied to cure the layer. The layer can then be etched (e.g., reactive ion etched) to form the tool 640. The tool 640 can then be used to form a nanostructured surface in a first layer which can then be backfilled and/or sealed to form a nanostructured article having a nanostructured interface. The nanostructured surface can be formed in a continuous cast and cure process where a resin is cast against the tool 640 and cured, for example, with actinic (e.g., ultraviolet) radiation or heat. Examples of continuous cast and cure processes are described in the following patents, all of which are hereby incorporated herein by reference to the extent that they do not contradict the present description: U.S. Pat. Nos. 4,374,077; 4,576,850; 5,175,030; 5,271,968; 5,558,740; and 5,995,690. In alternative embodiments, the tool 640 is used as a nanostructured layer in a nanostructured article, as described further elsewhere herein, instead of as a tool to make such a layer.

The tool 640 or any of the nanostructured first layers formed using a nanoparticle mask described elsewhere herein such as the first layer 1210, for example, has or produces a nanostructured surface having an average spacing S. The particles 642 or 1242 are typically randomly agglomerated and so the particles 642 or 1242 are typically not on a periodic lattice. The average spacing of a nanostructured interface or nanostructured surface can be defined as an average peak to peak nearest neighbor distance, which in the case of the tool 640 or first layer 1210 corresponds to an average center to center distance between neighboring particles. The particles have an average size D and the pillars have and average height H above the base 618 of the layer 610 or above the base surface 1218 of the first layer 1210. In the case of monodispersed spherical particles, the average size D is the diameter of the particles. In other cases, the average size D is determined from the average volume $V_a$ of the particles (unweighted arithmetic average over the particles used in forming the nanostructured interface) as $D=(6 V_a/\lambda)^{1/3}$.

Utilizing a sufficiently high loading of particles in the layer results in a substantially azimuthally symmetric PSD for the nanostructured interface or nanostructured surface since the particles randomly agglomerate in an approximately azimuthally symmetric way. The size of the particles, D, and the loading of the particles, or the resulting average center to center spacing, S, of the particles, can be selected to determine the wavenumbers kin and kout illustrated in FIGS. 4 and 5. Typically, choosing a high loading of the particles will result in a PSD substantially azimuthally symmetric and localized in a thin region in Fourier space (kout not much greater than kin). A high loading means that when the tool 640 or the first layer 1210 is formed the particles 642 or 1242 are nearly closely packed in a layer. Reducing the particle loading increases S and moves the wavenumber kin to smaller values. Generally, the wavenumber kout is inversely proportional to the size D of the particles and the wavenumber kin is inversely proportional to the spacing S between particles. Thus, by selecting the length scales D and S for the tool 640 or the first layer 1210, a nanostructured surface can be made that has a substantially azimuthally symmetric PSD that is concentrated between kin and kout as in FIG. 4, for example.

In some embodiments, a nanostructured surface includes pillars which give high wavenumber contributions to the resulting PSD. These high wavenumber contributions are believed to not significantly affect the color uniformity performance of the OLED displays incorporating the resulting nanostructured interfaces. The height of the pillars can be controlled by the etching process. Reducing the heights reduce the high wavenumber contribution to the PSD and so decreases the PSD for wavenumbers greater than kout. Increasing the heights increase the overall scale of the PSD since the two-dimensional integral of the PSD in Fourier space is given by $(2\pi)^2$ times Var where Var is the variance of the displacement from the mean displacement of the nanostructured surface. Increasing the overall scale of the PSD is generally desired since this allows a stronger diffraction strength for a given index contrast across the resulting nanostructured interface or allows the refractive index contrast to be reduced for a given diffraction strength. Thus, is typically preferred that the pillars have an aspect ratio (average height divided by average lateral dimension) greater than 1, or greater than 1.1, or greater than 1.5. If the aspect ratio is too large, the nanostructured surface may be more difficult to backfill and the large wavenumber contribution to the PSD may be undesirably large. Thus, in some embodiments, the aspect ratio is less than 5.0, or less than 4.0, or less than 3.0.

Figure 7:
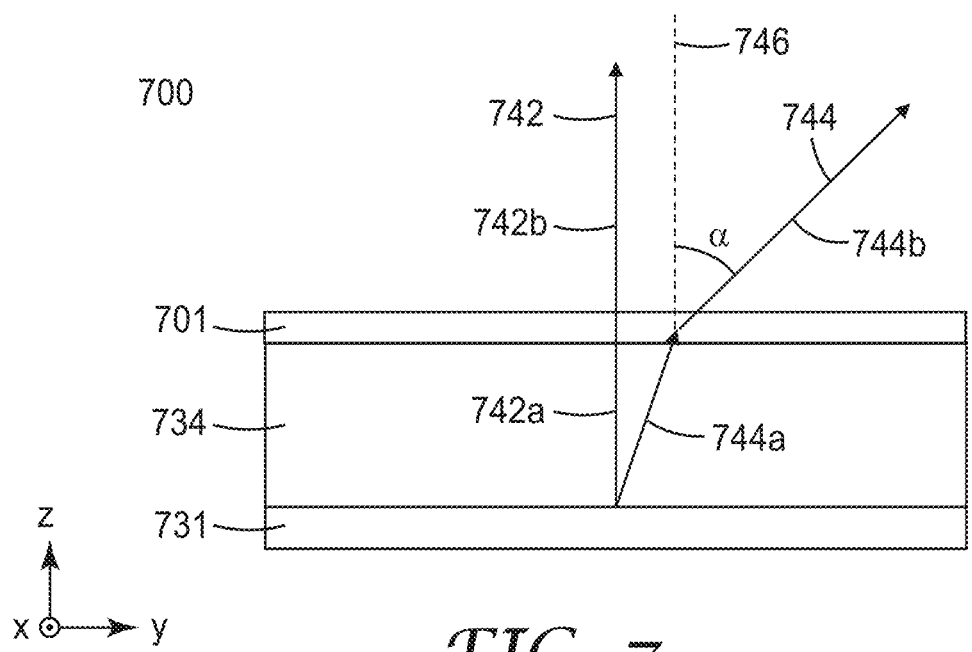
FIG. 7 is a cross-sectional view of an OLED display.

FIG. 7 is a cross-sectional view of an OLED display 700 including a nanostructured article 701 having a nanostructured interface (as illustrated in FIG. 1), an OLED stack 731 including an emissive OLED layer (as illustrated in FIG. 1), and an interior layer 734 which may be an encapsulant layer for the OLED stack 731. Nanostructured article 701 may include additional layers such as a circular polarizer and a touch sensitive layer, for example. FIG. 7 illustrates a first light output 742 at a view angle of zero degrees relative to a normal 746 to the display 700 and a second light output 744 at a view angle of a relative to the normal 746. The view angle α may be 45 degrees and the display may be fully on when various colors and color differences are specified. As used herein, unless specified differently, the view angle refers to the view angle relative to the normal to the display as observed in air external to the display. The first light output 742 has a first color 742a in the interior layer 734 and a second color 742b exterior to the display 700. In some embodiments, the first and second colors 742a and 742b are the same color since the nanostructured article is configured to not alter the light output at a view angle normal to the display. The second light output 744 has a third color 744a in the interior layer 734 and a fourth color 744b exterior to the display 700.

The first and third colors 742a and 744a have a first chromaticity distance therebetween and the second and fourth colors 742b and 744b have a second chromaticity distance therebetween. As used herein, chromaticity distance refers to the Euclidean distance between two points in the CIE (Commission Internationale de l'Eclairage) 1976 UCS (Uniform Chromaticity Scale) chromaticity diagram. For example, if a first color has CIE 1976 UCS color coordinates $(u'_1, v'_1)$ and a different second color has CIE 1976 UCS color coordinates $(u'_2, v'_2)$, the chromaticity distance between the two colors is given by the positive square root of $(\Delta u'v')^2 = (u'_2 - u'_1)^2 + (v'_2 - v'_1)^2$.

In some embodiments, the nanostructured interface of the nanostructured article 701 is configured such that the second chromaticity distance is less than 0.75 times, or less than 0.6 times, or less than 0.5 times the first chromaticity distance. As discussed further elsewhere herein, this can be accomplished by choosing kin referring to FIGS. 3 and 4, sufficiently large so that the first light 742 is not diffracted by the nanostructured interface and choosing the PSD in the region between kin and kout to be approximately uniform so that light propagating in a range of directions in the interior layer 734 can be diffracted into the view angle α. In strong cavity OLEDs, for example, the color in the interior layer 734 varies significantly with propagation direction and diffracting light from a range of propagation directions, and therefore a range of colors, from the interior layer 734 into the view direction specified by the angle α results in an averaged color at the view angle α. This effect results in reduced color variation with view angle. In some embodiments, the nanostructured interface is configured to provide diffractive transmission for light from the emissive OLED layer in at least some view directions at an angle α greater than 10 degrees, or greater than 20 degrees, or greater than 30 degrees to normal.

FIG. 8A-8B are schematic CIE 1976 UCS u'v' plots showing the variation of the color output of OLED displays with view angle. FIG. 8A shows the color output of a display not including a nanostructured interface and FIG. 8B shows the color output of the same display when a nanostructured article having a nanostructured interface is disposed on the display. Points corresponding to view angles in air of 0, 45 and 60 degrees are shown on both plots. The color shift with view angle is substantially reduced when the nanostructured interface is included. In some cases, it may be desired to choose the nanostructured interface so that light within some cone angle is transmitted through the nanostructured interface without diffraction. This cone angle may be described as the highest view angle of the emissive OLED layer where it is desired to preserve a light output of the emissive OLED layer without color correction. This angle is denoted by φ in FIG. 8A. For example, a chromaticity shift of 0.005 may be the largest acceptable color shift and this angle may be in the range from zero degrees to 10 degrees, or to 20 degrees, for example.

It is typically desired that the nanostructured interface has an average spacing between nearest neighbor peaks smaller than the pixel spacing of the OLED display. In some embodiments, the nanostructured interface has an average spacing between nearest neighbor peaks in a range of 100 nm to 350 nm, or in a range of 150 nm to 250 nm.

FIG. 9 is a schematic illustration of a pixelated OLED display 900 including a plurality of pixels 945. Each of the pixels 945 typically includes a plurality of subpixels which allow a desired color to be produce by each pixel 945. For example, the illustrated subpixels 945a, 945b and 945c may be blue, green and red subpixels which can have output levels adjustable to provide a desired color and a desired intensity. The pixels 945 have an average pixel spacing P. In some embodiments, the OLED display 900 has an average pixel spacing P and the nanostructured interface has an average spacing between nearest neighbor peaks less than 0.2 times, or than 0.1 times, or less than 0.05 times the average pixel spacing P.

The length scales associated with the tool used to make the nanostructured interface (such as the particle size D and the average spacing S described elsewhere herein) can be selected based, at least in part, on the colors produced by the subpixels of the OLED display.

Figure 10:
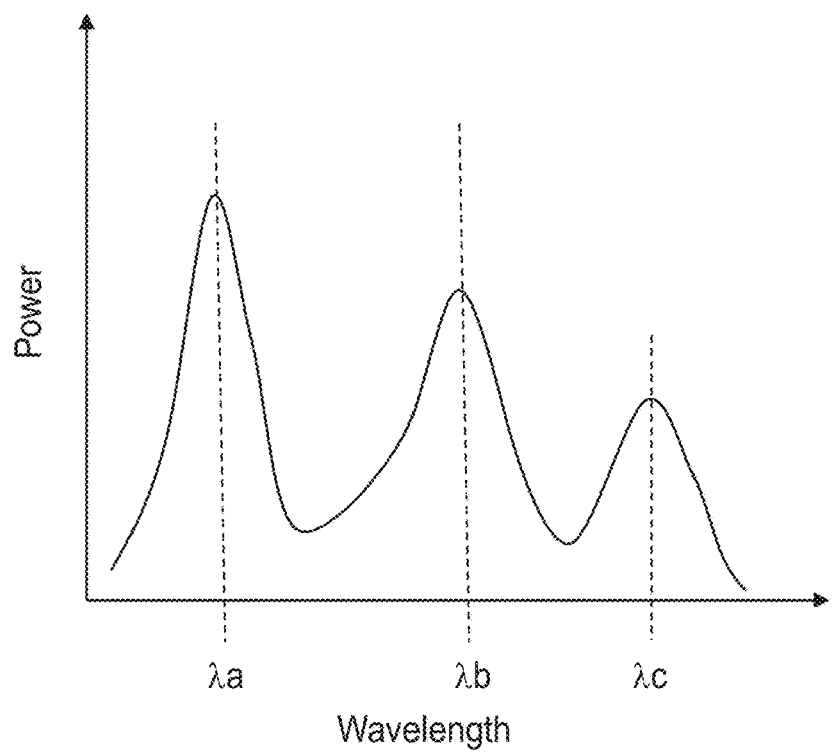
FIG. 10 is a plot of the on-axis spectrum produced by an OLED display.

FIG. 10 is a plot of a spectrum produced by an OLED display as viewed normal (zero view angle) to the display. Three peaks are present corresponding to colors of the subpixels 945a, 945b and 945c. The shortest center wavelength is denoted λa, the longest center wavelength is denoted λc, and an intermediate center wavelength is denoted λb. In some embodiments, at least one of these wavelengths is used in determining a suitable wavenumber kin depicted in FIGS. 3 and 4. In some embodiments, kin is determined as follows: (i) Determine a characteristic wavelength λ of the OLED display. In some embodiments, this wavelength is selected to be the intermediate center wavelength λb at zero view angle of the emissive OLED layer. In some embodiments, this wavelength is selected to be the shortest center wavelength λa at zero view angle of the emissive OLED layer. In other embodiments, a wavelength between the shortest center wavelength λa and the intermediate center wavelength λb is used as the characteristic wavelength λ. The center wavelengths can be determined by measuring the light output of the display at zero view angle or the center wavelengths may be provided by the OLED manufacturer. (ii) Determine a highest view angle, φ, of the emissive OLED layer where it is desired to preserve a light output of the emissive OLED layer without color correction. This can be done by measuring the color spectrum as in FIG. 8A and determining the view angle where the color shift starts to become unacceptable. The largest color shift that is deemed to be unacceptable may depend on the application (e.g., it may be different for hand-held (e.g., cell phones) and television displays). Once a largest acceptable color shift is specified (e.g., a CIE 1976 UCS chromaticity distance of 0.005), the angle q can be determined from the chromaticity plot as in FIG. 8A. In some embodiments, substantially no color shift is deemed to be acceptable and the angle q is zero. (iii) Determine a length scale, L, as the characteristic wavelength, $\lambda$, divided by a sum of the second refractive index, n2, and a sine of the highest view angle ($L=\lambda/(n2+\sin(\varphi p))$). The wavenumber corresponding to kin is then $2\pi/L$.

In some embodiments, a wavenumber corresponding to kout, is also determined prior to forming the nanostructured interface. This can be determined as follows: (i) Determine a half-angle $\theta$ of the view cone of the display. This can be determined as a manufactured specification or simple as a specified maximum view angle of interest for a particular display application. (ii) Determine the shortest center wavelength $\lambda a$ at zero view angle of the emissive OLED layer. This can be done by measuring the light output of the display at zero view angle or the shortest center wavelength $\lambda a$ may be provided by the manufacturer of the emissive OLED layer. In other embodiments, one of the other center wavelengths $\lambda b$ or $\lambda c$ is determined and used in determining kout. In some embodiments, the characteristic wavelength used in determining kin is also used in determining kout (iii) Determining a second length scale, L2, as the center wavelength, $\lambda a$, divided by a sum of the second refractive index, n2, and a sine of the half-angle $\theta$ ($L2=\lambda a/(n2+\sin(\theta))$). In other embodiments, the characteristic wavelength used in determining kin is used in determining the second length scale L2, or one of the other center wavelengths $\lambda b$ or $\lambda c$ may be used in determining the second length scale L2, or some other wavelength between $\lambda a$ and $\lambda c$ may be used. The wavenumber corresponding to kout is then $2\pi/(L2)$.

After the length scale L, and optionally the second length scale L2 are determined, a nanostructured interface having a substantially azimuthally symmetric power spectral density is formed such that an integral of the power spectral density of the nanostructured interface over an area contained in and bounded by a circle in Fourier space centered at zero wavenumber and having a radius of 6 radians divided by the length scale L is no more than 4 times a variance in displacement from a mean displacement of the nanostructured interface. The nanostructured interface can be formed using a tool and a cast and cure process as described further elsewhere herein. In some embodiments, the power spectral density has a maximum for a wavenumber larger than 6 radians divided by the length scale L and the power spectral density is no more than 0.3 times, or 0.2 times, or 0.1 times the maximum for wavenumbers less than 6 radians divided by the length scale L. In some embodiments, a wavenumber-PSD product has a maximum for a wavenumber larger than 6 radians/micrometer times the second refractive index, and for all wavenumbers less than 6 radians/micrometer times the second refractive index, the wavenumber-PSD product is no more than 0.3 times the maximum, or no more than 0.2 times the maximum, or no more than 0.1 times the maximum. In some embodiments, the maximum in the power spectral density occurs at a wavenumber larger than $2\pi$ divided by the length scale L and the power spectral density is no more than 0.3 times, or no more than 0.3 times, or no more than 0.1 times the maximum for wavenumbers less than $2\pi$ divided by the length scale L. In some embodiments, an integral of the power spectral density over a two-dimensional annulus in Fourier space is between 0.8 and 1.0 times $(2\pi)^2$ times a variance in displacement from a mean displacement of the nanostructured interface. In some embodiments, the annulus has an inner wavenumber of 9 radians/micrometer times the second refractive index and an outer wavenumber of 16 radians/micrometer times the sum of the second refractive index and 0.9. In some embodiments, the annulus has an inner wavelength of kin and an outer wavelength of kout where kin and kout can take any of the values described elsewhere herein (e.g., kin may be in a range of $1.8\pi$ n2/$\lambda a$ to $2\pi$ n2/$\lambda a$ and kout may be in a range of $2\pi$ (n2+0.9)$\lambda$/a to $2.2\pi$ (n2+0.9)/$\lambda a$).

In some embodiments, the nanostructured article includes a plurality of regions where each region is adapted to be disposed over a particular emission color. In such embodiments, the length scales L and optionally L2 for each region may be selected using the center wavelength corresponding to the emission color of that region.

Figure 11:
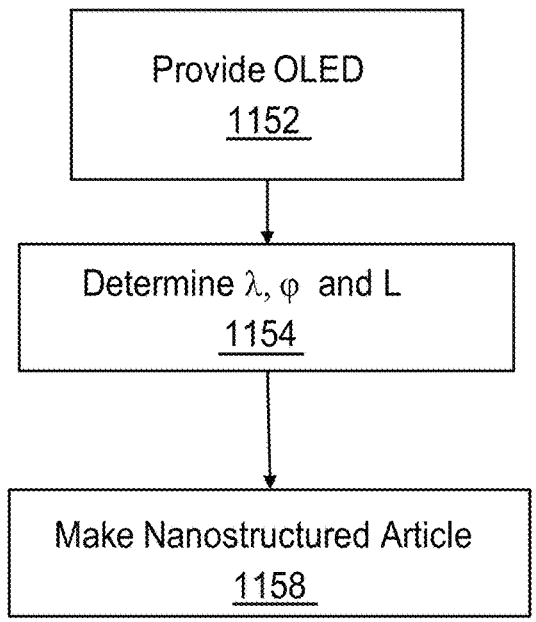
FIG. 11 is a flow chart illustrating a method of reducing variation of color with view angle in an OLED display.

FIG. 11 is a flow chart summarizing a method of reducing variation of color with view angle in an OLED display. In step 1152, an encapsulated emissive OLED layer is provided. In step 1154, the characteristic center wavelength $\lambda$ the highest view angle c without color correction, and the length scale L are determined as described elsewhere herein. In some embodiments, the shortest center wavelength $\lambda a$, the half-angle $\theta$, and the second length scale L2 are also determined. In step 1158, a nanostructured article is made. This can be done by using a mask comprising a monolayer of nanoparticles in a binder as described elsewhere herein to make a nanostructured layer that can either be used as a tool to make another nanostructured layer by casting and curing a first layer against the tool to form a nanostructured surface, or the nanostructured layer can be used directly as a layer in the nanostructured article having a nanostructured surface. The parameters L, $\lambda$, $\varphi$, and optionally L2 and $\theta$, can be used in determining the particle size and loading in making the mask. The nanostructured surface can be backfilled with a backfill material to form the nanostructured article. The nanostructured article can then be used to reduce color variation in the OLED display by disposing the nanostructured article on the encapsulated emissive OLED layer. In some embodiments, the nanostructured article is laminated to the encapsulated emissive OLED layer through an optically clear adhesive, for example.

Other nanostructures suitable for use in an OLED display are described in U.S. Pat. Appl. No. 62/342,620 filed on May 27, 2016 and hereby incorporated herein by reference to the extent that it does not contradict the present description.
Matrix and Nanoparticles As described further elsewhere herein, a mask comprising nanoparticles dispersed in a binder, which can be a polymeric precursor matrix, can be used to make a nanostructured surface having a plurality of pillars and having a PSD as described elsewhere herein. The matrix (the continuous phase or the binder) of the materials described herein comprising the nanoparticles dispersed in the polymeric precursor matrix, can comprise, for example, polymeric material, liquid resins, inorganic material, or alloys or solid solutions (including miscible polymers). The matrix may comprise, for example, cross-linked material (e.g., cross-linked material was made by cross-linking at least one of cross-linkable materials multi(meth)acrylate, polyester, epoxy, fluoropolymer, urethane, or siloxane (which includes blends or copolymers thereof)) or thermoplastic material (e.g., at least one of polycarbonate, poly(meth)acrylate, polyester, nylon, siloxane, fluoropolymer, urethane, cyclic olefin copolymer, triacetate cellulose, or diacrylate cellulose (which includes blends or copolymers thereof)). In some embodiments, the polymeric precursor matrix comprises at least one of tetrafluoroethylene, vinylfluoride, vinylidene fluoride, chlorotrifluoroethylene, perfluoroakoxy, fluorinated ethylene-propylene, etlhylenetetrafluoroethylene, ethylenechlorotrifluoroethylene, perfluoropolyether, perfluoropolyoxetane, hexafluoropropylene oxide, siloxane, organosilicon, siloxides, silyl halides, ethylene oxide, propylene oxide, hydroxyl, hydroxylamine, catboxylic acid. —COONa, —SO$_3$Na, —CONHCH$_3$, —CON(CH$_2$CH$_3$)$_2$, acrylamide, amine, ether, sulfonate, acrylic acid, maleic anhydride, vinyl acid, vinyl alcohol, vinylpyridine, vinylpyrrolidone, acetylene, pyrrole, thiophene, aniline, phenylene sulfide, or imidazole.)

Useful polymeric materials include thermoplastics and thermosetting resins. Suitable thermoplastics include polyethylene terephthalate (PET), polystyrene, acrylonitrile butadiene styrene, polyvinyl chloride, polyvinylidene chloride, polycarbonate, polyacrylates, thermoplastic polyurethanes, polyvinyl acetate, polyamide, polyimide, polypropylene, polyester, polyethylene, poly(methyl methacrylate), poly(ethylene naphthalate), styrene acrylonitrile, silicone-polyoxamide polymers, triacetate cellulose, fluoropolymers, cyclic olefin copolymers, and thermoplastic elastomers.

Suitable thermosetting resins include allyl resin (including (meth)acrylates, polyester acrylates, urethane acrylates, epoxy acrylates and polyether acrylates), epoxies, thermosetting polyurethanes, and silicones or polysiloxanes. These resins can be formed from the reaction product of polymerizable compositions comprising the corresponding monomers or oligomers.

In some exemplary embodiments, the polymerizable compositions include at least one monomeric or oligomeric (meth)acrylate, preferably a urethane (meth)acrylate. Typically, the monomeric or oligomeric (meth)acrylate is multi (meth)acrylate. The term "(meth)acrylate" is used to designate esters of acrylic and methacrylic acids, and "multi (meth)acrylate" designates a molecule containing more than one (meth)acrylate group, as opposed to "poly(meth)acrylate" which commonly designates (meth)acrylate polymers. Most often, the multi(meth)acrylate is a di(meth)acrylate, but it is also contemplated, for example, to employ tri(meth) acrylates and tetra(meth)acrylates.

Suitable monomeric or oligomeric (meth)acrylates include alkyl (meth)acrylates, (e.g., methyl (meth)acrylate, ethyl (meth)acrylate, 1-propyl (meth)acrylate, and t-butyl (meth)acrylate). The acrylates may include (fluoro)alkylester monomers of (meth)acrylate acid, the monomers being partially or fully fluorinated (e.g., trifluoroethyl (meth)acrylate).

Examples of commercially available multi(meth)acrylate resins include those from Mitsubishi Rayon Co., Ltd., Tokyo, Japan, under the trade designation "DIABEAM"; from Nagase & Company, Ltd., New York, N.Y., under the trade designation "DINACOL". Shin-Nakamura Chemical Co., Ltd., Wakayama, Japan, under the trade designation "NK ESTER"; Dainippon Ink & Chemicals, Inc. Tokyo, Japan, under the trade designation "UNIDIC; Toagosei Co., Ltd., Tokyo, Japan, under the trade designation "ARONIX"; NOF Corp., White Plains, N.Y. under the trade designation "BLENMER"; Nippon Kayaku Co., Ltd., Tokyo, Japan, under the trade designation "KAYARAD"; and Kyoeisha Chemical Co., Ltd., Osaka, Japan, under the trade designations "LIGHT ESTER" and "LIGHT ACRYLATE".

Oligomeric urethane multi(meth)acrylates are commercially available, for example, from Sartomer Americas, Exton, Pa., under the trade designation "PHOTOMER 6000 Series" (e.g., "PHOTOMER 6010" and "PHOTOMER 6020") and "CN 900 Series" (e.g., "CN966B85", "CN964", and "CN972"). Oligomeric urethane (meth)acrylates are also available, for example, from Cytec Industries Inc., Woodland Park, N.J., under the trade designations "EBECRYL 8402", "EBECRYL 8807," and "EBECRYL 4827". Oligomeric urethane (meth)acrylates may also be prepared by the initial reaction of an alkylene or aromatic diisocyanate of the formula OCN—R$_3$—NCO with a polyol. Typically, the polyol is a diol of the formula HO—R$_4$—OH where R$_3$ is a C2-C100 alkylene or an arylene group and R$_4$ is a C2-C100 alkylene group. The intermediate product is then a urethane diol diisocyanate, which subsequently can undergo reaction with a hydroxyalkyl (meth)acrylate. Suitable diisocyanates include 2,2,4-trimethylhexylene diisocyanate and toluene diisocyanate. Alkylene diisocyanates are generally preferred. A particularly preferred compound of this type may be prepared from 2,2,4-trimethylhexylene diisocyanate, poly(caprolactone)diol and 2-hydroxyethyl methacrylate. In at least some cases, the urethane (meth)acrylate is preferably aliphatic.

The polymerizable compositions can be mixtures of various monomers or oligomers, having the same or differing reactive functional groups. Polymerizable compositions comprising at least two different functional groups may be used, including (meth)acrylate, epoxy and urethane. The differing functionality may be contained in different monomeric or oligomeric moieties or in the same monomeric or oligomeric moiety. For example, a resin composition may comprise an acrylic or urethane resin having an epoxy group or a hydroxyl group in the side chain, a compound having an amino group and, optionally, a silane compound having an epoxy group or amino group in the molecule.

The thermosetting resin compositions are polymerizable using conventional techniques such as thermal cure, photo-cure (cure by actinic radiation), or e-beam cure. In one embodiment, the resin is photopolymerized by exposing it to ultraviolet (UV) or visible light. Conventional curatives or catalysts may be used in the polymerizable compositions and are selected based on the functional group(s) in the composition. Multiple curatives or catalysts may be needed if multiple cure functionality is being used. Combining one or more cure techniques, such as thermal cure, photocure, and e-beam cure, is within the scope of the present disclosure.

Furthermore, the polymerizable resins can be compositions comprising at least one other monomer or oligomer (i.e., other than those described above, namely the monomeric or oligomeric (meth)acrylate and the oligomeric urethane (meth)acrylate). This other monomer may reduce viscosity and/or improve thermomechanical properties and/ or increase refractive index. Monomers having these properties include acrylic monomers (i.e., acrylate and methacrylate esters, acrylamides, and methacrylamides), styrene monomers, and ethylenically unsaturated nitrogen heterocycles.

(Meth)acrylate esters having other functionalities are also useful. Exemplary compounds of this type include 2-(N-butylcarbamyl)ethyl (meth)acrylates, 2,4-dichlorophenyl acrylate, 2,4,6-tribromophenyl acrylate, tribromophenoxylethyl acrylate, t-butylphenyl acrylate, phenyl acrylate, phenyl thioacrylate, phenylthioethyl acrylate, alkoxylated phenyl acrylate, isobornyl acrylate, and phenoxyethyl acrylate. The reaction product of tetrabromobisphenol A di-epoxide and (meth)acrylic acid is also useful.

Other exemplary monomers include a polyol multi(meth) acrylate. Such compounds are typically prepared from aliphatic diols, triols, and/or tetraols containing 2-10 carbon atoms. Examples of suitable poly(meth)acrylates are ethylene glycol diacrylate, 1,6-hexanediol diacrylate, 2-ethyl-2-hydroxymethyl-1,3-propanediol triacrylate (trimethylolpropane triacrylate), di(trimethylolpropane) tetraacrylate, pentaerythritol tetraacrylate, the corresponding methacrylates and the (meth)acrylates of alkoxylated (usually ethoxylated) derivatives of said polyols. Monomers having at least two ethylenically unsaturated groups can serve as a crosslinker.

Styrenic compounds suitable for use as the other monomer include styrene, dichlorostyrene, 2,4,6-trichlorostyrene, 2,4,6-tribromostyrene, 4-methylstyrene, and 4-phenoxystyrene. Ethylenically unsaturated nitrogen heterocycles (e.g., N-vinylpyrrolidone and vinylpyridine) are also useful.

Constituent proportions in the radiation curable materials can vary. In general, the organic component can comprise about 30-100% monomeric or oligomeric (meth)acrylate or oligomeric urethane multi(meth)acrylate, with any balance being the other monomer or oligomer.

Surface leveling agents may be added to the matrix. The leveling agent is preferably used for smoothing the matrix resin. Examples include silicone-leveling agents, acrylic-leveling agents and fluorine-containing-leveling agents. In one embodiment, the silicone-leveling agent includes a polydimethyl siloxane backbone to which polyoxyalkylene groups are added.

Optionally, in some embodiments, the polymeric matrix may comprise particles (in addition to the nanoparticle of the etch mask) less than 100 nm, or less than 50 nm, in size such as metal oxides (e.g., $SiO_2$, $ZO_2$, $TiO_2$, ZnO, magnesium silicate, indium tin oxide, and antimony tin oxide). Addition of metal oxides has been observed to enhance the mechanical durability of the polymeric matrix (e.g., abrasion resistance).

The polymeric matrix can be made from functionalized polymeric materials such as weatherable polymeric materials, hydrophobic polymeric materials, hydrophilic polymeric materials, antistatic polymeric materials, antistaining polymeric materials, conductive polymeric materials for electromagnetic shielding, antimicrobial polymeric materials, or antiwearing polymeric materials. Examples of weatherable polymeric materials include the crosslinkable acrylic modified fluoropolymers based on vinylidene fluoride polymers (see, e.g., U.S. Pat. Appl. Pub. No. U.S. Pat. No. 6,680,357B2 (Hedhli et al)), the crosslinkable fluoropolymers (see, e.g., U.S. Pat. Appl. Pub. No. US20100093878A1 (Yang et al)), and crosslinkable fluoropolymer available, for example, under the trade designation "LUMIFLON" from Asahi Glass Co., Tokyo, Japan. Functional hydrophilic or antistatic polymeric matrix comprises the hydrophilic acrylates such as hydroxyethyl methacrylate (HEMA), hydroxyethyl acrylate (HEA), poly(ethylene glycol) acrylates (PEGA) with different PEG molecular weights, and other hydrophilic acrylates (e.g., 3-hydroxy propyl acrylate, 3-hydroxy propyl methacrylate, 2-hydroxy-3-methacryloxy propyl acrylate and 2-hydroxy-3-acryloxy propyl acrylate). Other functional polymeric matrices include semiconducting conjugative polymers such as poly(acrylene ethylene) and its derivatives, stimuli-responsive polymers, and supramolecular metallopolymers.

Optionally, the functional polymeric matrix can comprise nano fillers to provide antiwearing, antimicrobial, antistaining, or EMI functionalities.

Nanoparticles dispersed in the matrix have a largest dimension less than 1 micrometer. Nanoparticles may have any suitable shape and may be nanospheres or nanocubes, for example. The nanoparticles can be associated or unassociated or both.

In some embodiments, the nanoparticles have an average size in a range from 75 nm to 500 nm (in some embodiments, 100 nm to 300 nm, or even 150 nm to 250 nm). Nanoparticles can have a mean diameter in the range from about 75 nm to about 500 nm. The diameter of a nanoparticle refers to $(6 V/\pi)^{1/3}$ where V is the volume of the nanoparticle, except where indicated differently. Terms such as average size or mean diameter as applied to a nanoparticle refer to $(6 V_a/\pi)^{1/3}$ where $V_a$ is the unweighted arithmetic average volume of the nanoparticle, except where indicated differently.

Nanoparticles can be colloidal (primary particles or associated particles) with a diameter less than about 500 nm. The term "associated particles" as used herein refers to a grouping of two or more primary particles that are aggregated and/or agglomerated. The term "aggregated" as used herein is descriptive of a strong association between primary particles which may be chemically bound to one another. The breakdown of aggregates into smaller particles is difficult to achieve. The term "agglomerated" as used herein is descriptive of a weak association of primary particles which may be held together by charge or polarity and can be broken down into smaller entities. The term "primary particle size" is defined herein as the size of a non-associated single particle. The dimension or size of the nano-scale dispersed phase can be determined by electron microscopy (e.g., transmission electron microscopy (TEM)) or atomic force microscopy (AFM).

The nanoparticles can comprise carbon, metals, metal oxides (e.g., $SiO_2$, $ZrO_2$, $TiO_2$, ZnO, magnesium silicate, indium tin oxide, and antimony tin oxide), carbides (e.g., SiC and WC), nitrides, borides, halides, fluorocarbon solids (e.g., poly(tetrafluoroethylene)), carbonates (e.g., calcium carbonate), and mixtures thereof. In some embodiments, the nanoparticles comprise at least one of $SiO_2$ particles, $ZrO_2$ particles, $TiO_2$ particles, ZnO particles, $A_2O_3$ particles, calcium carbonate particles, magnesium silicate particles, indium tin oxide particles, antimony tin oxide particles, poly(tetrafluoroethylene) particles, or carbon particles. Metal oxide particles can be fully condensed. Metal oxide particles can be crystalline.

Typically, particles are present in the matrix in an amount in a range from about 10 wt. % to about 85 wt. % (in some embodiments, about 30 wt. % to about 80 wt. %, or even about 40 wt. % to about 70 wt. %), although amounts outside these ranges may also be useful.

In some embodiments, the nanoparticles have a bimodal distribution. In some embodiments, the nanoparticles are monodispersed or substantially monodispersed (e.g., particles having a distribution with a mean diameter and a standard deviation about the mean of less than 20 percent of the mean).

Exemplary silicas are commercially available, for example, from Nalco Chemical Co., Naperville, Ill., under the trade designation "NALCO COLLOIDAL SILICA." such as products 2329, 2329K, and 2329 PLUS. Exemplary fumed silicas include those commercially available, for example, from Evonik Degusa Co., Parsippany, N.J, under the trade designation, "AEROSIL series OX-50", as well as product numbers -130, -150, and -200; and from Cabot Corp., Tuscola, Ill., under the designations "CAB-O-SPERSE 2095", "CAB-O-SPERSE A105", and "CAB-O-SIL M5". Other exemplary colloidal silica are available, for example, from Nissan Chemicals under the designations "MP 040", "MP2040", and "MP4540".

In some embodiments, the nanoparticles are surface modified. Preferably, the surface-treatment stabilizes the nanoparticles so that the particles are well dispersed in the polymerizable resin, and result in a substantially homogeneous composition. The nanoparticles can be modified over at least a portion of its surface with a surface treatment agent so that the stabilized particles can copolymerize or react with the polymerizable resin during curing.

In some embodiments, the nanoparticles are treated with a surface treatment agent In general, a surface treatment agent has a first end that will attach to the particle surface (covalently, ionically or through strong physisorption) and a second end that imparts compatibility of the particle with the resin and/or reacts with the resin during curing. Examples of surface treatment agents include alcohols, amines, carboxylic acids, sulfonic acids, phosphonic acids, silanes, and titanates. The preferred type of treatment agent is determined, in part, by the chemical nature of the metal oxide surface. Silanes are preferred for silica and other for siliceous fillers. Silanes and carboxylic acids are preferred for metal oxides, such as zirconia. The surface modification can be done either subsequent to mixing with the monomers or after mixing. It is preferred in the case of silanes to react the silanes with the particles or nanoparticle surface before incorporation into the resins. The amount of surface modifier needed is dependent on several factors such as particle size, particle type, molecular weight of the modifier, and modifier type.

Representative embodiments of surface treatment agents include compounds such as isooctyl tri-methoxy-silane, N-(3-triethoxysilylpropyl)methoxyethoxy-ethoxyethyl carbamate (PEG3TES), N-(3-triethoxysilylpropyl)methoxyethoxyethyl carbamate (PEG2TES), 3-(methacryloyloxy)propyltrimethoxysilane, 3-acryloxypropyltrimethoxysilane, 3-(methacryloyloxy)propyltriethoxysilane, 3-(methacryloyloxy)propylmethyldimethoxysilane, 3-(acryloyloxypropyl)methyldimethoxysilane, 3-(methacryloyloxy)propyldimethylethoxysilane, vinyldimethylethoxysilane, pheyltrimethaoxysilane, n-octyltrimethoxysilane, dodecyltrimethoxysilane, octadecyltrimethoxysilane, propyltrimethoxysilane, hexyltrimethoxysilane, vinylmethyldiactoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris (2-methoxyethoxy)silane, styrylethyltrimethoxysilane, mercaptopropyltrimethoxysilane, 3-glycidoxypropyltrimethoxysilane, acrylic acid, methacrylic acid, oleic acid, stearic acid, dodecanoic acid, 2-(2-(2-methoxyethoxy) ethoxy)acetic acid (MEEAA), beta-carboxyethylacrylate, 2-(2-methoxyethoxy)acetic acid, methoxyphenyl acetic acid, and mixtures thereof. One exemplary silane surface modifier is commercially available, for example, from OSI Specialties. Crompton South Charleston, W. Va., under the trade designation "SILQUEST A1230". For monofunctional silane coupling agents comprising silanol groups, the silane agents can react and form covalent bonds with the hydroxyl groups on the surface of nanoparticles. For bi or multifunctional silane coupling agents comprising silanol groups and other functional groups (e.g., acrylate, epoxy, and/or vinyl), the silane agents can react and form covalent bonds with the hydroxyl groups on the surface of nanoparticles and the functional groups (e.g., acrylate, epoxy, and/or vinyl) in the polymeric matrix.

Surface modification of the particles in the colloidal dispersion can be accomplished in a variety of ways. The process involves the mixture of an inorganic dispersion with surface modifying agents. Optionally, a co-solvent can be added at this point, such as 1-methoxy-2-propanol, ethanol, isopropanol, ethylene glycol, N,N-dimethylacetamide, and 1-methyl-2-pyrrolidinone. The co-solvent can enhance the solubility of the surface modifying agents as well as the surface modified particles. The mixture comprising the inorganic sol and surface modifying agents is subsequently reacted at room or an elevated temperature, with or without mixing. In one method, the mixture can be reacted at about 85° C. for about 24 hours, resulting in the surface modified sol. In another method, where metal oxides are surface modified, the surface treatment of the metal oxide can preferably involve the adsorption of acidic molecules to the particle surface. Surface modification of the heavy metal oxide preferably takes place at room temperature.

Surface modification of the particles can be used to provide a covalent bond between the particles and a binder. More generally, surface modification of a mask can be utilized to provide a covalent bond between the upper portion and an intermediate portion of the pillar. For example, referring to FIG. 12B, upper portion 1203b may be covalently bonded to intermediate portion 1203c at interface 1209. As another example, referring to FIG. 18, mask 1839 may be surface treated to provide a covalent bond to a binder (not illustrated) disposed between the mask 1839 and polymer layer 1841. Utilizing surface modification of particles or other mask elements is useful in embodiments where the particles or other mask elements are incorporated into the nanostructured article as used in display application since this has been found to reduce or eliminate particles which have detached from the lower portion of the pillars. Detached particles can otherwise contaminate display elements such as light emitting layers in an OLED display. The matrix with the nanoparticles can be used as an etch mask to form openings through the mask into an underlying substrate. A plasma can be used in the etching process as described generally in U.S. Pat. Appl. Pub. No. 2014/0193612 (Yu et al.) and U.S. Pat. No. 8,460,568 (David et al.). The etching can be carried out at moderate vacuum conditions (e.g., in a range from about 1 mTorr to about 1000 mTorr) or atmospheric pressure environment.

A typical vacuum plasma system consists of a vacuum chamber with two parallel electrodes, the "powered electrode" (or "sample carrier electrode") and the counter-electrode, which creates an electric field that accelerates ions toward. The powered electrode is located in the bottom portion of the chamber and is electrically isolated from the rest of the chamber. The article or sample to be sub-micrometer structured is placed on the powered electrode. Plasma gas species can be added to the chamber, for example, through small inlets in the top of the chamber and can exit to the vacuum pump system at the bottom of the chamber. Plasma is formed in the system by applying a RF electromagnetic field to the powered electrode. The field is typically produced using a 13.56 MHz oscillator, although other RF sources and frequency ranges may be used. The gas molecules are energized and can become ionized in the plasma and accelerated toward the powered electrode to etch the sample. The large voltage difference causes the ions to be directed toward the powered electrode where they collide with the sample to be etched. Preferably, the etching is to a depth greater than an average lateral dimension of the etch mask so that the resulting nanostructures have an aspect ratio (average height divided by the average lateral dimension) is greater than 1.

The process pressure is typically maintained at about 1 to 1000 mTorr. This pressure range is very conducive for generation of the sub-micron structure in a cost effective manner.

The power density of the RF power of the etching process is preferably in the range of about 0.1 watt/cm$^3$ to about 1 watt/cm$^3$ (in some embodiments, about 0.2 watts/cm$^3$ to about 0.3 watt/cm$^3$).

The type and amount of gas utilized will depend upon the matrix material to be etched. The reactive gas species need to selectively etch the matrix material rather than the sub-micrometer particle dispersed phase. Additional gases may be used for enhancing the etching rate of hydrocarbons or for the etching of non-hydrocarbon materials. For example, fluorine containing gases (e.g., perfluommethane, perfluoroethane, perfluoropropane, sulfurhexafluoride, and nitrogen trifluoride) can be added to oxygen or introduced by themselves to etch materials such as $SiO_2$, tungsten carbide, silicon nitride, and amorphous silicon. Chlorine-containing gases can likewise be added for the etching of materials such as aluminum, sulfur, boron carbide, and semiconductors from the Group II-VI (including cadmium, magnesium, zinc, sulfur, selenium, tellurium, and combinations thereof and from the Group III-V (including aluminum, gallium, indium, arsenic, phosphorous, nitrogen, antimony, or combinations thereof. Hydrocarbon gases (e.g., methane) can be used for the etching of materials (e.g., gallium arsenide, gallium, and indium). Inert gases, particularly heavy gases such as argon can be added to enhance the etching process.

Methods for making sub-micrometer structured surfaces described herein can also be carried out using a continuous roll-to-roll process. For example, the method can be carried out using "cylindrical" plasma etching (PE). Cylindrical plasma etching (PE) utilizes a rotating cylindrical electrode to provide etched sub-micrometer structures on the surface of the article.

In general, cylindrical PE for making the sub-micron structured articles described herein can be described as follows. A rotatable cylindrical electrode ("drum electrode") powered by radio-frequency (RF) and a grounded counter-electrode are provided inside a vacuum vessel. The counter-electrode can comprise the vacuum vessel itself. Gas comprising an etchant is fed into the vacuum vessel, and a plasma is ignited and sustained between the drum electrode and the grounded counter-electrode. The conditions are selected so that sufficient ion bombardment is directed perpendicular to the circumference of the drum. A continuous article comprising the matrix containing the sub-micron particle dispersed phase can then be wrapped around the circumference of the drum and the matrix can be etched in the direction normal to the plane of the article. The matrix can be in the form of a coating on an article (e.g., on a film or web, or the matrix can be the article itself). The exposure time of the article can be controlled to obtain a predetermined etch depth of the resulting structure. The process can be carried out at an operating pressure of about 1-1000 mTorr.

Other methods for etching may include the use of ion beams, or high density plasmas including Inductively Coupled Plasma (ICP), Electron Cyclotron Resonance (ECR) plasma, Mid-Frequency (MF) plasma, Helicon plasma, and mixed frequency plasmas to independently tailor the plasma density, and the ion energy.

Substrate

The nanostructured articles of the present description may include a nanostructured surface on a substrate. The substrate can include a least an etch layer which is etched to form the nanostructured surface and may optionally include other layers such as a transfer layer and a release liner. In some embodiments, the substrate is or includes an OLED display or a polarizer. In such embodiments, the nanostructured layer can be formed directly on an OLED or directly on a polarizer, which may for example, be incorporated into an OLED display.

In some embodiments, the substrate on which the nanostructured surface is formed includes a barrier or a barrier stack. In some embodiments, the barrier stack is or includes a gas-barrier film. Gas-barrier films have a low permeability to oxygen and can be used to help prevent goods such as foods, electronics and pharmaceutical products from being deteriorated by contact with oxygen. Typically food grade gas-barrier films have oxygen transmission rates of less than about 1 $cm^3/m^2$/day at 20° C. and 65% relative humidity (RH). Preferably, the gas-barrier film also has barrier properties to moisture. In some embodiments, the gas-barrier film is disposed on a transfer layer which is disposed on a release liner.

Examples of polymeric gas-barrier films include ethyl vinyl alcohol copolymer (EVOH) films such as polyethylene EVOH films and polypropylene EVOH films; polyamide films such as coextruded polyamide/polyethylene films, coextruded polypropylene/polyamide/polypropylene films; and polyethylene films such as low density, medium density or high density polyethylene films and coextruded polyethylene/ethyl vinyl acetate films. Polymeric gas-barrier films can also be metallized, for example, coating a thin layer of metal such as aluminum on the polymer film.

Examples of inorganic gas-barrier films include films comprising silicon oxide, silicon nitride, silicon oxynitride, aluminum oxide, diamond-like films, diamond-like glass and foils such as aluminum foil.

In some embodiments, the gas-barrier film is flexible. For some applications, it is also desired that the gas-barrier film be visible light-transmissive. As used herein, the term "visible light-transmissive" means having an average transmission over the visible portion of the spectrum (between 400 nm and 700 nm, unless specified differently) of at least 70%, and in some cases at least 80%, or at least 85%, or at least 88% or at least 90%.

For some applications, protection from moisture and oxygen is desired. For particularly sensitive applications an "ultra-barrier film" may be needed. Ultra-barrier films typically have an oxygen transmission rate less than about 0.005 $cc/m^2$/day at 23° C. and 90% RH and a water vapor transmission rate of less than about 0.005 $g/m^2$/day at 23° C. and 90% RH. Some ultra-barrier films are multilayer films comprising an inorganic visible light-transmissive layer disposed between polymer layers. One example of a suitable ultra-barrier film comprises a visible light-transmissive inorganic barrier layer disposed between polymers having a glass transition temperature (Tg) greater than or equal to that of heat-stabilized polyethylene terephthalate (HSPET).

A variety of polymers having a Tg greater than or equal to that of HSPET can be employed. Volatilizable monomers that form suitably high Tg polymers are especially preferred. Preferably the first polymer layer has a Tg greater than that of PMMA, more preferably a Tg of at least about 110° C. yet more preferably at least about 150° C., and most preferably at least about 200° C. Especially preferred monomers that can be used to form the first layer include urethane acrylates (e.g., CN-968. Tg=about 84° C. and CN-983. Tg=about 90°

C. both commercially available from Sartomer), isobornyl acrylate (e.g., SR-506, commercially available from Sartomer, Tg=about 88° C.), dipentaerythritol pentaacrylates (e.g. SR-399, commercially available from Sartomer, Tg=about 90° C.), epoxy acrylates blended with styrene (e.g., CN-120S80, commercially available from Sartomer, Tg=about 95° C.), di-trimethylolpropane tetraacrylates (e.g., SR-355, commercially available from Sartomer. Tg=about 98° C.), diethylene glycol diacrylates (e.g., SR-230, commercially available from Sartomer, Tg=about 100° C.), 1,3-butylene glycol diacrylate (e.g., SR-212, commercially available from Sartomer, Tg=about 101° C.), pentaacrylate esters (e.g., SR-9041, commercially available from Sartomer, Tg=about 102° C.), pentaerythritol tetraacrylates (e.g., SR-295, commercially available from Sartomer, Tg=about 103° C.), pentaerythritol triacrylates (e.g., SR-444, commercially available from Sartomer, Tg=about 103° C.), ethoxylated (3) trimethylolpropane triacrylates (e.g., SR-454, commercially available from Sartomer. Tg=about 103° C.), ethoxylated (3) trimethylolpropane triacrylates (e.g., SR-454HP, commercially available from Sartomer. Tg=about 103° C.), alkoxylated trifunctional acrylate esters (e.g., SR-9008, commercially available from Sartomer. Tg=about 103° C.), dipropylene glycol diacrylates (e.g., SR-508, commercially available from Sartomer. Tg=about 104° C.), neopentyl glycol diacrylates (e.g., SR-247, commercially available from Sartomer, Tg=about 107° C.), ethoxylated (4) bisphenol a dimethacrylates (e.g., CD-450, commercially available from Sartomer, Tg=about 108° C.), cyclohexane dimethanol diacrylate esters (e.g., CD-406, commercially available from Sartomer, Tg=about 110° C.), isobornyl methacrylate (e.g., SR-423, commercially available from Sartomer. Tg=about 110° C.), cyclic diacrylates (e.g., SR-833, commercially available from Sartomer. Tg=about 186° C.) and tris (2-hydroxy ethyl) isocyanurate triacrylate (e.g., SR-368, commercially available from Sartomer, Tg=about 272° C.), acrylates of the foregoing methacrylates and methacrylates of the foregoing acrylates.

A polymer layer (e.g., an etch layer which is subsequently etched to form the nanostructured surface) of the substrate can be formed by applying a layer of a monomer or oligomer onto a surface and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to a layer using conventional coating methods such as roll coating (e.g., gravure roll coating) or spray coating (e.g., electrostatic spray coating), then crosslinked as set out above. The polymer layer can also be formed by applying a layer containing an oligomer or polymer in solvent and drying the thus-applied layer to remove the solvent Plasma polymerization may also be employed and can, in some cases, provide a polymeric layer having a glassy state at an elevated temperature, with a glass transition temperature greater than or equal to that of HSPET. In some embodiments, the first polymer layer is formed by flash evaporation and vapor deposition followed by crosslinking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois. "A New Vapor Deposition Process for Coating Paper and Polymer Webs", 6th International Vacuum Coating Conference (1992), in D. G. Shaw and M. G. Langlois. "A New High Speed Process for Vapor Depositing Acrylate Thin Films: An Update". Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw. M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers". Society of Vacuum Coaters 39th Annual Technical Conference Proceedings (1996).

The smoothness and continuity of each polymer layer and its adhesion to the underlying layer can be enhanced by appropriate pretreatment. A useful pretreatment regimen employs an electrical discharge in the presence of a suitable reactive or non-reactive atmosphere (e.g., plasma, glow discharge, corona discharge, dielectric barrier discharge or atmospheric pressure discharge), chemical pretreatment or flame pretreatment. These pretreatments help make the surface of the underlying layer more receptive to formation of the subsequently applied polymeric layer. Plasma pretreatment is particularly preferred. A separate adhesion promotion layer which may have a different composition than the high Tg polymer layer may also be utilized atop an underlying layer to improve interlayer adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the first polymer layer will depend in part on the nature and surface topography of the support. A thickness sufficient to provide a smooth, defect-free surface to which the subsequent first inorganic barrier layer can be applied. For example, the polymer layer may have a thickness of a few nm (e.g., 2 or 3 nm) to about 5 micrometers, and can be thicker if desired.

One or more visible light-transmissive inorganic barrier layers separated by a polymer layer having a Tg greater than or equal to that of HSPET lie atop a first polymer layer. These layers can respectively be referred to as the "first inorganic barrier layer", "second inorganic barrier layer" and "second polymer layer". Additional inorganic barrier layers and polymer layers can be present if desired, including polymer layers that do not have a Tg greater than or equal to that of HSPET. Preferably however each neighboring pair of inorganic barrier layers is separated only by a polymer layer or layers having a Tg greater than or equal to that of HSPET, and more preferably only by a polymer layer or layers having a Tg greater than that of PMMA.

The inorganic barrier layers do not have to be the same. A variety of inorganic barrier materials can be employed. Preferred inorganic barrier materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. ITO is an example of a special class of ceramic materials that can become electrically conducting with the proper selection of the relative proportions of each elemental constituent. The inorganic barrier layers preferably are formed using techniques employed in the film metallizing art such as sputtering (e.g., cathode or planar magnetron sputtering), evaporation (e.g., resistive or electron beam evaporation), chemical vapor deposition, atomic layer deposition, plating and the like. Most preferably the inorganic barrier layers are formed using sputtering, e.g., reactive sputtering. Enhanced barrier properties have been observed when the inorganic layer is formed by a high energy deposition technique such as sputtering compared to lower energy techniques such as conventional chemical vapor deposition processes. The smoothness and continuity of each inorganic barrier layer and its adhesion to the underlying layer can be enhanced by pretreatments (e.g., plasma pretreatment) such as those described above with reference to the first polymer layer.

The inorganic barrier layers do not have to have the same thickness. The desired chemical composition and thickness of each inorganic barrier layer will depend in part on the nature and surface topography of the underlying layer and on the desired optical properties for the barrier assembly. The inorganic barrier layers preferably are sufficiently thick so as to be continuous, and sufficiently thin so as to ensure that the barrier assembly and articles containing the assembly will have the desired degree of visible light transmission and flexibility. Preferably the physical thickness (as opposed to the optical thickness) of each inorganic barrier layer is about 3 to about 150 nm, more preferably about 4 to about 75 nm.

The second polymer layers that separate the first, second and any additional inorganic barrier layers do not have to be the same, and do not all have to have the same thickness. A variety of second polymer layer materials can be employed. Preferred second polymer layer materials include those mentioned above with respect to the first polymer layer. Preferably the second polymer layer or layers are applied by flash evaporation and vapor deposition followed by crosslinking in situ as described above with respect to the first polymer layer. A pretreatment such as those described above (e.g., plasma pretreatment) preferably also is employed prior to formation of a second polymer layer. The desired chemical composition and thickness of the second polymer layer or layers will depend in part on the nature and surface topography of the underlying layer(s). The second polymer layer thickness preferably is sufficient to provide a smooth, defect-free surface to which a subsequent inorganic barrier layer can be applied. Typically, the second polymer layer or layers may have a lower thickness than the first polymer layer. For example, each second polymer layer may have a thickness of about 5 nm to about 10 μm, and can be thicker if desired.

Flexible visible light-transmissive ultra-barrier films and their manufacture are described, for example, in U.S. Pat. No. 7,940,004 (Padiyath et al.), which is hereby incorporated herein by reference to the extent that it does not contradict the present description.

Commercially available ultra-barrier films include, for example, FTB 3-50 and FTB 3-125 available from 3M Company.

Transfer Layer of the Substrate

The substrate of the nanostructured article may include a transfer layer which may be a polymeric layer disposed between the nanostructured layer and a release liner. It is advantageous for the polymeric transfer layers have good adhesion to the nanostructured layer and to also adequately adhere to the release liner so that the liner remains in place during processing and transport nanostructure article, yet cleanly transfer off (i.e., release from) release liner when the liner is intentionally removed. It may also be desired that the polymeric transfer layer is mechanically robust so that it can support itself but remains flexible enough to resist cracking. In some embodiments, the polymeric transfer layer can provide durability to the nanostructured article.

In some embodiments, the polymeric transfer layer can be made as described in WO 2013/116103 (Kolb et al.) and WO 2013/116302 (Kolb et al.). For example, the process for creating the polymeric transfer layer can generally include (1) providing a coating solution comprising radically curable prepolymers and solvent (optional); (2) supplying the solution to a coating device; (3) applying the coating solution to the release liner by one of many coating techniques; (4) substantially removing the solvent (optional) from coating; (5) polymerizing the material in the presence of a controlled amount of inhibitor gas (e.g., oxygen) to provide a structured surface; and (6) optionally post-processing the dried polymerized coating, for example, by additional thermal, visible, ultraviolet (UV), or e-beam curing.

Polymerizable material described herein includes free radical curable prepolymers. Exemplary free radical curable prepolymers include monomers, oligomers, polymers and resins that will polymerize (cure) via radical polymerization. Suitable free radical curable prepolymers include (meth) acrylates, polyester (meth)acrylates, urethane (meth)acrylates, epoxy (meth)acrylates and polyether (meth)acrylates, silicone (meth)acrylates and fluorinated meth(acrylates).

Exemplary radically curable groups include (meth) acrylate groups, olefinic carbon-carbon double bonds, allyloxy groups, alpha-methyl styrene groups, styrene groups, (meth) acrylamide groups, vinyl ether groups, vinyl groups, allyl groups and combinations thereof. Typically the polymerizable material comprises free radical polymerizable groups. In some embodiments, polymerizable material comprises acrylate and methacrylate monomers, and in particular, multifunctional (meth)acrylate, difunctional (meth)acrylates, monofunctional (meth)acrylate, and combinations thereof. In some exemplary embodiments, the polymerizable composition includes urethane acrylates.

In some exemplary embodiments, the polymerizable compositions include at least one monomeric or oligomeric multifunctional (meth)acrylate. Typically, the multifunctional (meth)acrylate is a tri(meth)acrylate and/or a tetra (meth)acrylate. In some embodiments, higher functionality monomeric and/or oligomeric (meth)acrylates may be employed. Mixtures of multifunctional (meth)acrylates may also be used.

Exemplary multifunctional (meth)acrylate monomers include polyol multi(meth)acrylates. Such compounds are typically prepared from aliphatic triols, and/or tetraols containing 3-10 carbon atoms. Examples of suitable multifunctional (meth)acrylates are trimethylolpropane triacrylate, di(trimethylolpropane) tetraacrylate, pentaerythritol tetraacrylate, pentaerythritol triacrylate, the corresponding methacrylates and the (meth)acrylates of alkoxylated (usually ethoxylated) derivatives of said polyols. Examples of multi-functional monomers include those available under the trade designations "SR-295." "SR-444," "SR-399," "SR-355," "SR494," "SR-368" "SR-351," "SR492", "SR350," "SR415," "SR454," "SR499," "501," "SR502." and "SR9020" from Sartomer Americas, Exton, Pa., and "PETA-K," "PETIA," and "TMPTA-N" from Surface Specialties, Smyrna, Ga. The multi-functional (meth)acrylate monomers may impart durability and hardness to the structured surface.

In some exemplary embodiments, the polymerizable compositions include at least one monomeric or oligomeric difunctional (meth)acrylate. Exemplary difunctional (meth) acrylate monomers include diol difunctional(meth)acrylates. Such compounds are typically prepared from aliphatic diols containing 2-10 carbon atoms. Examples of suitable difunctional (meth)acrylates are ethylene glycol diacrylate, 1,6-hexanediol diacrylate, 1,12-dodecanediol dimethacrylate, cyclohexane dimethanol diacrylate, 1,4 butanediol diacrylate, diethylene glycol diacrylate, diethylene glycol dimethacrylate, 1,6-hexanediol dimethacrylate, neopentyl glycol diacrylate, neopentyl glycol dimethacrylate, and dipropylene glycol diacrylate.

Difunctional (meth)acrylates from difunctional polyethers are also useful. Examples include polyethyleneglycol di(meth) acrylates and polypropylene glycol di(meth)acrylates.

In some exemplary embodiments, the polymerizable compositions include at least one monomeric or oligomeric monofunctional (meth)acrylate. Exemplary monofunctional (meth)acrylates and other free radical curable monomers include styrene, alpha-methylstyrene, substituted styrene, vinyl esters, vinyl ethers, N-vinyl-2-pyrrolidone, (meth) acrylamide, N-substituted (meth)acrylamide, octyl (meth) acrylate, iso-octyl (meth)acrylate, nonylphenol ethoxylate (meth) acrylate, isononyl (meth)acrylate, isobornyl (meth) acrylate, 2-(2-ethoxy-ethoxy)ethyl (meth)acrylate, 2-ethylhexyl (meth)acrylate, lauryl (meth)acrylate, butanediol mono(meth) acrylate, beta-carboxyethyl (meth)acrylate, isobutyl (meth)acrylate, 2-hydroxyethyl (meth)acrylate, (meth)acylonitrile, maleic anhydride, itaconic acid, isodecyl (meth) acrylate, dodecyl (meth)acrylate, n-butyl (meth)acrylate, methyl (meth) acrylate, hexyl (meth)acrylate, (meth) acrylic acid. N-vinylcaprolactam, stearyl (meth)acrylate, hydroxy functional polycapro-lactone ester (meth) acrylate, hydroxyethyl 1 (meth)acrylate, hydroxymethyl (meth)acrylate, hydroxypropyl (meth)acrylate, hydroxyisopropyl (meth)acrylate, hydroxybutyl (meth)acrylate, hydroxyisobutyl (meth)acrylate, tetrahydrofurfuryl (meth)acrylate, and combinations thereof. The monofunctional (meth)acrylates are useful, for example, for adjusting the viscosity and functionality of the prepolymer composition.

Oligomeric materials are also useful in making the material comprising nanoparticles described herein. The oligomeric material contributes bulk optical and durability properties to the cured composition. Representative difunctional oligomers include ethoxylated (30) bisphenol A diacrylate, polyethylene glycol (600) dimethacrylate, ethoxylated (2) bisphenol A dimethacrylate, ethoxylated (3) bisphenol A diacrylate, ethoxylated (4) bisphenol A dimethacrylate, ethoxylated (6) bisphenol A dimethacrylate, polyethylene glycol (600) diacrylate.

Typical useful difunctional oligomers and oligomeric blends include-those available under the trade designations "CN-120". "CN-104", "CN-116", "CN-117," from Sartomer and "EBECRYL 1608". "EBECRYL 3201", "EBECRYL 3700", "EBECRYL 3701", "EBECRYL 608" from Cytec Surface Specialties. Smyrna, Ga. Other useful oligomers and oligomeric blends include those available under the trade designations "CN-2304", "CN-115", "CN-118", "CN-119", "CN-970A60", "CN-972", "CN-973A80", and "CN-975" from Sartomer Co and "EBECRYL 3200," "EBECRYL 3701," "EBECRYL 3302," "EBECRYL 3605," "EBECRYL 608", from Cytec Surface Specialties.

The polymeric transfer layer can be made from functionalized polymeric materials such as weatherable polymeric materials, hydrophobic polymeric materials, hydrophilic polymeric materials, antistatic polymeric materials, antistaining polymeric materials, conductive polymeric materials for electromagnetic shielding, antimicrobial polymeric materials, shape memory polymeric materials or antiwearing polymeric materials. Functional hydrophilic or antistatic polymeric matrix comprises the hydrophilic acrylates such as hydroxyethyl methacrylate (HEMA), hydroxyethyl acrylate (HEA), poly(ethylene glycol) acrylates with different polyethylene glycol (PEG) molecular weights, and other hydrophilic acrylates (e.g., 3-hydroxy propyl acrylate, 3-hydroxypropyl methacrylate, 2-hydroxy-3-methacryloxy propyl acrylate, and 2-hydroxy-3-acyloxy propyl acrylate).

In some embodiments, solvent can be removed from the composition by drying, for example, at temperatures not exceeding the decomposition temperature of the radiation curable prepolymer.

Exemplary solvents include linear, branched, and cyclic hydrocarbons, alcohols, ketones, and ethers, including propylene glycol ethers (e.g., 1-methoxy-2-propanol), isopropyl alcohol, ethanol, toluene, ethyl acetate, 2-butanone, butyl acetate, methyl isobutyl ketone, methyl ethyl ketone, cyclohexanone, acetone, aromatic hydrocarbons, isophorone, butyrolactone, N-methylpyrrolidone, tetrahydrofuran, esters (e.g., lactates, acetates, propylene glycol monomethylether acetate (PM acetate), diethylene glycol ethyl ether acetate (DE acetate), ethylene glycol butyl ether acetate (EB acetate), dipropylene glycol monomethyl acetate (DPM acetate), iso-alkyl esters, isohexyl acetate, isoheptyl acetate, isooctyl acetate, isononyl acetate, isodecyl acetate, iododecyl acetate, isotridecyl acetate, and other iso-alkyl esters), water and combinations thereof.

The first solution may also include a chain transfer agent. The chain transfer agent is preferably soluble in the monomer mixture prior to polymerization. Examples of suitable chain transfer agents include triethyl silane and mercaptans.

In some embodiments, the polymerizable composition comprises a mixture of the above described prepolymers. Desirable properties of the radically curable composition typically include viscosity, functionality, surface tension, shrinkage and refractive index. Desirable properties of the cured composition include mechanical properties (e.g. modulus, strength, and hardness), thermal properties (e.g., glass transition temperature and melting point), and optical properties (e.g., transmission, refractive index, and haze).

The surface structure obtained has been observed to be influenced by the curable prepolymer composition. For example, different monomers result in different surface nanostructure when cured under the same conditions. The different surface structure can result, for example, in different % reflection, haze, and transmission.

The surface nanostructure obtained has been observed to be facilitated by the free radical curable prepolymer composition. For examples, incorporation of certain mono-, di-, and multi-meth(acrylates) can result in surface nanostructures that exhibit preferable coating properties (e.g., % reflection, haze, transmission, steel wool scratch resistance, etc.) when processed under the same conditions. Conversely, different ratios and/or different prepolymers can also result inability to form surface nanostructures under similar processing conditions.

Constituent proportions in the radically curable prepolymers can vary. The composition may depend, for example, on the desired coating surface properties, bulk properties, and the coating and curing conditions.

In some embodiments, the radically curable prepolymer is a hardcoat material.

In some embodiments, the polymeric transfer layer comprises nanoparticles. The nanoparticles can provide durability and/or surface structure to the polymeric transfer layer. The nanoparticles used in the transfer layer can be selected from the types (e.g., materials, size ranges, surface treatment) of nanoparticles described elsewhere herein for use in other layers. The nanoparticles used in the transfer layer may, however, be selected with differing size, materials and surface treatments from those used in a mask layer, for example. Additional details on nanoparticles suitable for a polymeric transfer layer can be found in U.S. Pat. Appl. No. 62/289,420, which was filed on Feb. 1, 2016 and which is hereby incorporated herein by reference to the extent that it does not contradict the present description.

In one exemplary embodiment a coating solution can be prepared by solvent exchange of the surface modified nanoparticles into the coating solvent, followed by addition of the radically curable prepolymer.

In another exemplary embodiment a coating solution can be prepared by drying the surface modified nanoparticles into a powder. The powder is then dispersed in the desired coating solvent. The drying step in this method can be accomplished by conventional means suitable for the system (e.g., oven drying, gap drying, spray drying, and rotary evaporation). The dispersion can be facilitated, for example, by mixing sonication, milling, and microfluidizing.

It is typically desirable that the polymeric transfer layer result in a defect-free coating. In some embodiments, defects that can manifest during the coating process may include optical quality, haze, roughness, wrinkling, dimpling, dewetting, etc. These defects can be minimized with employment of surface leveling agents. Exemplary leveling agents include those available under the trade designation "TEGO-RAD" from Evonik Goldschimdt Corporation. Surfactants such as fluorosurfactants can be included in the polymerizable composition, for example, to reduce surface tension, improve wetting, allowing smoother coating, and fewer coating defects.

Release Liner of the Substrate

The transfer layer can be a polymeric layer coated onto a release liner. In some embodiments, the release liner comprises a release material on PET film. The appropriate release coating will depend upon the polymeric transfer layer utilized. As mentioned above, it is typically desired that the polymeric transfer layer adequately adhere to the release liner so that the liner remains in place during processing and transport of the barrier stack, yet cleanly transfer off (i.e., release from) release liner when the liner is intentionally removed. In some embodiments, the release liner is a silicon containing release liner.

Useful release liners are described, for example, in U.S. Patent Application Pub. No. 2009/0000727 (Kumar et al.), which is hereby incorporated herein by reference to the extent that it does not contradict the present description. Such release liners comprise a release material that can be formed by irradiating (for example, by using an UV ray or electron beam) a release materiel precursor having shear storage modulus of about $1\times10^2$ Pa to about $3\times10^6$ Pa at 20° C. and a frequency of 1 Hz. The release material (after irradiation) has a contact angle of 15° or more, measured using a mixed solution of methanol and water (volume ratio 90:10) having a wet tension of 25.4 mN/m. Examples of suitable release material precursors include polymers having a shear storage modulus within the above-described range, such as, for example, a poly(meth)acrylic ester, a polyolefin, or a polyvinyl ether.

An example of a useful release material precursor is a copolymer having two kinds of acryl monomer components such as, for example, a (meth)acrylate containing an alkyl group having from about 12 to about 30 carbon atoms (hereinafter referred to as a "first alkyl (meth)acrylate") and a (meth)acrylate containing an alkyl group having from 1 to about 12 carbon atoms (hereinafter referred to as a "second alkyl (meth)acrylate").

The first alkyl (meth)acrylate contains a relatively long alkyl side chain having from about 12 to about 30 carbon atoms that helps to decrease the surface energy of the release material. Accordingly, the first alkyl (meth)acrylate acts to impart a low release strength to the release material. The first alkyl (meth)acrylate typically does not contain a polar group (for example, a carboxyl group, a hydroxyl group, or a nitrogen- or phosphorous-containing polar group) on the side chain. Accordingly, the first alkyl (meth)acrylate can impart relatively low release strength to the release material, not only at low temperatures, but also even after exposure to relatively high temperatures.

Preferred examples of the first alkyl (meth)acrylate having a long chain alkyl group include lauryl (meth)acrylate, cetyl (meth)acrylate, (iso)octadecyl (meth)acrylate, and behenyl (meth)acrylate. The first alkyl (meth)acrylate is typically present in an amount of about 10% to about 90%/o by weight based on the total amount of the first alkyl (meth)acrylate and the second alkyl (meth)acrylate.

The second alkyl (meth)acrylate contains a relatively short alkyl side chain having from 1 to about 12 carbon atoms. This relatively short alkyl side chain decreases the glass transition temperature of the release material to about 30° C. or less. In turn, the release material precursor is reduced in crystallinity and also in the shear storage modulus.

In one embodiment, the second alkyl (meth)acrylate containing an alkyl group having 12 carbon atoms is the same as the first alkyl (meth)acrylate having 12 carbon atoms. In this case, unless other components are present, the release material can be formed from a release material precursor containing a homopolymer.

Furthermore, the second alkyl (meth)acrylate typically does not contain a polar group on the side. Therefore, similarly to the first alkyl (meth)acrylate, the second alkyl (meth)acrylate imparts a relatively low release strength, not only at a low temperature, but also at a relatively high temperature.

Preferred examples of the second (meth)acrylate having a short chain alkyl group include butyl (meth)acrylate, hexyl (meth)acrylate, octyl (meth)acrylate, and lauryl (meth)acrylate. The second alkyl (meth)acrylate is typically present in an amount of about 10% to about 90% by weight based on the total amount of the first alkyl (meth)acrylate and the second alkyl (meth)acrylate.

The first and/or the second alkyl (meth)acrylates may be a (meth)acrylate having a branched side chain such as 2-heptylundecyl acrylate, 2-ethylhexyl (meth)acrylate, or isononyl (meth)acrylate. (Meth)acrylates having a branched side chain reduce the crystallinity and therefore decrease the shear storage modulus and the surface energy. A homopolymer consisting of a monomer component of alkyl (meth) acrylate containing a branched alkyl group having from about 8 to about 30 carbon atoms can be useful as the release material precursor. For example, a homopolymer of 2-heptylundecyl acrylate is a preferred release material precursor from the standpoint that the obtained release material can be reduced in surface energy and shear storage modulus. A copolymer comprising a monomer component of alkyl (meth)acrylate containing a straight alkyl group and a monomer component of alkyl (meth)acrylate containing a branched alkyl group having from about 8 to about 30 carbon atoms can also be useful as the release material precursor. For example, a copolymer of stearyl acrylate and isostearyl acrylate is also a preferred release material precursor from the standpoint that the obtained release material can be reduced in surface energy and shear storage modulus.

Preferred release material precursors can be obtained by polymerization of alkyl (meth)acrylates in the presence of a polymerization initiator. The polymerization initiator is not particularly limited as long as it can bring about the polymerization. Examples of useful polymerization initiators include azobis compounds such as 2,2'-azobisisobutyronitrile, 2,2'-azobis(2-methylbutylonitrile), and 2,2'-azobis(2-methylvaleronitrile and peroxides such as benzoyl peroxide and lauroyl peroxide. Some polymerization initiators are commercially available, such as 2,2'-azobisisobutyronitrile and 2,2'-azobis(2-methylbutylonitrile), which are available as V-60 and V-59 from Wako Pure Chemical Industries, Ltd. (Osaka. Japan). The amount of polymerization initiator can vary, but the polymerization initiator is typically used in an amount of about 0.005% to about 0.5% by weight based on the weight of the monomer.

The polymerization of the above-described alkyl (meth) acrylates can be performed by any known method. For example, a solution polymerization method, which involves dissolving the alkyl (meth)acrylates in a solvent and polymerizing them in solution can be used. The polymer solution can be directly taken out and used after the completion of polymerization. In this case, the solvent to be used is not particularly limited. Some examples of suitable solvents include ethyl acetate, methyl ethyl ketone, and heptane. A chain transfer agent can also be incorporated into the solvent in order to control molecular weight. The solution polymerization of the polymerizable composition can typically be performed at a reaction temperature of about 50° C. to about 100° C. for about 3 to about 24 hours in an atmosphere of an inert gas such as nitrogen.

When the release material precursor is a poly(meth) acrylate, the release material polymer typically has a weight average molecular weight of about 100,000 to about 2,000,000. If the weight average molecular weight is less than about 100,000, the release strength may increase, whereas if the weight molecular average molecular weight exceeds about 2,000,000, the viscosity of the polymer solution may be increased during synthesis, making handling of the polymer solution relatively difficult.

As long as the above-described physical properties can be attained, the release material can be constituted by a polyolefin. The polyolefin can be formed from an olefin monomer having from about 2 to about 12 carbon atoms. Examples of useful olefin monomers include linear olefins such as ethylene, propylene, 1-butene, 1-pentene, 1-hexene, 1-heptene, 1-octene, 1-nonene, 1-decene, 1-undecene, 1-dodecene, and branched olefins such as 4-methyl-1-pentene, 5-methyl-1-hexene, 4-methyl-1-hexene, 7-methyl-1-octene, and 8-methyl-1-nonene. However, a homopolymer of ethylene or propylene, namely polyethylene and polypropylene, generally cannot satisfy the physical properties of shear storage modulus because of their crystallinity. Therefore, when using ethylene, propylene, or the like, the shear storage modulus is typically decreased by copolymerization, for example, with 1-butene, 1-octene, or the like.

With respect to the copolymer structure, a random copolymer is preferred from the standpoint of reducing crystallinity. However, even if the copolymer has crystallinity, as long as the shear storage modulus is acceptable, a block copolymer can be used. The weight average molecular weight is typically from about 100.000 to about 2,000,000. Polyolefins having a high molecular weight can be produced by conventionally known polymerization methods such as, for example, ionic polymerization, preferably coordinated anionic polymerization.

Examples of useful commercially available polyolefins include ethylene/propylene copolymers are available from JSR Corporation (Tokyo, Japan) as EP01P and EP912P, and an ethylene/octene copolymer available from The Dow Chemical as Engage™ 8407.

The release material precursor can also be a polyvinyl ether having the above-described properties. Examples of the starting monomer for a polyvinyl ether include linear or branched vinyl ethers such as n-butyl vinyl ether, 2-hexyl vinyl ether, dodecyl vinyl ether, and octadecyl vinyl ether. However, for example, polyoctadecyl vinyl ether does not satisfy the above-described physical properties for the shear storage modulus. Therefore, when using octadecyl vinyl ether, the shear storage modulus is typically decreased by copolymerization, for example, 2-ethylhexyl vinyl ether.

With respect to the copolymer structure, a random copolymer is preferred from the standpoint of reducing crystallinity. However, even if the copolymer has crystallinity, as long as the shear storage modulus is acceptable, a block copolymer can be used. The weight average molecular weight is typically from about 100,000 to about 2,000,000. The polyvinyl ether can be produced by ionic polymerization such as, for example, by cationic polymerization.

The release material precursor can be provided on a liner substrate, preferably a liner substrate comprising polyester, polyolefin, or paper. The release material precursor can then be subjected to a treatment of radiation, for example, by using an electron beam or UV rays. The release material precursor generally has no polar functional groups such as carboxyl groups, hydroxyl groups, or amide groups. Therefore, it would be expected that the release material precursor would exhibit poor anchoring to the liner substrate. However, despite the absence of a polar functional group in the release material precursor, the anchoring between the liner substrate and the release material can be increased by treatment with radiation.

The release liner can be manufactured as follows. A solution of the release material precursor can be diluted with a diluent, for example, containing at least one of ethyl acetate, butyl acetate, methyl ethyl ketone, methyl isobutyl ketone, hexane, heptane, toluene, xylene, and methylene chloride, and then coated on a substrate to a predetermined thickness, thereby forming a release material precursor layer on the liner substrate. The diluent can be the same as or different than the solvent used in the solution polymerization.

Examples of liner substrates that can be used include plastics such as polyesters (for example, a polyethylene terephthalate, polyethylene naphthalate, or polybutylene terephthalate film) and polyolefins, and paper. The thickness of the release material precursor depends on the type of liner substrate but is generally from about 0.01 to about 1 micrometers (preferably, from about 0.05 to about 0.5 micrometers).

The release material precursor can be irradiated by, for example, an electron beam or ultraviolet ray. In the case of using an electron beam, the irradiation is typically performed under an inert gas such as nitrogen. The absorbed dose thereto depends on the thickness and composition of the release material precursor layer and is usually from about 1 to about 100 kGy. If an ultraviolet ray is used, the irradiation energy of the release material precursor layer is usually from about 10 to about 300 mJ/cm$^2$ (preferably, from about 20 to about 150 mJ/cm$^2$).

An example of another useful release material precursor is an acrylic release agent precursor which comprises a poly(meth)acrylate ester having a group capable of being activated by ultraviolet radiation (also referred to as "an ultraviolet active group") and has a shear storage modulus of about $1 \times 10^2$ to about $3 \times 10^6$ Pa at 20° C. and a frequency of 1 Hz. The acrylic release agent precursor, after irradiation with ultraviolet radiation, has a contact angle of about 150 or more to a mixed solution of methanol and water (volume ration of 90:10) having a wetting tension of 25.4 mN/m.

The acrylic release agent precursor can be a polymer composition comprising a polymer such as poly(meth)acrylate ester having an ultraviolet active group. The poly(meth)acrylate is, for example, a copolymer formed from a first alkyl (meth)acrylate as described above, a second alkyl (meth)acrylate as described above, and a (meth)acrylate ester having an ultraviolet active group.

Preferred first alkyl (meth)acrylates containing a long alkyl side chain for the acrylic release agent precursor include lauryl (meth)acrylate, cetyl (meth)acrylate, stearyl (meth)acrylate, and behenyl (meth)acrylate.

The copolymer typically contains the first alkyl (meth)acrylate or second alkyl (meth)acrylate in an amount from about 10 to about 90% by weight based on the total weight of the first and second alkyl (meth)acrylates.

The poly (meth)acrylate ester can also be derived from a monomer component containing an alkyl (meth)acrylate having a branched alkyl group having from about 8 to about 30 carbon atoms and a (meth)acrylate ester having an ultraviolet active group. Examples of suitable alkyl (meth)acrylate having a branched alkyl group include 2-ethylhexyl (meth)acrylate, 2-hexyldodecyl acrylate, 2-heptylundecyl acrylate, 2-octyldecyl acrylate, and isononyl (meth)acrylate.

Such a (meth)acrylate having a branched side chain can reduce the shear storage modulus and surface energy by lowering the crystallinity. Thus, it is not necessary for the acrylic release agent precursor to contain two components such as a first alkyl (meth)acrylate and a second alkyl (meth)acrylate described above if it has a branched alkyl group having from about 8 to about 30 carbon atoms. For example, the polymer of 2-hexyldecyl acrylate or 2-octyldecyl acrylate can reduce the surface energy of the release agent.

Typically, the monomer component has no polar groups on the side chain. However, the monomer component may, for example, have a polar functional group on the side chain as long as the acrylic release agent precursor has a shear storage modulus as described above.

The poly(meth)acrylate ester has an ultraviolet active group. This ultraviolet active group can generate a free radical in the acrylic release agent precursor by irradiation with ultraviolet radiation. The generated free radical promotes crosslinking of the acrylic release agent precursor and adhesion to the liner substrate, resulting in an improvement in adhesion between the liner substrate and the release agent. Preferably, the amount of the (meth)acrylate ester having an ultraviolet active group is within a range of about 0.01 to about 1% by weight per poly(meth)acrylate ester unit.

The ultraviolet active group is not specifically limited, but is preferably derived from benzophenone or acetophenone. Introduction of the ultraviolet active group into the poly (meth)acrylate ester can be conducted by incorporating a (meth)acrylate ester having an ultraviolet active group as a monomer component and polymerizing the monomer component containing the (meth)acrylate ester.

The polymer of the acrylic release agent precursor preferably has a weight-average molecular weight within a range from about 100,000 to about 2,000,000.

The monomer component described above can be polymerized in the presence of a polymerization initiator to form an acrylic release agent precursor. Preferably, the polymerization is solution polymerization. Solution polymerization can typically be conducted in the state where the monomer component is dissolved in a solvent, together with the polymerization initiator, in an atmosphere of an inert gas such as nitrogen at about 50° to about 100° C. Solvents such as, for example, ethyl acetate, methyl ethyl ketone, or heptane can be used. Optionally, the molecular weight of the polymer can be controlled by adding a chain transfer agent to the solvent.

The polymerization initiator is not specifically limited. For example, an azobis compound such as 2,2'-azobisisobutyronitrile, 2,2'-azobis(2-methylbutyronitrile) or 2,2'-azobis (2,4-dimethylvaleronitrile), dimethyl 2,2'-azobis(2-methylpropionate) and a peroxide such as benzoyl peroxide or lauroyl peroxide can be used as the polymerization initiator. Preferably, the polymerization initiator is used in the amount within a range from 0.005 to 0.5% by weight based on the total weight of the monomer component.

The acrylic release agent precursor as described above is converted into an acrylic release agent by irradiating with ultraviolet radiation, after the precursor is coated on a liner substrate. Typically, the acrylic release agent is formed on the liner substrate in the thickness within a range from 0.01 to 1 micrometers. The acrylic release agent is generally obtained by irradiating with ultraviolet radiation after coating with the acrylic release agent precursor. As disclosed in WO 01/64805 and/or KOKAI (Japanese Unexamined Patent Publication) No. 2001-240775, the acrylic release agent adheres to the liner substrate by the irradiation with ultraviolet radiation, even though the acrylic release agent typically has no polar functional group. The liner substrate can be, for example, a film made of plastic such as polyester or polyolefin (for example, polyethylene terephthalate, polyethylene naphthalate or polybutylene terephthalate) or a paper. Preferred thickness of the liner substrate is within a range from about 10 to about 300 micrometers.

Usually, the acrylic release agent precursor is produced by solution polymerization as described above and exists in the state of a polymer solution. Therefore, the liner substrate can be coated with the polymer solution in a thickness typically within a range from about 0.01 to about 1 micrometers (preferably from 0.05 to 0.5 micrometers), using coating means such as bar coater. If necessary, the polymer solution can be applied after diluting with a diluent until a predetermined viscosity is achieved. Examples of the diluent include ethyl acetate, butyl acetate, methyl ethyl ketone, methyl isobutyl ketone, hexane, heptane, toluene, xylene, and methylene chloride.

The acrylic release agent precursor applied as described above is converted into an acrylic release agent by irradiation with ultraviolet radiation. The dose of irradiation with ultraviolet radiation varies depending on the kind and structure of the poly(meth)acrylate, but can usually be a low dose within a range from 10 to 150 mJ/cm$^2$.

The following is a list of exemplary embodiments of the present description.

Embodiment 1 is a nanostructured article comprising:
a first layer comprising a nanostructured surface, the nanostructured surface comprising a plurality of pillars extending from a base surface of the first layer, the pillars having an average height greater than an average lateral dimension of the pillars, an average center-to-center spacing between pillars being no more than 2000 nm, the average lateral dimension being no less than 50 nm, each pillar in the plurality of pillars having at least a lower portion and an upper portion, the lower portion between the upper portion and the base surface, the upper and lower portions having differing compositions, the lower portion having a first refractive index;
a second layer disposed over the plurality of pillars and extending continuously to the base surface, the second layer not being a gas layer or a liquid layer, the second layer having a second refractive index, wherein an absolute value of a difference between the first and second refractive indices is in a range of 0.1 to 1.5.

Embodiment 2 is a nanostructured article comprising:
a first layer comprising a nanostructured surface, the nanostructured surface comprising a plurality of pillars extending from a base surface of the first layer, the pillars having an average height greater than an average lateral dimension of the pillars, an average center-to-center spacing between pillars being no more than 2000 nm, the average lateral dimension being no less than 50 nm, each pillar in the plurality of pillars having at least a lower portion and an upper portion, the lower portion between the upper portion and the base surface, the upper and lower portions having differing compositions, the lower portion having a first refractive index;
a second layer disposed over the plurality of pillars and extending continuously to the base surface, the second layer having a second refractive index; and
a seal layer disposed on the second layer opposite the first layer,
wherein an absolute value of a difference between the first and second refractive indices is in a range of 0.1 to 1.5.

Embodiment 3 is the nanostructured article of Embodiment 2, wherein the seal layer comprises a plasma deposited thin film.

Embodiment 4 is the nanostructured article of Embodiment 3, wherein the plasma deposited thin film comprises one or more elements selected from the group consisting of carbon, hydrogen, silicon, oxygen, nitrogen and fluorine.

Embodiment 5 is the nanostructured article of Embodiment 2, wherein the second layer is a gas layer.

Embodiment 6 is the nanostructured article of Embodiment 5, wherein the gas layer is under a partial vacuum.

Embodiment 7 is the nanostructured article of Embodiment 2, wherein the second layer is a liquid layer.

Embodiment 8 is the nanostructured article of Embodiment 1 or 2, wherein the second layer comprises a plurality of nanovoids within a continuous polymeric phase.

Embodiment 9 is the nanostructured article of Embodiment 1 or 2, wherein the average lateral dimension is in a range of 100 nm to 1000 nm.

Embodiment 10 is the nanostructured article of Embodiment 1 or 2, wherein the average height is in a range of 200 nm to 1000 nm.

Embodiment 11 is the nanostructured article of Embodiment 1 or 2, wherein the average lateral dimension is in a range of 100 nm to 1000 nm and the average height is in a range of 200 nm to 1200 nm.

Embodiment 12 is the nanostructured article of Embodiment 1 or 2, wherein the average lateral dimension is in a range of 100 nm to 500 nm and the average height is in a range of 200 nm to 1000 nm.

Embodiment 13 is the nanostructured article of Embodiment 1 or 2, wherein the average lateral dimension is in a range of 100 nm to 250 nm and a ratio of the average height to the average lateral dimension is in a range of 1.5 to 5.0.

Embodiment 14 is the nanostructured article of Embodiment 1 or 2, wherein the nanostructured surface has a power spectral density (PSD) and a wavenumber-PSD product, the wavenumber-PSD product having a maximum for a wavenumber larger than 6 radians/micrometer times a larger of the first and second refractive indices.
wherein for all wavenumbers less than 6 radians/micrometer times the larger of the first and second refractive indices, the wavenumber-PSD product is no more than 0.3 times the maximum.

Embodiment 15 is the nanostructured article of Embodiment 14, wherein for any first wavevector having a first magnitude between 10 radians/micrometer times the larger of the first and second refractive indices and 13 radians/micrometer times a sum of the larger of the first and second refractive indices and 0.8, a maximum difference between a local average of the power spectral density at the first wavevector is between 0.7 and 1.3 times an annular average of the power spectral density at the first wavevector, the local average being an average of the power spectral density over an annular sector in Fourier space centered on the first wavevector and having an inner radius of 0.9 times the first magnitude, an outer radius of 1.1 times the first magnitude, and a subtended angle of 60 degrees,
the annular average being an average of the power spectral density over an annulus in Fourier space having an inner radius of 0.9 times the first magnitude and an outer radius of 1.1 times the first magnitude.

Embodiment 16 is the nanostructured article of Embodiment 1 or 2, further comprising a first release liner, the first layer disposed on the first release liner, the nanostructured surface facing away from the first release liner.

Embodiment 17 is the nanostructured article of Embodiment 16, further comprising a transfer layer disposed between the first layer and the first release liner.

Embodiment 18 is the nanostructured article of Embodiment 1 or 2, further comprising a plurality of layers disposed adjacent the first layer opposite the second layer, the plurality of layers including at least one polymeric layer and at least one inorganic layer.

Embodiment 19 is the nanostructured article of Embodiment 1 or 2, wherein the first layer includes an inorganic layer comprising the base surface.

Embodiment 20 is the nanostructured article of Embodiment 19, wherein the inorganic layer is a barrier layer.

Embodiment 21 is the nanostructured article of Embodiment 19, wherein the inorganic layer is an etch stop layer.

Embodiment 22 is the nanostructured article of Embodiment 19, wherein a standard deviation of height of the pillars about the average height is no more than 10 percent of the average height.

Embodiment 23 is the nanostructured article of Embodiment 19, wherein a standard deviation of height of the pillars about the average height is no more than 5 percent of the average height.

Embodiment 24 is the nanostructured article of Embodiment 19, wherein a standard deviation of height of the pillars about the average height is no more than 3 percent of the average height.

Embodiment 25 is the nanostructured article of Embodiment 1 or Embodiment 2, wherein a standard deviation of height of the pillars about the average height is no more than 10 percent of the average height.

Embodiment 26 is the nanostructured article of Embodiment 1 or 2, further comprising a plurality of layers disposed adjacent the first layer opposite the second layer, the plurality of layers including an inorganic layer disposed between two polymeric layers.

Embodiment 27 is the nanostructured article of Embodiment 1 or 2, further comprising an optically clear adhesive disposed on the second layer opposite the first layer.

Embodiment 28 is the nanostructured article of Embodiment 27, further comprising a second release liner disposed on the optically clear adhesive opposite the second layer.

Embodiment 29 is the nanostructured article of Embodiment 1 or 2, wherein a ratio of the average height to the average lateral dimension is in a range of 1.1 to 4.0.

Embodiment 30 is the nanostructured article of Embodiment 1 or 2, wherein a ratio of the average height to the average lateral dimension is in a range of 1.5 to 3.0.

Embodiment 31 is the nanostructured article of Embodiment 1 or 2, wherein the lower portion comprises a polymeric material and the upper portion comprises an inorganic material.

Embodiment 32 is the nanostructured article of Embodiment 1 or 2, wherein the lower portion comprises the polymeric material at at least 60 weight percent and the upper portion comprises the inorganic material at at least 80 weight percent.

Embodiment 33 is the nanostructured article of Embodiment 1 or 2, wherein the upper portion comprises a nanoparticle.

Embodiment 34 is the nanostructured article of Embodiment 33, wherein the lower portion is cylindrical and the nanoparticle is spherical, the nanoparticle having a diameter substantially equal to a diameter of the lower portion.

Embodiment 35 is the nanostructured article of Embodiment 33, wherein the lower portion is free of nanoparticles having diameters larger than half of the diameter of the nanoparticle of the upper portion.

Embodiment 36 is the nanostructured article of Embodiment 33, wherein a binder is disposed between the nanoparticle and the lower portion.

Embodiment 37 is the nanostructured article of Embodiment 1 or 2, wherein each pillar in the plurality of pillars further includes an intermediate portion between the lower and upper portions.

Embodiment 38 is the nanostructured article of Embodiment 37, wherein the intermediate portion comprises a binder.

Embodiment 39 is the nanostructured article of Embodiment 38, wherein the binder is covalently bonded to the upper portion.

Embodiment 40 is the nanostructured article of Embodiment 1 or 2 being flexible in that the nanostructured article can be bend to a radius of curvature of 1 cm without breaking or cracking.

Embodiment 41 is the nanostructured article of Embodiment 37, wherein the upper portion has a third refractive index, the intermediate portion has a fourth refractive index, an absolute value of a difference between the first and third refractive indices being no more than 0.1, an absolute value of a difference between the first and fourth refractive indices being no more than 0.1.

Embodiment 42 is the nanostructured article of Embodiment 1 or 2, wherein the upper portion has a third refractive index, an absolute value of a difference between the first and third refractive indices being no more than 0.1.

Embodiment 43 is the nanostructured article of Embodiment 1 or 2, wherein the second refractive index is lower than the first refractive index.

Embodiment 44 is the nanostructured article of Embodiment 1 or 2, wherein the second refractive index is higher than the first refractive index.

Embodiment 45 is the nanostructured article of Embodiment 1 or 2, wherein the second layer comprises zinc sulfide, indium tin oxide, silicon nitride, or a combination thereof.

Embodiment 46 is the nanostructured article of Embodiment 1 or 2, wherein the second refractive index is no more than 1.45.

Embodiment 47 is the nanostructured article of Embodiment 1 or 2, wherein the second refractive index is no more than 1.25.

Embodiment 48 is the nanostructured article of Embodiment 1 or 2, wherein the second refractive index is at least 1.6.

Embodiment 49 is the nanostructured article of Embodiment 1 or 2, wherein the second refractive index is at least 1.7.

Embodiment 50 is the nanostructured article of Embodiment 1 or 2, wherein each of the first and second layers has an average transmittance in a wavelength range from 400 nm to 700 nm at normal incidence of at least 70 percent.

Embodiment 51 is the nanostructured article of Embodiment 1 or 2, wherein each of the first and second layers has an average transmittance in a wavelength range from 400 nm to 700 nm at normal incidence of at least 80 percent.

Embodiment 52 is the nanostructured article of Embodiment 1 or 2, wherein each of the first and second layers has an average transmittance in a wavelength range from 400 nm to 700 nm at normal incidence of at least 85 percent.

Embodiment 53 is a nanostructured article comprising:
a nanostructured layer having a nanostructured surface comprising a plurality of protrusions and a plurality of depressions, the nanostructured layer not being a gas layer or a liquid layer, an etching mask disposed on the nanostructured surface,
a backfill material disposed over the etching mask and extending through the etching mask into the plurality of depressions, the backfill material forming a backfill layer not being a gas layer or a liquid layer.

Embodiment 54 is the nanostructured article of Embodiment 53, further comprising a first release liner, the nanostructured layer disposed on the first release liner, the nanostructured surface facing away from the first release liner.

Embodiment 55 is the nanostructured article of Embodiment 54, further comprising a transfer layer between the nanostructured layer and the first release liner.

Embodiment 56 is the nanostructured article of Embodiment 53, further comprising an optically clear adhesive disposed on the backfill material opposite the mask.

Embodiment 57 is the nanostructured article of Embodiment 56, further comprising a second release liner disposed on the optically clear adhesive opposite the backfill material.

Embodiment 58 is the nanostructured article of Embodiment 53, further comprising a binder disposed between the mask and the nanostructured surface, wherein the mask is covalently bonded to the binder.

Embodiment 59 is the nanostructured article of Embodiment 53, wherein the mask comprises a plurality of nanoparticles.

Embodiment 60 is the nanostructured article of Embodiment 53, wherein the mask comprises a discontinuous inorganic layer.

Embodiment 61 is the nanostructured article of Embodiment 60, wherein the discontinuous inorganic layers includes a plurality of islands having a largest lateral dimension in a range of 100 to 1000 nm and having an average spacing between nearest neighbor islands in a range of 100 to 500 nm.

Embodiment 62 is the nanostructured article of Embodiment 53, wherein each of the nanostructured layer, the mask and the backfill material has an average transmittance in a wavelength range from 400 nm to 700 nm at normal incidence of at least 70 percent.

Embodiment 63 is the nanostructured article of Embodiment 53, wherein each of the nanostructured layer, the mask and the backfill material has an average transmittance in a wavelength range from 400 nm to 700 nm at normal incidence of at least 80 percent.

Embodiment 64 is the nanostructured article of Embodiment 53, wherein each of the nanostructured layer, the mask and the backfill material has an average transmittance in a wavelength range from 400 nm to 700 nm at normal incidence of at least 85 percent.

Embodiment 65 is the nanostructured article of Embodiment 53, wherein the plurality of protrusions comprises a plurality of pillars and regions between the pillars comprise the plurality of depressions.

Embodiment 66 is the nanostructured article of Embodiment 53, wherein the nanostructured layer comprises a polymeric material.

Embodiment 67 is the nanostructured article of Embodiment 53, wherein the nanostructured layer has a first refractive index, the backfill material has a second refractive index, an absolute value of a difference between the first and second refractive indices being in a range of 0.1 to 1.5.

Embodiment 68 is the nanostructured article of Embodiment 67, wherein the second refractive index is in a range of 1.05 to 1.45.

Embodiment 69 is the nanostructured article of Embodiment 67, wherein the second refractive index is in a range of 1.05 to 1.25.

Embodiment 70 is the nanostructured article of Embodiment 67, wherein the second refractive index is at least 1.6.

Embodiment 71 is the nanostructured article of Embodiment 67, wherein the second refractive index is at least 1.7.

Embodiments 72 is the nanostructured article of Embodiment 53, wherein the backfill material has a refractive index greater than a refractive index of the nanostructured layer.

Embodiment 73 is the nanostructured article of Embodiment 53, wherein the backfill material has a refractive index lower than a refractive index of the nanostructured layer.

Embodiment 74 is the nanostructured article of Embodiment 53, wherein the nanostructured surface has a power spectral density (PSD), and a wavenumber-PSD product, the wavenumber-PSD product having a maximum for a wavenumber larger than 6 radians/micrometer times a larger of the first and second refractive indices, wherein for all wavenumbers less than 6 radians/micrometer times the larger of the first and second refractive indices, the wavenumber-PSD product is no more than 0.3 times the maximum.

Embodiment 75 is the nanostructured article of Embodiment 74, wherein for any first wavevector having a first magnitude between 10 radians/micrometer times the larger of the first and second refractive indices and 13 radians/micrometer times a sum of the larger of the first and second refractive indices and 0.8, a maximum difference between a local average of the power spectral density at the first wavevector is between 0.7 and 1.3 times an annular average of the power spectral density at the first wavevector, the local average being an average of the power spectral density over an annular sector in Fourier space centered on the first wavevector and having an inner radius of 0.9 times the first magnitude, an outer radius of 1.1 times the first magnitude, and a subtended angle of 60 degrees, the annular average being an average of the power spectral density over an annulus in Fourier space having an inner radius of 0.9 times the first magnitude and an outer radius of 1.1 times the first magnitude.

Embodiment 76 is an organic light emitting diode display comprising an emissive layer and the nanostructured article of any one of Embodiments 1, 2 or 53 disposed proximate to and outside of an evanescent zone of the emissive layer.

Embodiment 77 is the organic light emitting diode display of Embodiment 76, further comprising a circular polarizer, the nanostructured article disposed between the circular polarizer and the emissive layer.

Embodiment 78 is the organic light emitting diode display of Embodiment 76, further comprising an interior layer disposed between the emissive layer and the nanostructured surface;

wherein when the display is fully on, a first light output from the emissive layer at a view angle of zero degrees relative to a normal to the display has a first color in the interior layer and a second color exterior to the display, a second light output from the emissive layer at a view angle of 45 degrees relative to the normal to the display has a third color in the interior layer and a fourth color exterior to the display, the first and third colors having a first chromaticity distance therebetween, the second and fourth colors having a second chromaticity distance therebetween, the nanostructured article being configured such that the second chromaticity distance is less than 0.75 times the first chromaticity distance.

Embodiment 79 is the nanostructured article of any one of Embodiments 1, 2 or 53, wherein the nanostructured surface includes at least first and second regions, at least one geometric attribute of the nanostructured surface having different values in the first and second regions.

Embodiment 80 is the nanostructured article of Embodiment 79, wherein the at least one geometric attribute comprises the average lateral dimension of nanostructures on the nanostructured surface.

Embodiment 81 is the nanostructured article of Embodiment 80, wherein the nanostructures are pillars in the plurality of pillars or protrusions in the plurality of protrusions.

Embodiment 82 is the nanostructured article of Embodiment 79, wherein the at least one geometric attribute comprises the average center-to-center spacing of nanostructures on the nanostructured surface.

Embodiment 83 is the nanostructured article of Embodiment 82, wherein the nanostructures are pillars in the plurality of pillars or protrusions in the plurality of protrusions.

Embodiment 84 is an organic light emitting diode display comprising:

an emissive layer configured to emit light of at least different first and second colors, and the nanostructured article of Embodiment 79 disposed proximate to and outside of an evanescent zone of the emissive layer such that the first region is positioned to receive light of the first color and the second region is positioned to receive light of the second color.

Embodiment 85 is an organic light emitting diode display comprising:

an emissive layer, a nanostructured layer disposed proximate to and outside of an evanescent zone of the emissive layer, the nanostructured layer comprising a nanostructured surface, the nanostructured surface comprising a plurality of pillars extending from a base surface of the nanostructured layer, the pillars having an average height greater than an average lateral dimension of the pillars, an average center-to-center spacing between pillars being no more than 2000 nm, the average lateral dimension being no less than 50 nm;

wherein each pillar in the plurality of pillars has at least a lower portion and an upper portion, the lower portion between the upper portion and the base surface, the upper and lower portions having differing compositions.

Embodiment 86 is the organic light emitting diode display of Embodiment 85, wherein the nanostructured surface has a power spectral density (PSD) and a wavenumber-PSD product, the wavenumber-PSD product having a maximum for a wavenumber larger than 6 radians/micrometer times a larger of the first and second refractive indices, wherein for all wavenumbers less than 6 radians/micrometer times the larger of the first and second refractive indices, the wavenumber-PSD product is no more than 0.3 times the maximum.

Embodiment 87 is the organic light emitting diode display of Embodiment 86, wherein for any first wavevector having a first magnitude between 10 radians/micrometer times the larger of the first and second refractive indices and 13 radians/micrometer times a sum of the larger of the first and second refractive indices and 0.8, a maximum difference between a local average of the power spectral density at the first wavevector is between 0.7 and 1.3 times an annular average of the power spectral density at the first wavevector, the local average being an average of the power spectral density over an annular sector in Fourier space centered on the first wavevector and having an inner radius of 0.9 times the first magnitude, an outer radius of 1.1 times the first magnitude, and a subtended angle of 60 degrees, the annular average being an average of the power spectral density over an annulus in Fourier space having an inner radius of 0.9 times the first magnitude and an outer radius of 1.1 times the first magnitude.

Embodiment 88 is the organic light emitting diode display of Embodiment 85, further comprising an interior layer disposed between the emissive layer and the nanostructured surface;

wherein when the display is fully on, a first light output from the emissive layer at a view angle of zero degrees relative to a normal to the display has a first color in the interior layer and a second color exterior to the display, a second light output from the emissive layer at a view angle of 45 degrees relative to the normal to the display has a third color in the interior layer and a fourth color exterior to the display, the first and third colors having a first chromaticity distance therebetween, the second and fourth colors having a second chromaticity distance therebetween, the nanostructured article being configured such that the second chromaticity distance is less than 0.75 times the first chromaticity distance.

Embodiment 89 is a method comprising the steps of:

providing a substrate;

disposing a mask on the substrate thereby forming a masked substrate;

etching the masked substrate to form openings through the mask into the substrate thereby forming a nanostructured substrate having a nanostructured surface comprising a plurality of nanostructures having an average center-to-center spacing of no more than 2000 nm, each nanostructure having an average height greater than an average lateral dimension of the nanostructures, the average lateral dimension being no more than 50 nm;

backfilling the nanostructured substrate with a backfill material, the backfill material extending over the mask and through the openings, wherein the backfill material forms a backfill layer not being a gas layer or a liquid layer.

Embodiment 90 is a method comprising the steps of:

providing a substrate;

disposing a mask on the substrate;

etching the masked substrate to form openings through the mask into the substrate thereby forming a nanostructured substrate having a nanostructured surface comprising a plurality of nanostructures having an average center-to-center spacing of no more than 2000 nm, each nanostructure having an average height greater than an average lateral dimension of the nanostructures, the average lateral dimension being no more than 50 nm:

backfilling the nanostructured substrate with a backfill material, the backfill material extending through the openings, wherein the nanostructured surface has a substantially azimuthally symmetric power spectral density (PSD) and a wavenumber-PSD product, the substrate having a first refractive index, the backfill material having a second refractive index, the wavenumber-PSD product having a maximum for a wavenumber larger than 6 radians/micrometer times a larger of the first and second refractive indices.

wherein for all wavenumbers less than 6 radians/micrometer times the larger of the first and second refractive indices, the wavenumber-PSD product is no more than 0.3 times the maximum.

Embodiment 91 is the method of Embodiment 90, wherein the backfill material is a gas.

Embodiment 92 is the method of Embodiment 91, further comprising applying a seal layer over the backfill material.

Embodiment 93 is the method of Embodiment 90, wherein the backfill material forms a backfill layer not being a gas layer or a liquid layer.

Embodiment 94 is a method comprising the steps of:

providing a substrate;

disposing a mask on the substrate;

etching the masked substrate to form openings through the mask into the substrate thereby forming a nanostructured substrate having a nanostructured surface comprising a plurality of nanostructures having an average center-to-center spacing no more than 2000 nm, each nanostructure having an average height greater than an average lateral dimension of the nanostructures, the average lateral dimension being no more than 50 nm;

applying a backfill material over the masked substrate; and applying a seal layer over the backfill material.

Embodiment 95 is the method of Embodiment 94, wherein the backfill material is a gas.

Embodiment 96 is the method of Embodiment 94, wherein the backfill material forms a backfill layer not being a gas layer or a liquid layer.

Embodiment 97 is the method of Embodiment 89 or 94, wherein the nanostructured surface has a substantially azimuthally symmetric power spectral density (PSD) and a wavenumber-PSD product, the substrate having a first refractive index, the backfill material having a second refractive index, the wavenumber-PSD product having a maximum for a wavenumber larger than 6 radians/micrometer times a larger of the first and second refractive indices, wherein for all wavenumbers less than 6 radians/micrometer times the larger of the first and second refractive indices, the wavenumber-PSD product is no more than 0.3 times the maximum.

Embodiment 98 is the method of any one of Embodiments 89, 90 or 94, wherein the substrate comprises an organic light emitting diode device.

Embodiment 99 is the method of any one of Embodiments 89, 90 or 94, wherein the disposing the mask step comprises: coating a mixture comprising nanoparticles dispersed in a binder onto the substrate; and dying or curing the mixture.

Embodiment 100 is the method of any one of Embodiments 89, 90 or 94, wherein the disposing the mask step comprises: printing a first mixture comprising nanoparticles dispersed in a binder onto a first region of the substrate; printing a second mixture comprising nanoparticles dispersed in a binder onto a second region of the substrate; and drying or curing the first and second mixtures.
wherein the second mixture has a distribution of nanoparticles different from that of the first mixture.

Embodiment 101 is the method of Embodiment 100, wherein the first mixture has a first average size of nanoparticles and the second mixture has a different second average size of nanoparticles.

Embodiment 102 is the method of Embodiment 100, wherein the first mixture has a first loading of nanoparticles and the second mixture has a different second loading of nanoparticles.

Embodiment 103 is the method of any one of Embodiments 89, 90 or 94, wherein the disposing the mask step comprises solution coating or vapor coating a discontinuous inorganic layer.

Embodiment 104 is the method of any one of Embodiments 89, 90 or 94, wherein the substrate comprises a release liner and a transfer layer disposed on the release liner.
wherein the disposing the mask step comprises disposing the mask onto the transfer layer, and wherein the openings extend into but not through the transfer layer.

Embodiment 105 is the method of any one of Embodiments 89, 90 or 94, wherein the substrate comprises a release liner, a transfer layer and a polymeric layer, and the providing the substrate step comprises:
providing the release liner,
coating the transfer layer onto the release liner,
depositing a monomer onto the transfer layer, and
curing the monomer to form the polymeric layer on the transfer layer,
wherein the disposing step comprises disposing the mask onto the polymeric layer, and wherein the openings do not extend into the liner.

Embodiment 106 is the method of any one of Embodiments 89, 90 or 94, wherein the substrate comprises a release liner and a polymeric layer, and the providing the substrate step comprises:
providing the release liner,
depositing a monomer on the release liner,
curing the monomer to form the polymeric layer on the release liner,
wherein the disposing the mask step comprises disposing the mask onto the polymeric layer, and wherein the openings extend into but not through the polymeric layer.

Embodiment 107 is the method of Embodiment 106, wherein the substrate further comprises an inorganic layer, and the providing the substrate step comprises depositing the inorganic layer onto the polymeric layer.

Embodiment 108 is the method of Embodiment 107, wherein the inorganic layer is an etch stop layer.

Embodiment 109 is the method of Embodiment 107, wherein the inorganic layer is a barrier layer.

Embodiment 110 is the method of Embodiment 107, further comprising depositing a second monomer onto the inorganic layer and curing the second monomer to form a second polymeric layer.

Embodiment 111 is the method of any one of Embodiments 89, 90 or 94, wherein the substrate comprises an inorganic layer disposed between two polymeric layers.

Embodiment 112 is the method of Embodiment 89 or 90, further comprising applying an optically clear adhesive onto the backfill material opposite the nanostructured substrate.

Embodiment 113 is the method of Embodiment 94, further comprising applying an optically clear adhesive onto the seal layer opposite the nanostructured substrate.

Embodiment 114 is the method of Embodiment 112 or 113, further comprising disposing a release liner onto the optically clear adhesive.

Embodiment 115 is the method of Embodiment 114, further comprising attaching the optically clear adhesive onto an encapsulant layer of an organic light emitting diode device such that the nanostructured surface is proximate to and outside of an evanescent zone of an emissive layer of the organic light emitting diode device.

Embodiment 116 is the method of Embodiment 107, wherein the etching the masked substrate step comprises reactive ion etching.

Embodiment 117 is the method of Embodiment 116, wherein the reactive ion etching step comprises utilizing a reactive ion chemistry comprising oxygen gas.

Embodiment 118 is the method of Embodiment 117, wherein the reactive ion chemistry further comprises a gas containing one or both of argon and a fluorine-containing molecule.

Embodiment 119 is the method of any one of Embodiments 89, 90 or 94, further comprising, after the etching the masked substrate step and before the backfilling step, etching the mask to at least partially remove the mask.

Embodiment 120 is the method of any one of Embodiments 90 or 94, further comprising, after the etching the masked substrate step and before the backfilling step, etching the mask to remove the mask.

Embodiment 121 is the method of Embodiment 119 or 120, wherein the etching the mask step comprises plasma etching with fluorine-containing gas.

Embodiment 122 is the method of Embodiment 121, wherein the plasma etching step comprises remote plasma etching.

Embodiment 123 is the method of Embodiment 122, wherein the plasma etching step comprises reactive ion etching.

Embodiment 124 is the method of Embodiment 121, wherein the etching the masked substrate step comprises oxygen plasma etching.

Embodiment 125 is the method of any one of Embodiments 89, 90 or 94, further comprising crosslinking the backfill material to form the backfill layer.

Embodiment 126 is the method of any one of Embodiments 89, 90 or 94, wherein the backfilling step comprises vapor depositing the backfill material to form the backfill layer.

Embodiment 127 is a method comprising the steps of:
providing a substrate:
disposing a mask on the substrate;
etching the masked substrate to form openings through the mask into the substrate thereby forming a replication tool comprising a nanostructured substrate having a nanostructured surface comprising a plurality of nanostructures having an average center-to-center spacing no more than 2000 nm, each nanostructure having an average height greater than an average lateral dimension of the nanostructures, the average lateral dimension being no more than 50 nm;
casting a curable composition against the nanostructured surface of the nanostructured layer,
curing the curable composition to provide a structured layer, and
removing the tool from the structured layer,
wherein the nanostructured surface has a substantially azimuthally symmetric power spectral density (PSD) and a wavenumber-PSD product, the substrate having a first refractive index, the backfill material having a second refractive index, the wavenumber-PSD product having a maximum for a wavenumber larger than 6 radians/micrometer times a larger of the first and second refractive indices, wherein for all wavenumbers less than 6 radians/micrometer times the larger of the first and second refractive indices, the wavenumber-PSD product is no more than 0.3 times the maximum.

Embodiment 128 is the method of Embodiment 127, further comprising, after the etching step and before the casting step, applying a release coating onto the nanostructured surface of the nanostructured layer to provide a release coated nanostructured surface and the casting step comprises casting the curable composition directly onto the release coated surface.

Embodiment 129 is the method of Embodiment 127, further comprising removing the mask after the etching step and before the casting step.

Embodiment 130 is the method of Embodiment 127, wherein the casting step comprises casting the curable compositing over the mask onto the nanostructured layer.

Embodiment 131 is the method of Embodiment 127, wherein the mask comprises a plurality of nanoparticles.

Embodiment 132 is the method of any one of Embodiments 89, 90, 94, or 127 further comprising disposing a binder between the mask and the substrate.

Embodiment 133 is the method of Embodiment 132, wherein the masked substrate comprises covalent bonds between the mask and the binder.

Embodiment 134 is a nanostructured article comprising:
a first layer comprising a nanostructured surface, the nanostructured surface comprising a plurality of pillars extending from a base surface of the first layer, the pillars having an average height between 280 nm and 510 nm, an average center-to-center spacing between pillars being no more than 310 nm, an average lateral dimension of the plurality of pillars being in a range of 160 nm to 220 nm, each pillar in the plurality of pillars having a polymeric lower portion, an inorganic particle and a binder disposed between the polymeric lower portion and the inorganic particle, the binder covalently bonded to the inorganic particle, the polymeric lower portion between the binder and the base surface, the lower portion having a first refractive index;
a second layer disposed over the plurality of pillars and extending continuously to the base surface, the second layer not being a gas layer or a liquid layer, the second layer having a second refractive index, wherein an absolute value of a difference between the first and second refractive indices is in a range of 0.3 to 0.8.

Embodiment 135 is the nanostructured article of Embodiment 134, wherein the average height of the pillars is between 350 nm and 500 nm.

Embodiment 136 is the nanostructured article of Embodiment 135, wherein the average center-to-center spacing between pillars is in a range of 200 to 300 nm.

Embodiment 137 is an organic light emitting diode display comprising:
an emissive layer, and
the nanostructured article of any one of Embodiments 134 to 136 disposed proximate to and outside of an evanescent zone of the emissive layer.

EXAMPLES

All parts, percentages, ratios, etc. in the examples are by weight, unless noted otherwise. Solvents and other reagents used are available from Sigma-Aldrich Corp., St. Louis, Mo. unless specified differently.

TABLE 1

Materials

| Abbreviation or Trade Designation | Description |
|---|---|
| NSNF | Non-silicone non-fluorinated release liner prepared as in Example 3 of U.S. Pat. No. 7,816,477 |
| SR9003B | propoxylated (2) neopentyl glycol diacrylate available from Sartomer Americas, Exton, PA |
| CN991 | aliphatic urethane acrylate available from Sartomer |
| IRGACURE 184 | UV photoinitiator from BASF |
| TEGO Rad 2250 | radiation-curing substrate wetting, flow and slip additive from Evonik |
| SR833 | Trade designation for tricyclodecane dimethanol diacrylate monomer available from Sartomer |
| DAROCUR 1173 | UV photoinitiator available from BASF |
| CN147 | Urethane acrylate available from Sartomer |
| Silica nanoparticles | 190 nm diameter particles were obtained from Nissan Chemical America, Houston, TX |
| SILQUEST A-174 | Silane curing agent available from Momentive |
| HFPO | Surfactant. Hexafluoropropylene oxide available from Dupont |
| BF | High index backfill (BF) material composed of nanoparticles in acrylate |

TABLE 1-continued

Materials

| Abbreviation or Trade Designation | Description |
|---|---|
| OCA 8146 | Optically Clear Adhesive, 3M Company St. Paul, MN |
| PHOTOMER 6010 | Aliphatic urethane acrylate resin from IGM |
| THF acrylate | Tetrahydrofurfuryl acrylate available from Sartomer as SR285 |
| IRGANOX 1035 | antioxidant and heat stabilizer available from BASF |
| EL022s | OLED Hole Transport Layer (ETL) material available from Hodogoya Chemical |
| EL301 | OLED Electron Blocking Layer (EBL) material available from Hodogova Chemical |
| TPBi | OLED Electron Transport Layer material available from TCI America |
| EML | OLED Emissive Layer (EML) consisting of host mixed with emissive guest molecule at a concentration of about 90 wt % host, 10 wt % guest. For the purpose of these examples composed of host: NS60 and guest IR(ppy)3 |
| NS60 | OLED EML host material, available from Nippon Steel |
| IR(ppy)3 | OLED EML guest material, available from Sigma-Aldrich |
| TCTA | OLED Capping layer 1 material available from Luminescence Technology |
| $MoO_3$ | OLED Capping layer 2 material available from Alfa Aesar |

Nanostructured articles including an etchant layer were made, and nanostructured articles not including an etchant layer were made. FIG. 14 shows a schematic nanostructured article resulting from the Process with Etchant Layer of transferable, substrate-less Wide View Color (WVC) film with etched nanostructures, where the etchant layer refers to first layer 1410. In the Process without Etchant layer, layers 1410 and 1441 are replaced with a single layer (e.g., layer 1610 in FIG. 16A). FIG. 16A shows an example of a portion of the process flow of Process without Etchant Layer. The Process with Etchant Layer is similar to that shown in FIG. 16A except that there is an additional layer between layer 1641 and release liner 1643. The additional layer serves as a transfer layer and layer 1641 serves as the etchant layer.

Both the Process with Etchant Layer and the Process without Etchant Layer provides a submicron-scale nanostructure etched by oxygen plasma using silica nanoparticles (e.g., 1603a) as etch mask (e.g., 1639). The demonstration of nanoparticle coating (e.g., 1603a) on etch or etchant layer (e.g., layer 1410) also means that it is possible to incorporate the etched nanostructures directly onto moisture barrier films (see, e.g., FIG. 15). Details of the Process with Etchant Layer and the resulting film construction are as follows:

1. Liner 1: non-silicone non-fluorinated (NSNF) release liner with peeling force ~48 gram/inch. The peeling force of liner 1 (corresponding to 1443, for example) was smaller than the peeling force of liner 2 (corresponding to 1449, for example) so that liner 1 would act as a relatively easily removable liner that can be removed for attachment of the nanostructured article to the top layer of an OLED.
2. Transfer layer: ~3 µm thick (after UV cure) SR9003B and CN991 in a 80:20 weight ratio. The transfer layer was included to help the etchant layer to adhere to the NSNF liner 1 better and also to serve as a flexible support for the more brittle and rigid etchant layer and backfill layer to prevent cracking in the WVC film stack. The formulation and coating details are as following:
   First, a coating solution was prepared in order to create a transfer layer. A prepolymer blend of propoxylated (2) neopentyl glycol diacrylate and aliphatic urethane acrylate ("SR9003B" and "CN991", respectively) in a 80:20 weight ratio was prepared. The above prepolymer blend (480.92 grams), 1-methoxy-2-propanol (336.15 grams), isopropanol (804.35 grams), IRGACURE 184 (9.83 grams), and TEGO Rad 2250 (0.49 grams) were mixed together to form the coating solution (about 30 wt. % total solids and 2 wt. % photoinitiator, based on total solids).
   The solution was then coated and processed in a manner similar to the process described in WO 2013/116103 (Kolb, et al.) and WO 2013/116302 (Kolb, et al.). The coating solution was delivered at a rate of 36 grams/min to a 10 inch (25.4 cm) wide slot-type coating die. After the solution was coated on a 2 mil non-silicone non-fluorinated (NSNF) liner, it then passed through a three zone air flotation oven where each zone was approximately 6.5 ft (2 m) long and was set at 150° F. (65.5° C.), 190° F. (87.8° C.), and 220° F. (104.4° C.). The substrate moved at a speed of 30 ft/min (15.24 cm/sec) to achieve a wet coating thickness of about 8-10 microns. Finally the dried coating entered a gas purged UV chamber, with an oxygen concentration of <100 ppm, equipped with a UV light source (Model VSP/I600 from Fusion UV Systems Inc., Gaithersburg Md.) using an H bulb.
3. Etch or Etchant layer: An organic multilayer (Organic ML) film was used as an etchant layer. The organic ML include a ~660 nm thick layer of SR833 was coated by vacuum deposition. The refractive index of the etchant layer (see, e.g., first layer 1410 of FIG. 14) and transfer layer (see, e.g., layer 1441) was ~1.5 which is similar to the index of the binder resin (see, e.g., 1203c depicted in FIG. 12B) and the silica nanoparticles (see, e.g., 1203b depicted in FIG. 12B). It has been found that it is useful to index match the etchant and transfer layers with the binder resin and silica nanoparticles because the nanostructure is often partially etched into etchant or transfer layer (when no etchant layer is present; see Process without Etchant layer). The effective aspect ratio of the etched nanostructure will be smaller if the etchant or transfer layer has higher refractive index than the binder resin and silica nanoparticles. The details of the etchant layer processing were as following:

A base polymer layer was deposited in a vacuum coater similar to the coater described in U.S. Pat. No. 5,440,446 (Shaw, et al.) and U.S. Pat. No. 7,018,713 (Padiyath, et al.). The individual layer was formed as follows: The transfer layer coated NSNF film described above was loaded into a roll-to-roll vacuum processing chamber. The chamber was pumped down to a pressure of $2.0 \times 10^{-5}$ Torr. A web speed of 16 ft/min (8.13 cm/sec) was held while maintaining the backside (the uncoated side of the NSNF film) in contact with a coating drum as the film frontside surface (the transfer layer) was treated with a nitrogen plasma at 0.02 kW of plasma power. The film frontside surface was then coated with tricyclodecane dimethanol diacrylate monomer (obtained under the trade designation "SR833s", from Sartomer Americas. Exton, Pa.). The monomer was degassed under vacuum to a pressure of 20 mTorr prior to coating, combined with DAROCUR 1173 and CN147 in a 90:4:6 ratio of SR833s. The DAROCUR 1173: CN147, loaded into a syringe pump, and pumped at a flow rate of 1.2 mL/min through an ultrasonic atomizer operating at a frequency of 60 kHz into a heated vaporization chamber maintained at 500° F. (260° C.). The resulting monomer vapor stream condensed onto the film surface and was crosslinked by exposure to ultra-violet radiation from mercury amalgam UV bulbs (Model MNIQ 150/54 XL, Heraeus, Newark N.J.) to form an approximately 660 nm thick base polymer layer.

4. Submicron-scale nanostructures: The nanostructures were formed by means of oxygen plasma etching using $SiO_2$ nanoparticles as an etch mask. The binder resin (e.g., 1203c depicted in FIG. 12B) was anisotropic selectively etched by oxygen plasma leaving spherical or columnar nanostructures in the etchant layer. It was found that the etch depth and pitch size are significant factors affecting the wide view color performance of the film construction on OLED devices. The etch depth was controlled by plasma etch time under certain etching conditions. The pitch size was determined by the size of silica nanoparticles and wt % loading of silica nanoparticles in binder resin.

Anisotropic nanostructures were obtained by using the plasma treatment system described in U.S. Pat. No. 5,888,594 (David et al.) with some modifications. The width of the drum electrode was increased to 42.5 inches (108 cm) and the separation between the two compartments within the plasma system was removed so that all the pumping was carried out by means of turbo-molecular pumps.

Rolls of polymeric film were mounted within the chamber, the film wrapped around the drum electrode and secured to the take up roll on the opposite side of the drum. The unwind and take-up tensions were maintained at 6 pounds, and 12 pounds respectively. The chamber door was closed and the chamber pumped down to a base pressure of $5 \times 10^{-4}$ Torr. A gas mixture of oxygen combined was introduced into the chamber at a flow rate of 100 standard $cm^3$/minute. Plasma was turned on at a power of 7500 watts by applying-radio frequency power to the drum and the drum rotation initiated so that the film was transported at a speed of 5 ft/min, corresponding to an etching time of 60 seconds. The chamber pressure was in the 1-3 mTorr range during the etching step.

In this particular example, 190 nm diameter $SiO_2$ nanoparticles we utilized with 45 wt u in the binder resin (SR9003B and CN991 in 80:20 weight ratio). The coating thickness was 220 nm, which ensured single layer coating and thus controllable surface coverage of the nanoparticles and etched nanostructures (see, e.g. FIG. 20A). The oxygen plasma etch times were 60 seconds, 90 seconds, or 120 seconds to achieve different etch depths. The 60-second etch resulted in a etch depth around 350 nm (see, e.g., FIG. 20C).

4a. Surface modified silica nanoparticles. Dispersions of spherical silica nanoparticles with nominal diameter of 190 nm were obtained from Nissan Chemical America, Houston, Tex. The silica nanoparticles were ion-exchanged and then surface modified, solvent exchanged and concentrated, resulting in ~50 wt % SILQUEST A-174 modified 190 nm silica dispersion in 1-methoxy-2-propanol.

4b. Binder resin for silica nanoparticles. In the Process with Etchant Layer, the binder resin was SR9003B and CN991 in 80:20 weight ratio. Coating formulation with 4% solid was prepared by mixing A-174 modified 190 nm silica dispersion in 1-methoxy-2-propanol, binder resin of SR9003B and CN991 in 80:20 weight ratio, and solvent of 1-methoxy-2-propanol and isopropanol alcohol in 50:50 weight ratio. 2 wt % u of photo initiator IRGACURE 184 and 0.02 wt % of surfactant HFPO were also added to the coating formulation to help UV curing and improve coating quality, respectively. The silica nanoparticles were approximately 45% in weight in the particle-containing layer (nanoparticles+binder resin) after solvents were evaporated. The thickness of this layer was 220 nm after curing.

Figure 20A:
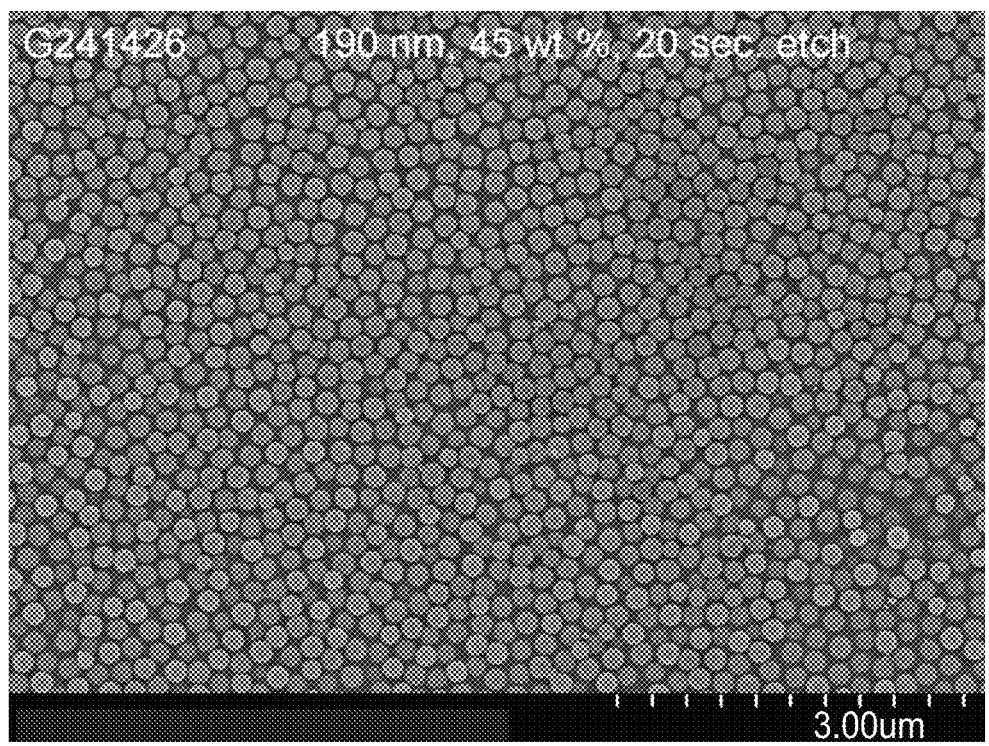
FIG. 20A is a top view scanning electron microscopy (SEM) image of an etched nanostructure after a 20 second etch time.
Figure 20B:
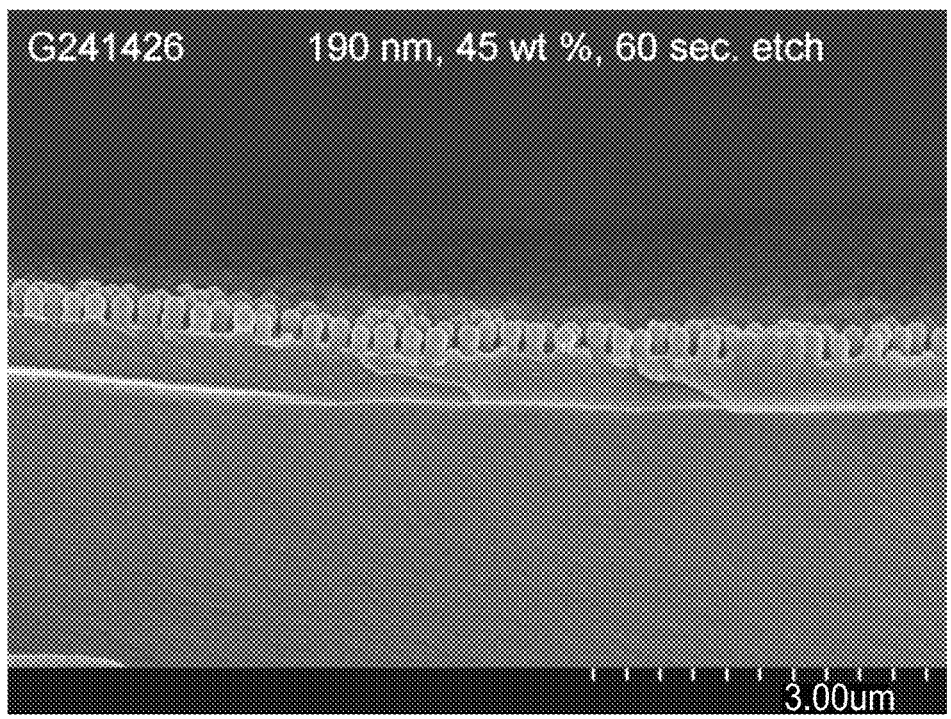
FIG. 20B is a cross-sectional side view SEM image of an etched nanostructure after a 60 second etch time.
Figure 20C:
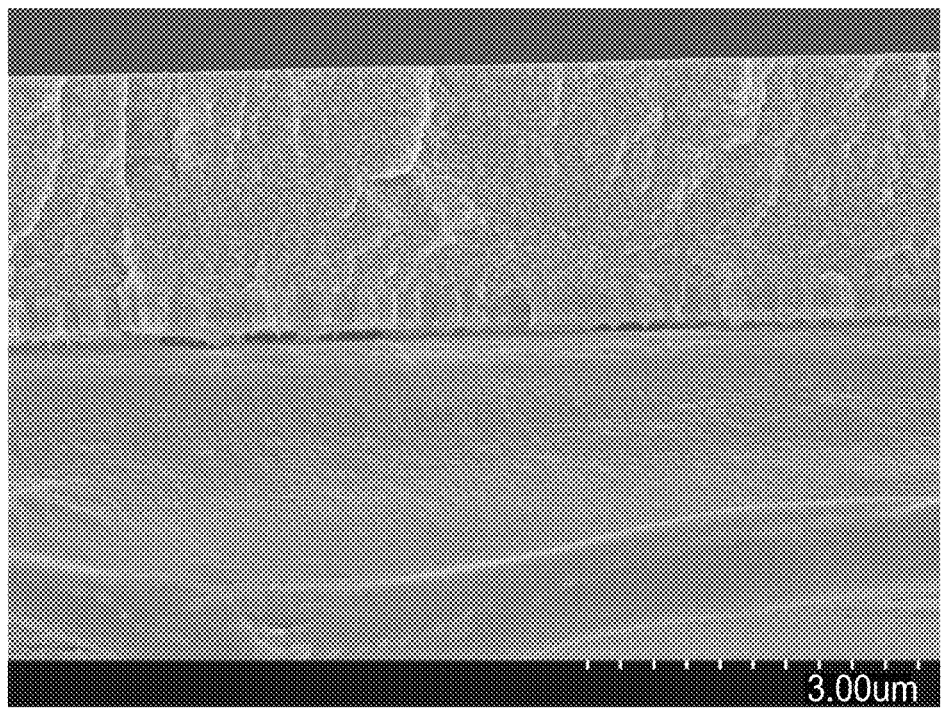
FIG. 20C is a cross-sectional side view SEM image of the etched nanostructure of FIG. 20B after the nanostructure has been backfilled.

5. High index backfill layer: a nanoparticle filled acrylate with ~2.5 μm in thickness with refractive index around 1.79, die coated on etched nanostructures (4). FIG. 20C shows SEM cross section view of etched nanostructure after backfill. The backfill completely filled the etched nanostructures, and no cracks, voids and loose nanoparticles were found.

6. 3M optical clear adhesive (OCA): 3M OCA 8146 with 1 mil thickness was laminated on high index backfill layer.

7. Liner 2: OCA tight liner with peeling force around 50 gram/inch.

FIG. 1 illustrates how a wide view color enhancement film (e.g. nanostructured article 101) can be applied between an OLED device (e.g., OLED stack 131) and top layer (e.g., circular polarizer 111). Many top layers used in an OLED come with an OCA. The transfer layer side can be attached to the top layer first after releasing the easy liner 1. Then the backfill side can be attached to OLED device after releasing tight liner 2. This sequence is desirable because it ensures closely contact of etched nanostructure to OLED light emitting layers.

In the Process without Etchant layer, the etchant layer was eliminated as compared to previous process, and the Resin 1 material (see Table 2) was used as both transfer layer and binder resin. The nanostructures generated by the oxygen plasma etching process are substantially similar to those of Process with Etchant Layer. Details of the Process without Etchant Layer and the resulting film construction are as follows:

1. Liner 1: non-silicone non-fluorinated (NSNF) release liner with peel force ~8 gram/inch.

2. Transfer layer: ~6 µm thick Resin 1 die-coated on NSNF liner 1. The refractive index of Resin 1 was ~1.5 and the components of Resin 1 were as follows in Table 2:

TABLE 2

Components for Resin 1

| Component | Percent |
|---|---|
| PHOTOMER 6010 | 93.16% |
| THF acrylate | 5.01% |
| IRGANOX 1035 | 0.83% |
| DAROCUR 1173 | 0.99% |
| TOTAL | 100.00% |

3. Submicron-scale nanostructures: same 190 nm $SiO_2$ nanoparticles, 45 wt %, and 60 seconds plasma etched nanostructures as in Process with Etchant Layer
3a. Surface modified silica nanoparticles: same as in Process with Etchant Layer
3b. Binder resin for silica nanoparticles. In Process without Etchant layer, the binder resin was Resin 1. The solvent was isopropanol alcohol and 1-methoxy-2-propanol in 98:2 weight ratio. 2 wt % of photo initiator IRGACURE 184 and 0.02 wt % of surfactant HFPO were also added to the coating formulation.
4. High index backfill: same as in Process with Etchant Layer
5. 3M optical clear adhesive (OCA): 1 mil 8146 3M OCA laminated on high index backfill layer.
6. Liner 2: OCA tight liner with peering force around 50 gram/inch.

OLED Fabrication Process:

Green light strong cavity, top-emitting OLEDs were prepared by vacuum thermal evaporation of organic and metallic materials in high vacuum (<1×10$^{-6}$ Torr) on top of patterned anode-coated glass substrates. The anode construction was prepared by a first thermal evaporation of Chromium to a nominal thickness of 2 nm, a second thermal evaporation was deposited Aluminum to a nominal thickness of about 100 nm. Lastly an Indium Tin Oxide layer (ITO) layer was sputtered to a nominal thickness of 22 nm. An OLED with the following layer structure was then deposited through a shadow mask to define 5 mm×5 mm square pixels: hole transport layer (HTL) 150 nm/electron blocking layer (10 nm)/emissive layer (EML) 30 nm/electron transport layer (ETL) 50 nm/LiF (2 nm)/Ag:Mg (24 nm)/capping layer 1 (60 nm)/capping layer 2 (400 nm). The EML consisted of a host mixed with an emissive guest molecule, at a concentration of about 90 wt. % host, 10 wt. % guest. Examples of representative materials for each layer are given in Table 3.

TABLE 3

Example OLED materials

| Layer | Example material |
|---|---|
| Hole Transport Layer (HTL) | EL022s, Hodogoya Chemical |
| Electron Blocking Layer (EBL) | EL301, Hodogoya Chemical |
| Emissive Layer (EML) | Host: NS60, Nippon Steel, Guest: Ir(ppy)3 |
| Electron Transport Layer (ETL) | TPBi, TCI America |
| Capping layer 1 | TCTA, Luminescence Technology |
| Capping Layer 2 | $MoO_3$, Alfa Aesar |

OLED Test Method:

OLED devices were tested for axial optical and electrical performance with a Photoresearch Spectrascan PR650 spectroradiometer in conjunction with a Keithley 2400 source-measurement unit providing current and voltage source and measurement. Angular characteristics of the OLEDs were measured by rotating the devices relative to pixel normal direction and measuring spectral and brightness characteristics with the PR650 instrument. From these measurements we may derive color shift characteristics using collected angular spectra and by calculation of the CIE 1976 color coordinates (L, u',v'). From these coordinates, the magnitude of change in u'v' color coordinate is given by:

$$\text{delta } u'v' = \sqrt{(u'_i - u'_o)^2 + (v'_i - v'_o)^2}, \text{ where}$$

$\{u'_o, v'_o\}$ is the color coordinate at normal viewing angle (0 deg) and
$\{u'_i, v'_i\}$ is the color coordinate at the $i^{th}$ viewing angle.

Figure 20D:
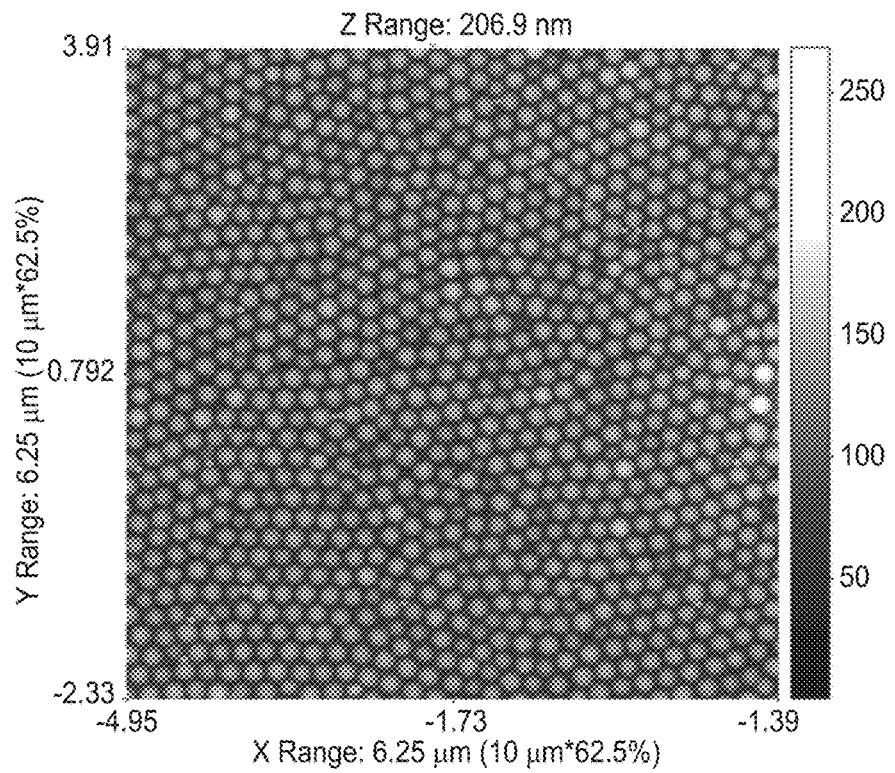
FIG. 20D is a top view atomic force microscopy (AFM) image of an etched nanostructure after a 20 second etch time.
Figure 20E:
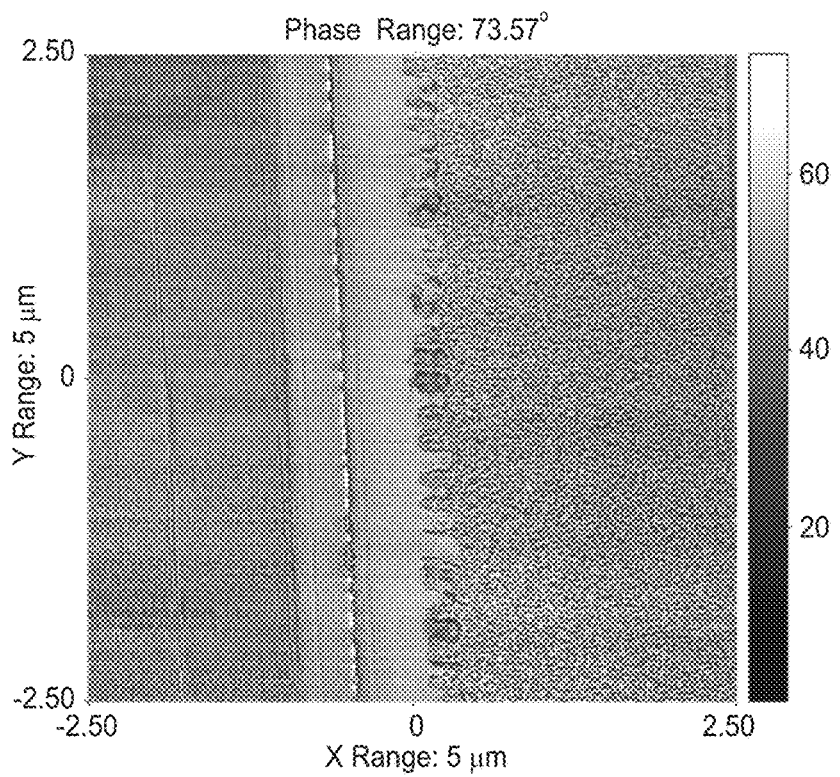
FIG. 20E is a cross-sectional side view AFM image of an etched nanostructure after a 60 second etch time after the nanostructure has been backfilled.

Power Spectral Density (PSD) Calculation Test Method:

The calculation of the Power Spectral Density was based on measurements of the physical nanostructure generated by the masking and etch processes used to make the Wide View Color correction film. Atomic force microscopy (AFM) was used in measuring the geometry of the nanostructures which was used in determining the PSD. Scanning electron microscopy (SEM) images were also obtained. SEM and AFM images of an etched nanostructure after a 20 second etch time are shown in FIGS. 20A and 20D, respectively. A cross-sectional side view SEM image of an etched nanostructure after a 60 second etch time before and after backfilling is shown in FIGS. 20B and 20C, respectively, and a cross-sectional side view AFM image of an etched nanostructure after a 60 second etch time and after backfilling is shown in FIG. 20E. AFM was used to measure the plan (i.e. top) view to determine the locations and diameters of the post-like structures. AFM was also used to measure cross-sectional depths from samples of differing etch times, etchant layers, etc. The resulting composed 3D surface construct included column position, size, shape and depth for a 10 micron by 10 micron region as determined by scan regions. This topographic height field was then analytically Fourier transformed to generate a PSD for the particular sample.

Figure 21:
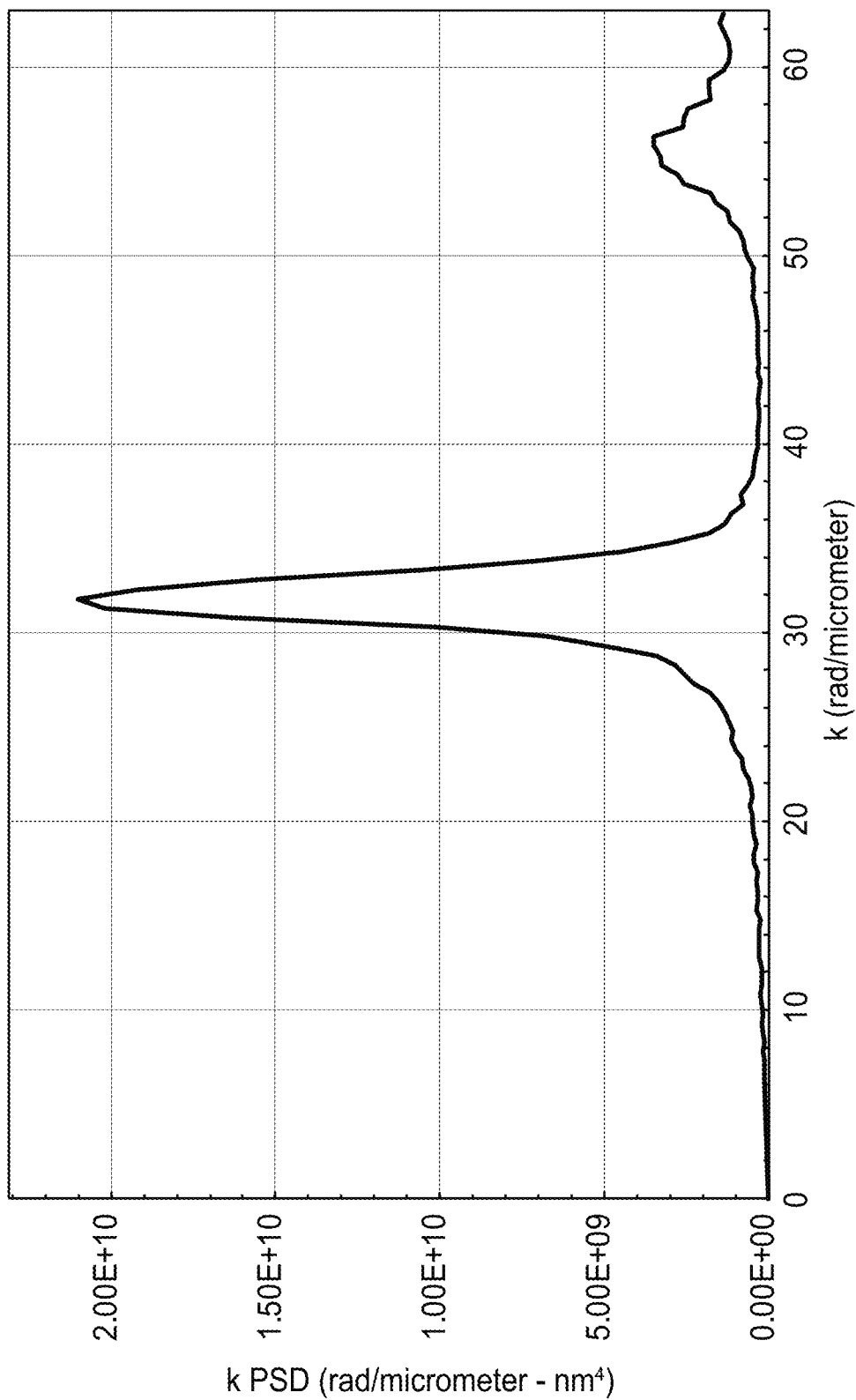
FIGS. 21-22 are plots of wavenumber-PSD products versus wavenumber.
Figure 22:
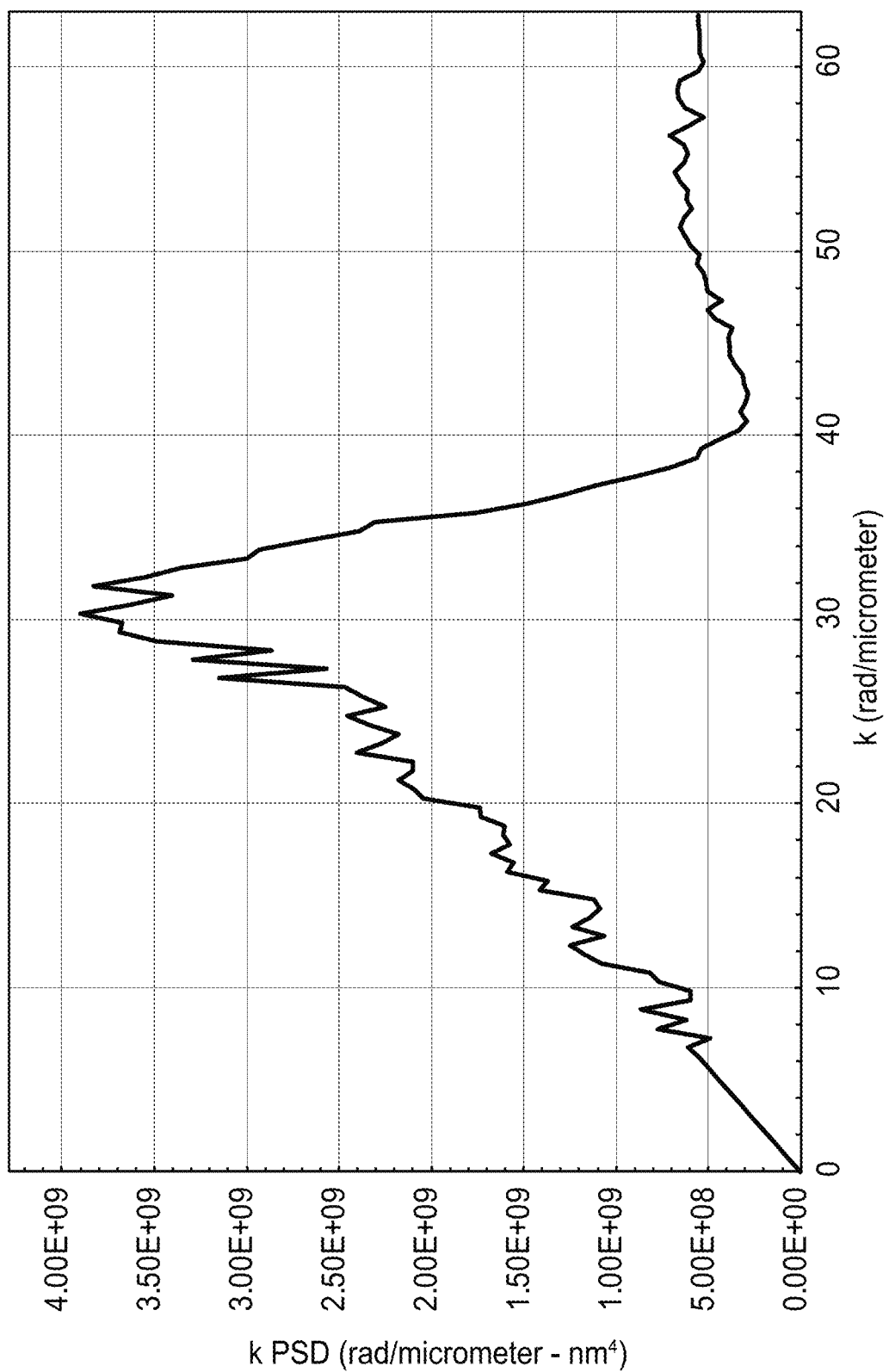

Because the AFM image size was limited, the PSD was azimuthally averaged and a k*PSD (wavenumber-PSD) product was calculated as a metric for the nanostructure. As previously described, the peak for the k*PSD preferably (for wide view color correction applications) occurs for wavenumber greater than a "cut-off" wavenumber given as 6 times the maximum index of refraction (n). This "cut-off" wavenumber is tabled along other PSD calculated metrics in Table 6. Metrics tabled in exemplary results include both the maximum or peak value of k*PSD as well as the wavenumber of this maximum peak. Also as mentioned previously, it is often desirable that the maximum value of k*PSD for wavenumbers less than this cut-off wavenumber (6 times the maximum index of refraction) should be <30% of the peak value for k*PSD. So, another tabled metric is the maximum k*PSD number calculated for wavenumbers below the cut-off wavenumber. Lastly, the table includes a metric for the ratio of maximum k*PSD for wavenumbers below the cut-off to the peak value of k*PSD for the full spectrum. Example k*PSD versus k plot is provided in FIGS. 21-22 for samples made according to Examples 1 and 3, respectively.

Overview of Examples

To evaluate the impact of the plasma etched nanostructures and the influence of the refractive index difference between the etched features and the backfill material as well as structure depths, four examples PET-film based etched nanostructure constructions were prepared and applied to top-emitting, strong-cavity OLEDs and comparison data was measured against measurements of the OLED control samples without nanostructured film. Because OLED color response varies significantly from different fabrication runs, each of the reported examples represents average of several samples pulled from same OLED fabrication run. For each example, (8) substrates from same runs were allocated as (4) control samples (having only glass coversheet) and (4) with film laminations and glass coversheet. The 8 samples were then all measured on the same day.

The examples that follow illustrate the effect of filling the nanostructure with either (a) high index or low index material (Examples 1, 2 etched into PET) or structures of increasing depth (Examples 3, 4 and 5 etched into organic multi-layer). More particularly, Example 1 and 2 compare high index filled to air-filled structures of the same etch depth whereas Examples 3, 4 and 5 show effect of increasing the etch depth while keeping same high index back fill material as a constant.

Comparative Examples 1, 2, 3 (CE-1, CE-2, CE-3)

As non-nanostructured controls. CE-1, 2, 3 sample measurements were each average results from 4 OLED samples from same fabrication run as their counterpart examples with nanostructured films. More specifically, for comparative Example 1 (CE-1), 4 samples were fabricated from the same OLED fabrication run as Examples 1 and 2 and then tested the same day as Examples 1 and 2. For comparative Example 2 (CE-2), 4 samples were fabricated from the same OLED fabrication run as Example 3 and 4 and was subsequently tested the same day as Example 3 and 4. For comparative Example 3 (CE-3), 4 samples were fabricated from the same OLED fabrication run as Example 5 and then tested the same day as Example 5.

Example 1: High Index Filled Etched Nanostructures on PET, 60 s Etch

The high index back filled (BF) construction with 60 second etch had the structure: PET/resin with 190 nm $SiO_2$ nanoparticles, prepared and etched as in Process without Etchant Layer using a 60 second etch time. Since no separate etchant layer was used, the structure was etched into the PET layer as indicated in Table 4. This structure was then filled with high index back fill material of nanoparticle filled acrylate (n=1.79). 3M OCA 8146 was laminated to the surface of the high index back fill material to complete the construction.

The high index back filled (BF) construction of Example 1 was laminated to an OLED device, described previously, by first peeling the liner from the OCA 8146 layer and subsequently laminating to the capping layer 2 surface of the OLED device (for example, in FIG. 1 capping layer 2 corresponds to an upper layer in OLED stack 131 and the OCA 8146 layer corresponds to inner layer 134).

Example 2: Air Filled Etched Nanostructures on PET, 60 s Etch

An air-filled construction with 60 second etch was prepared comparably to Example 1 with the following construction: PET/resin with 190 nm $SiO_2$ nanoparticles prepared and etched as in Process without Etchant Layer with etch time of 60 seconds. In contrast to Example 1, the nanostructures of Example 2 were air filled, and 3M OCA 8146 was laminated to the PET to complete the construction. In this case, rather than a high index material of n=1.79 (as in Example 1) filling the structure, the filling index of refraction was low (n=1.0).

The air-filled construction of Example 2 was then laminated to an OLED device, described previously, by first peeling the liner from the OCA 8146 layer and subsequently laminating to the capping layer 2 surface.

Example 3: High Index Filled Etched Nanostructures on PET, 60 s Etch

The high index back filled (BF) construction with 60 second etch had the structure: PET/resin with 190 nm $SiO_2$ nanoparticles, prepared and etched as in Process with Etchant Layer using a 60 second etch time. As with example 1, this structure was then filled with high index back fill material of nanoparticle filled acrylate (n=1.79). 3M OCA 8146 was laminated to the surface of the high index back fill material to complete the construction.

The high index back filled construction of Example 3 was then laminated to an OLED device, described previously, by first peeling the liner from the OCA 8146 layer and subsequently laminating to the capping layer 2 surface of the OLED device.

Example 4: High Index Filled Etched Nanostructures on PET, 90 s Etch

The high index back filled (BF) construction with 90 second etch had the structure: PET/resin with 190 nm $SiO_2$ nanoparticles, prepared and etched as in Process with Etchant Layer using a 90 second etch time. As with example 1, this structure was then filled with high index back fill material of nanoparticle filled acrylate (n=1.79). 3M OCA 8146 was laminated to the surface of the high index back fill material to complete the construction.

The high index back filled construction of Example 4 was then laminated to an OLED device, described previously, by first peeling the liner from the OCA 8146 layer and subsequently laminating to the capping layer 2 surface of the OLED device.

Example 5: High Index Filled Etched Nanostructures on PET, 120 s Etch

The high index back filled construction with 120 second etch had the structure: PET/resin with 190 nm $SiO_2$ nanoparticles, prepared and etched as in Process with Etchant Layer and a 120 second etch time. As with example 1, this structure was then filled with high index back fill material of nanoparticle filled acrylate (n=1.79). 3M OCA 8146 was laminated to the surface of the high index back fill material to complete the construction.

The high index back filled construction of Example 5 was laminated to an OLED device, described previously, by first peeling the liner from the OCA 8146 layer and subsequently laminating to the capping layer 2 surface of the OLED device.

Measurement Results:

Table 4 shows dimensions and optical backfill for Wide View Color (WVC) film examples (average and standard deviation of the dimensions are listed). The dimensions were measured from atomic force microscopy (AFM) images of plan and cross-sectional views. Refractive index of high index fill material was measured at 632 nm via conventional ellipsometric techniques.

As to be expected, the example nanostructure constructions (Examples 1-5) showed minimal impact on the current-voltage properties of the device, axial brightness or efficiency at any of the current density or brightness ranges probed. As a result, the comparison data focuses on the color shift measurements.

As can be seen in Table 5, comparison of high index back filled (Example 1) and air filled nanostructures (Example 2) against control CE-1 shows that both high index back filled and air filled structures showed significant improvement of color shift when compared to the control.

Examples 1, 3, 4 and 5 provided high index filled constructions with differing nanostructure depths as controlled by etch times of 60 seconds (Examples 1 and 3), 90 seconds (Example 4) and 120 seconds (Example 5). As can be seen from Table 5, the 90 second etch time samples (Example 4) showed improved color shift at all viewing angles, and showed larger margins of color shift improvement than the sample made with 60 second etch (Example 3). Likewise, the 120 second etch time samples (Example 5) showed improved color shift at all viewing angles, and showed larger margins of color shift improvement than the sample made with 90 second etch (Example 4). The measurement results indicate a strong relationship between etch time (and etch depth), and color shift reduction.

TABLE 4

Dimensions and optical backfill for Wide View Color (WVC) film examples

| Ex. | Etch time [sec] | Etch layer mat. | Refr. index of fill | Pillar height [nm] (Avg ± $\sigma$) | Pillar top portion (mask) [nm] (Avg ± $\sigma$) | Pillar bottom portion [nm] (Avg ± $\sigma$) | Avg pillar lateral dim [nm] (Avg ± $\sigma$) | Avg pillar spacing [pitch] (Avg ± $\sigma$) |
|---|---|---|---|---|---|---|---|---|
| Exam 1 | 60 | PET | 1.79 | 362 ± 18 | 201 ± 17 | 158 ± 24 | 210 ± 23 | 250 ± 49 |
| Exam 2 | 60 | PET | 1.0 | 362 ± 18 | 201 ± 17 | 158 ± 24 | 210 ± 23 | 250 ± 49 |
| Exam 3 | 60 | Organic ML | 1.79 | 291 ± 36 | 192 ± 19 | 106 ± 23 | 180 ± 20 | 249 ± 89 |
| Exam 4 | 90 | Organic ML | 1.79 | 384 ± 21 | 195 ± 15 | 198 ± 18 | 187 ± 32 | 212 ± 22 |
| Exam 5 | 120 | Organic ML | 1.79 | 470 ± 38 | 177 ± 18 | 293 ± 31 | 187 ± 15 | 261 ± 53 |

TABLE 5

Color Measurements for Wide View Color (WVC) film examples

| | Color shift u'v'/[%] decrease relative to control sample versus Angle of incidence (AOI) | | | |
|---|---|---|---|---|
| Example | AOI = 15° | 30° | 45° | 60° |
| Comp Ex-1 | 0.01052 | 0.0371 | 0.06409 | 0.07525 |
| Exam 1 | 0.00884 | 0.03135 | 0.05343 | 0.05844 |
| | 16.0% | 15.5% | 16.6% | 22.3% |
| Exam 2 | 0.00855 | 0.02963 | 0.04873 | 0.05145 |
| | 18.7% | 20.1% | 24.0% | 31.6% |
| Comp Ex-3 | .00293 | .00867 | .01146 | .01506 |
| Exam 3 | .00236 | .00665 | .00882 | .01728 |
| | 19.4% | 23.3% | 23.0% | −14.8% |
| Comp Ex-4 | 0.00603 | 0.01774 | 0.02746 | 0.02717 |
| Exam 4 | 0.00502 | 0.01402 | 0.01967 | 0.02622 |
| | 16.9% | 21.0% | 28.4% | 3.5% |
| Comp Ex-5 | 0.0046 | 0.01245 | 0.01779 | 0.01687 |
| Exam 5 | 0.00263 | 0.00683 | 0.00923 | 0.013730 |
| | 42.9% | 45.1% | 48.1% | 18.6% |

Table 6 shows calculated Power Spectral Density (PSD) metrics for Wide View Color (WVC) film examples. Each of Example 1-5 had a wavenumber-PSD product having a maximum for a wavenumber larger than 6 radians/micrometer times a larger of the pillar and backfill refractive index, where for all wavenumbers less than 6 radians/micrometer times the larger refractive index, the wavenumber-PSD product was no more than 0.3 times the maximum.

TABLE 6

Calculated Power Spectral Density (PSD) metrics for Wide View Color (WVC) film examples

| Example | "Cut-off" Wavenumber (6 times max. index of refraction) | Max. or Peak value of k*PSD [rad/μm × nm$^4$] | Corresponding Wavenumber for peak value [rad/μm] | Maximum k*PSD for Wavenumbers below "cut-off" [rad/μm × nm$^4$] | Ratio times 100% of k*PSD for Wavenumbers below "cut-off" to peak k*PSD value [%] |
|---|---|---|---|---|---|
| Exam 1 | 10.74 | $2.10 \times 10^{10}$ | 31.8 | $\sim 2 \times 10^8$ | ~1% |
| Exam 2 | 9.0 | $2.10 \times 10^{10}$ | 31.8 | $\sim 2 \times 10^8$ | ~1% |
| Exam 3 | 10.74 | $4.86 \times 10^9$ | 29.2 | $9.0 \times 10^8$ | 18.5% |
| Exam 4 | 10.74 | $8.3 \times 10^9$ | 29.0 | $1.2 \times 10^9$ | 14.4% |
| Exam 5 | 10.74 | $1.24 \times 10^{10}$ | 28.1 | $1.7 \times 10^9$ | 13.7% |

Table 7 gives the standard deviation in pillar heights divided by the average (mean) pillar height times 100 percent determined for an area of the sample measuring 10 micrometers by 10 micrometers.

TABLE 7

| Example | Standard deviation in height of pillars divided by average height times 100 percent |
|---|---|
| Example 1 | 5.0 |
| Example 2 | 5.0 |
| Example 3 | 12.4 |
| Example 4 | 5.5 |
| Example 5 | 8.1 |

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A nanostructured article comprising:
a first layer comprising a nanostructured surface, the nanostructured surface comprising a plurality of pillars extending from a base surface of the first layer, the pillars having an average height greater than an average lateral dimension of the pillars, an average center-to-center spacing between pillars being no more than 2000 nm, the average lateral dimension being no less than 50 nm, each pillar in the plurality of pillars having at least a lower portion and an upper portion, the lower portion between the upper portion and the base surface, the upper and lower portions having differing compositions, the lower portion having a first refractive index;
a second layer disposed over the plurality of pillars and extending continuously to the base surface, the second layer having a second refractive index; and
an optional seal layer disposed on the second layer opposite the first layer, the nanostructured article including the seal layer if the second layer is a gas layer or a liquid layer, wherein an absolute value of a difference between the first and second refractive indices is in a range of 0.1 to 1.5, wherein the nanostructured surface has a power spectral density (PSD) and a wavenumber-PSD product, the wavenumber-PSD product having a maximum for a wavenumber larger than 6 radians/micrometer times a larger of the first and second refractive indices, and wherein for all wavenumbers less than 6 radians/micrometer times the larger of the first and second refractive indices, the wavenumber-PSD product is no more than 0.3 times the maximum.

2. The nanostructured article of claim 1, comprising the seal layer.

3. The nanostructured article of claim 2, wherein the seal layer comprises a plasma deposited thin film.

4. The nanostructured article of claim 2, wherein the second layer is a gas layer or a liquid layer.

5. The nanostructured article of claim 1, wherein for any first wavevector having a first magnitude between 10 radians/micrometer times the larger of the first and second refractive indices and 13 radians/micrometer times a sum of the larger of the first and second refractive indices and 0.8, a maximum difference between a local average of the power spectral density at the first wavevector is between 0.7 and 1.3 times an annular average of the power spectral density at the first wavevector, the local average being an average of the power spectral density over an annular sector in Fourier space centered on the first wavevector and having an inner radius of 0.9 times the first magnitude, an outer radius of 1.1 times the first magnitude, and a subtended angle of 60 degrees, the annular average being an average of the power spectral density over an annulus in Fourier space having an inner radius of 0.9 times the first magnitude and an outer radius of 1.1 times the first magnitude.

6. The nanostructured article of claim 1, further comprising a plurality of layers disposed adjacent the first layer opposite the second layer, the plurality of layers including an inorganic layer disposed between two polymeric layers.

7. The nanostructured article of claim 1, wherein the lower portion comprises polymeric material at no less than 60 weight percent and the upper portion comprises inorganic material at no less than 80 weight percent.

8. An organic light emitting diode display comprising an emissive layer and the nanostructured article of claim 1 disposed proximate to and outside of an evanescent zone of the emissive layer.

9. A nanostructured article comprising:
a nanostructured layer having a nanostructured surface comprising a plurality of protrusions and a plurality of depressions, the nanostructured layer not being a gas layer or a liquid layer;
an etching mask disposed on the nanostructured surface; and
a backfill material disposed over the etching mask and extending through the etching mask into the plurality of depressions, the backfill material forming a backfill layer not being a gas layer or a liquid layer, wherein the nanostructured layer has a first refractive index, the backfill material has a second refractive index, and the nanostructured surface has a power spectral density (PSD) and a wavenumber-PSD product, the wavenumber-PSD product having a maximum for a wavenumber larger than 6 radians/micrometer times a larger of the first and second refractive indices, and wherein for all wavenumbers less than 6 radians/micrometer times the larger of the first and second refractive indices, the wavenumber-PSD product is no more than 0.3 times the maximum.

10. The nanostructured article of claim 9, wherein for any first wavevector having a first magnitude between 10 radians/micrometer times the larger of the first and second refractive indices and 13 radians/micrometer times a sum of the larger of the first and second refractive indices and 0.8, a maximum difference between a local average of the power spectral density at the first wavevector is between 0.7 and 1.3 times an annular average of the power spectral density at the first wavevector, the local average being an average of the power spectral density over an annular sector in Fourier space centered on the first wavevector and having an inner radius of 0.9 times the first magnitude, an outer radius of 1.1 times the first magnitude, and a subtended angle of 60 degrees, the annular average being an average of the power spectral density over an annulus in Fourier space having an inner radius of 0.9 times the first magnitude and an outer radius of 1.1 times the first magnitude.

11. The nanostructured article of claim 9, further comprising a binder disposed between the etching mask and the nanostructured surface, wherein the etching mask is covalently bonded to the binder.

12. The nanostructured article of claim 9, wherein the etching mask comprises a discontinuous inorganic layer.

13. An organic light emitting diode display comprising an emissive layer and the nanostructured article of claim 9 disposed proximate to and outside of an evanescent zone of the emissive layer.

14. A nanostructured article comprising:
a first layer comprising a nanostructured surface, the nanostructured surface comprising a plurality of pillars extending from a base surface of the first layer, the pillars having an average height between 280 nm and 510 nm, an average center-to-center spacing between pillars being no more than 310 nm, an average lateral dimension of the plurality of pillars being in a range of 160 nm to 220 nm, each pillar in the plurality of pillars having a polymeric lower portion, an inorganic particle and a binder disposed between the polymeric lower portion and the inorganic particle, the binder covalently bonded to the inorganic particle, the polymeric lower portion between the binder and the base surface, the polymeric lower portion having a first refractive index; and
a second layer disposed over the plurality of pillars and extending continuously to the base surface, the second layer having a second refractive index,
wherein an absolute value of a difference between the first and second refractive indices is in a range of 0.3 to 0.8,
wherein the nanostructured surface has a power spectral density (PSD) and a wavenumber-PSD product, the wavenumber-PSD product having a maximum for a wavenumber larger than 6 radians/micrometer times a larger of the first and second refractive indices, and wherein for all wavenumbers less than 6 radians/micrometer times the larger of the first and second refractive indices, the wavenumber-PSD product is no more than 0.3 times the maximum.

15. The nanostructured article of claim 14, wherein for any first wavevector having a first magnitude between 10 radians/micrometer times the larger of the first and second refractive indices and 13 radians/micrometer times a sum of the larger of the first and second refractive indices and 0.8, a maximum difference between a local average of the power spectral density at the first wavevector is between 0.7 and 1.3 times an annular average of the power spectral density at the first wavevector, the local average being an average of the power spectral density over an annular sector in Fourier space centered on the first wavevector and having an inner radius of 0.9 times the first magnitude, an outer radius of 1.1 times the first magnitude, and a subtended angle of 60 degrees, the annular average being an average of the power spectral density over an annulus in Fourier space having an inner radius of 0.9 times the first magnitude and an outer radius of 1.1 times the first magnitude.

16. The nanostructured article of claim 14, wherein the average height of the pillars is between 350 nm and 500 nm and the average center-to-center spacing between pillars is in a range of 200 to 300 nm.

17. An organic light emitting diode display comprising an emissive layer and the nanostructured article of claim 14 disposed proximate to and outside of an evanescent zone of the emissive layer.

* * * * *

UNITED STATES PATENT AND TRADEMARK OFFICE
CERTIFICATE OF CORRECTION

PATENT NO. : 10,756,306 B2
APPLICATION NO. : 16/340472
DATED : August 25, 2020
INVENTOR(S) : Nick Erickson It is certified that error appears in the above-identified patent and that said Letters Patent is hereby corrected as shown below:

In the Specification

Column 1
Line 39, Delete "m." and insert -- nm. --, therefor.

Column 10
Line 45, Delete "Company." and insert -- Company, --, therefor.

Column 16
Line 16 (Approx.), Delete " $\vec{K}$ ." and insert -- $\vec{k}$, --, therefor.

Column 17
Line 25, Delete "2π (n2+0.9)λ/a." and insert -- 2π (n2+0.9)/λa --, therefor.
Line 29, Delete "2.2π (n2+0.9)λa" and insert -- 2.2π (n2+0.9)/λa --, therefor.
Line 32, Delete "2π (n2+0.9)λ/a." and insert -- 2π (n2+0.9)/λa --, therefor.

Column 18
Line 41, Delete "wavelength," and insert -- wavelength λ --, therefor.
Line 43, Delete "wavelength," and insert -- wavelength λ --, therefor.

Column 19
Line 10, Delete "maximum." and insert -- maximum, --, therefor.

Column 20
Line 42, Delete "a" and insert -- σ --, therefor.

Column 21
Line 20, Delete "a" and insert -- σ --, therefor.

Signed and Sealed this
Twentieth Day of April, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,756,306 B2

Column 22
Line 22-23, Delete "D=(6 Va/$\lambda$)$^{1/3}$." and insert -- D=(6 Va/$\pi$)$^{1/3}$. --, therefor.

Column 23
Line 16, Delete "a" and insert -- $\alpha$ --, therefor.

Column 25
Line 6, Delete "q" and insert -- $\varphi$ --, therefor.
Line 8, Delete "q" and insert -- $\varphi$ --, therefor.
Line 11, Delete "(L= $\lambda$/(n2+sin($\varphi$p))." and insert -- (L= $\lambda$/(n2+sin($\varphi$))). --, therefor.
Line 27, Delete "kout" and insert -- kout. --, therefor.

Column 26
Line 11, Delete ""(n2+0.9)$\lambda$/a" and insert -- (n2+0.9)/$\lambda$a --, therefor.
Line 21, Delete "$\lambda$" and insert -- $\lambda$, --, therefor.
Line 22, Delete "c" and insert -- $\varphi$ --, therefor.

Column 27
Line 4, Delete "etlhylenetetrafluoroethylene," and insert -- ethylenetetrafluoroethylene, --, therefor.
Line 8, Delete "catboxylic acid." and insert -- carboxylic acid, --, therefor.
Line 47, Delete "(meth)acrylate" and insert -- (meth)acrylic --, therefor.
Line 54, Delete ""DINACOL"" and insert -- "DINACOL"; --, therefor.
Line 59, Delete "N.Y." and insert -- N.Y., --, therefor.

Column 29
Line 31 (Approx.), Delete "ZO$_2$," and insert -- ZrO$_2$, --, therefor.

Column 30
Line 40 (Approx.), Delete "A$_2$O$_3$" and insert -- "Al$_2$O$_3$", --, therefor.
Line 59, Delete "SILICA."" and insert -- SILICA," --, therefor.
Line 62, Delete "N.J," and insert -- N.J., --, therefor.

Column 31
Line 2, Delete ""MP 040"," and insert -- "MP1040", --, therefor.
Line 57, Delete "Specialties." and insert -- Specialties, --, therefor.

Column 33
Line 19 (Approx.), Delete "perfluommethane," and insert -- perfluoromethane, --, therefor.

Column 34
Line 63, Delete "110° C." and insert -- 110° C., --, therefor.
Line 67, Delete "CN-968." and insert -- CN-968, --, therefor.
Line 67, Delete "CN-983." and insert -- CN-983, --, therefor.

Column 35
Line 8, Delete "Sartomer." and insert -- Sartomer, --, therefor.

Line 19, Delete "Sartomer." and insert -- Sartomer, --, therefor.
Line 21-22, Delete "Sartomer." and insert -- Sartomer, --, therefor.
Line 23-24, Delete "Sartomer." and insert -- Sartomer, --, therefor.
Line 25, Delete "Sartomer." and insert -- Sartomer, --, therefor.
Line 33, Delete "Sartomer." and insert -- Sartomer, --, therefor.
Line 34-35, Delete "Sartomer." and insert -- Sartomer, --, therefor.

Column 36
Line 5, Delete "Langlois." and insert -- Langlois, --, therefor.
Line 7, Delete "(1992)," and insert -- (1992); --, therefor.
Line 8, Delete "Langlois." and insert -- Langlois, --, therefor.
Line 16, Delete "Shaw." and insert -- Shaw, --, therefor.
Line 24, Delete "Layers"." and insert -- Layers", --, therefor.

Column 39
Line 7, Delete "triacylate," and insert -- triacrylate, --, therefor.
Line 11, Delete ""SR-295."" and insert -- "SR-295," --, therefor.
Line 13, Delete ""SR502."" and insert -- "SR502," --, therefor.
Line 52, Delete "acid." and insert -- acid, --, therefor.
Line 54, After "hydroxyethyl" delete "1".

Column 40
Line 6, Delete ""CN-120"." and insert -- "CN-120", --, therefor.
Line 7, Delete "1608"." and insert -- 1608", --, therefor.
Line 9, Delete "Specialties." and insert -- Specialties, --, therefor.
Line 43, Delete "monomethylether" and insert -- monomethyl ether --, therefor.
Line 48-49, Delete "iododecyl" and insert -- isododecyl --, therefor.

Column 42
Line 43, Delete "90%/o" and insert -- 90% --, therefor.

Column 43
Line 40, Delete "(Osaka." and insert -- (Osaka, --, therefor.

Column 45
Line 32, Delete "150" and insert -- 15° --, therefor.

Column 48
Line 30, Delete "indices." and insert -- indices, --, therefor.

Column 53
Line 15, Delete "layer," and insert -- layer; --, therefor.

Column 54
Line 34, Delete "nm:" and insert -- nm; --, therefor.
Line 43, Delete "indices." and insert -- indices, --, therefor.

Column 55
Line 24, Delete "dying" and insert -- drying --, therefor.
Line 31, Delete "mixtures." and insert -- mixtures, --, therefor.
Line 48, Delete "liner." and insert -- liner, --, therefor.

Column 57
Line 8, Delete "substrate:" and insert -- substrate; --, therefor.

Column 59
Line 48, Delete "~48" and insert -- ~8 --, therefor.

Column 61
Line 17, Delete "Americas." and insert -- Americas, --, therefor.

Column 62
Line 2, Delete "45 wt u" and insert -- 45 wt % --, therefor.
Line 28, After "wt %" delete "u".